United States Patent
Morimoto et al.

(10) Patent No.: US 7,263,769 B2
(45) Date of Patent: Sep. 4, 2007

(54) MULTI-LAYERED FLEXIBLE PRINT CIRCUIT BOARD AND MANUFACTURING METHOD THEREOF

(75) Inventors: Shinji Morimoto, Onojo (JP); Kouji Nakashima, Onga-gun (JP); Toyokazu Yoshino, Fukuoka (JP); Katsuya Okamoto, Kasuga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/252,540

(22) Filed: Oct. 19, 2005

(65) Prior Publication Data

US 2006/0102386 A1    May 18, 2006

(30) Foreign Application Priority Data

| Oct. 20, 2004 | (JP) | P. 2004-305493 |
| Oct. 20, 2004 | (JP) | P. 2004-305494 |
| Oct. 28, 2004 | (JP) | P.2004-313593 |
| Nov. 26, 2004 | (JP) | P. 2004-342221 |

(51) Int. Cl.
*H01R 3/10* (2006.01)

(52) U.S. Cl. .............................. 29/852; 29/830; 29/842; 29/845; 228/180.1; 228/180.21; 228/180.22

(58) Field of Classification Search ................. 29/825, 29/830, 842, 845, 852; 228/180.1, 180.21, 228/180.22
See application file for complete search history.

(56) References Cited

U.S. PATENT DOCUMENTS

| 6,300,576 B1* | 10/2001 | Nakamura et al. ............ 174/261 |
| 6,768,064 B2* | 7/2004 | Higuchi et al. ............... 174/267 |
| 6,831,236 B2* | 12/2004 | Higuchi et al. ............... 174/264 |
| 6,914,200 B2* | 7/2005 | Higuchi et al. ............... 174/267 |
| 2001/0029666 A1* | 10/2001 | Nakamura et al. ............. 29/846 |
| 2002/0157248 A1* | 10/2002 | Karlsson et al. ............... 29/852 |
| 2003/0003779 A1* | 1/2003 | Rathburn ........................ 439/66 |
| 2004/0195002 A1* | 10/2004 | Higuchi et al. ............... 174/267 |
| 2005/0205291 A1* | 9/2005 | Yamashita et al. ............ 174/254 |

FOREIGN PATENT DOCUMENTS

| JP | 5-175636 | 7/1993 |
| JP | 7-176847 | 7/1995 |

OTHER PUBLICATIONS

English Language Abstract of JP 5-175636, published Jul. 13, 1993.
English Language Abstract of JP 7-176847, published Jul. 14, 1995.

* cited by examiner

*Primary Examiner*—Carl J. Arbes
(74) *Attorney, Agent, or Firm*—Greenblum & Bernstein, P.L.C.

(57) ABSTRACT

A multi-layered flexible print circuit board comprising an insulating layer, a circuit layer formed on the front and back surfaces of the insulating layer and a hole connecting between the circuit layers via the insulating layer, wherein there is provided an electrically-conductive member having a metal layer formed thereon at least on the surface thereof which is press-fitted into the hole to electrically conduct the circuit layer.

7 Claims, 30 Drawing Sheets

MULTI-LAYERED FLEXIBLE PRINT CIRCUIT BOARD AND MANUFACTURING METHOD THEREOF

BACKGROUND OF THE INVENTION

The present invention relates to a flexible print circuit board (hereinafter referred to as "FPC") having various surface mountable electronic parts mounted thereon and a method of producing the same and more particularly to a multi-layered FPC having high connection reliability and a method of producing the same.

With the recent trend for smaller size, lighter weight and higher performance of electronic apparatus, the circuit density of FPC to be incorporated therein tends to increase more and more. As a method of increasing the circuit density of FPC, there is used a method involving fine patterning of circuit layer. However, this method is limited in its capability and leaves something to be desired. Under these circumstances, a multi-layered FPC obtained by laminating circuit layers on each other with an adhesive layer interposed therebetween and providing the insulating layer between the circuit layers with an interlayer connection structure to make three-dimensional connection of the circuit layers has bee noted.

Heretofore, such a multi-layered FPC has been arranged such that circuit layers provided on the both sides of an insulating layer are three-dimensionally connected to each other with a copper deposit layer formed on the wall of a through-hole formed in an insulating layer made of polyimide film or the like (see, e.g., JP-A-5-175636). This interlayer connection method is called plated through-hole method and is most usually used. A through-hole method involves two major steps, i.e., step of electrolessly plating the wall of an insulating through-hole to electrically conduct the through-hole and step of electrolytically plating the through-hole to effect thick copper plating. The through-hole method is advantageous in that since the copper deposit layer in the through-hole and the insulating layer in which the through-hole is formed are substantially the same in thermal expansion coefficient, no exfoliation at the connection interface attributed to the difference in thermal expansion coefficient between the copper deposit layer in the through-hole and the insulating layer can occur, giving an excellent connection reliability against heat.

The flexible print circuit board obtained by the aforementioned plated through-hole method is disadvantageous in that thick copper plating causes the rise of the thickness of not only the copper deposit layer on the inner wall of the through-hole but also the copper foil constituting the electrically-conductive layer, making it difficult to finely pattern the conduct pattern of the electrically-conductive layer at the subsequent etching step. Further, the process for interlayer connection involves a number of complicated steps, leaving something to be desired in productivity.

As an interlayer connection method for solving these problems there has been proposed a method which comprises printing a solder paste in the through-hole after the formation of circuit layers, and then fusing and solidifying the solder paste (see, e.g., JP-A-7-176847). This interlayer connection method is advantageous in that as compared with the above proposed plate through-hole method, this method allows interlayer connection by a simple process, making it possible to obtain a high productivity. This interlayer connection method is also advantageous in that since interlayer connection is effected after the formation of circuit layers, the process has no effects on the thickness of the copper foil on the circuit layers, making it unlikely that the fine patterning of circuit layers can be inhibited.

In accordance with this interlayer connection method, however, when solder disposed in the through-hole is heated, it expands thermally beyond the insulating layer because the thermal expansion coefficient of solder is greater than that of the insulating layer. It is thus likely that the difference in thermal expansion coefficient can cause the circuit layer and the solder on the insulating layer to be peeled off each other at the connection interface. Thus, the interlayer connection method using solder leaves something to be desired in connection reliability against heat to disadvantage.

As mentioned above, the interlayer connection in multi-layered FPC by the related art plated through-hole method is excellent in connection reliability but is disadvantageous in fine patterning and producibility of circuit layer. On the other hand, the interlayer connection method using solder allows fine patterning of circuit layer and enhancement of producibility of circuit layer, which can be difficultly attained by the aforementioned through-hole method, but leaves something to be desired in connection reliability.

It has thus been desired in the art of interlayer connection in multi-layered FPC to provide a multi-layered FPC having a high producibility that attains both high connection reliability and fine patterning of circuit layer and its producing method.

SUMMARY OF THE INVENTION

In the light of the aforementioned problems, an aim of the invention is to provide a multi-layered FPC having an interlayer connection between circuit layers having a high connection reliability and an excellent productivity most suitable for fine patterning of circuit layer and a method of producing same.

In order to solve the aforementioned problems, the multi-layered FPC of the invention comprises an insulating layer, a circuit layer formed on the front and back surfaces of the insulating layer and a hole connecting between the circuit layers via the insulating layer, wherein there is provided an electrically-conductive member having a metal layer formed thereon at least on the surface thereof which is press-fitted into the hole to electrically conduct the circuit layer.

In this arrangement, since an electrically-conductive member made of a metal layer at least on the surface thereof is used as a conductor for (electrically) connecting between circuit layers, the deformation of the metal layer on the surface of the electrically-conductive member allows the electrically-conductive member to make firm and close connection to the circuit layer and the hole, making it possible to obtain a high reliability of connection between the circuit layers. Thus, in this arrangement, a multi-layered FPC having an excellent reliability of connection between circuit layers can be obtained.

Further, in order to solve the aforementioned problems, the method of producing a multi-layered FPC of the invention comprises a one-sided circuit board forming step of forming a first circuit layer on one side of a first insulating layer and insulating layer on the other side thereof to form a first one-sided circuit board and forming a second circuit layer on one side of a second insulating layer to form a second one-sided circuit board, a through-hole forming step of forming a through-hole for connecting between the first circuit layer and the second circuit layer in the first one-sided circuit board in the thickness direction, a metal portion forming step of press-fitting a substantially spherical conductor made of a metallic material at least on the surface thereof into the through-hole to make conduction to the first circuit layer so that a metal portion extending from the surface of the first insulating layer is formed and a conducting step of laminating the first one-sided circuit board and the second one-sided circuit board on each other and press-deforming the metal portion such that the metal portion and the second circuit layer are electrically-conducted to each other to electrically-conduct the first circuit layer and the second circuit layer to each other via the metal portion.

In accordance with this producing method, the deformation of the metal layer on the surface of the electrically-conductive member allows the electrically-conductive member to make firm and close connection to the circuit layer and the through-hole, making it possible to obtain a high connection reliability. Further, since interlayer connection is made after the formation of the circuit layer, the process has no effects on the circuit layer. Thus, this producing method is most suitable for fine patterning of circuit layer. Moreover, since interlayer connection is made by a very simple process involving press-fitting of a substantially spherical conductor and deformation of the metal layer on the surface of the substantially spherical conductor, this producing method of producing a multi-layered FPC can provide a high productivity as well.

BRIEF DESCRIPTION OF THE DRAWINGS

FIG. 58(*b*) is a side sectional view of an essential part illustrating a both-sided circuit board;

FIG. 58(*c*) is a side sectional view illustrating a conductor press-fit hole forming step;

FIG. 58(*d*) is a side sectional view of an essential part illustrating a conductor press-fitting step;

FIG. 58(*e*) is a side sectional view of an essential part illustrating how the conductor is press-fitted into the conductor press-fit hole;

FIG. 60(*b*) is a side sectional view of an essential part illustrating a both-sided circuit board forming step;

FIG. 60(*c*) is a side sectional view of an essential part illustrating a both-sided circuit board;

FIG. 62(*b*) is a side sectional view of an essential part illustrating a conductor press-fit hole forming step;

FIG. 62(*c*) is a side sectional view of an essential part illustrating a one-sided circuit board sticking step;

FIG. 62(*d*) is a side sectional view of an essential part illustrating a conductor press-fitting step;

FIG. 62(*e*) is a side sectional view of an essential part illustrating how the conductor is press-fitted into the conductor press-fit hole;

FIG. 63(*b*) is a side sectional view of an essential part illustrating a modification of the multi-layered flexible print circuit board.

DETAILED DESCRIPTION OF THE PREFERRED EMBODIMENTS

Figure 1:
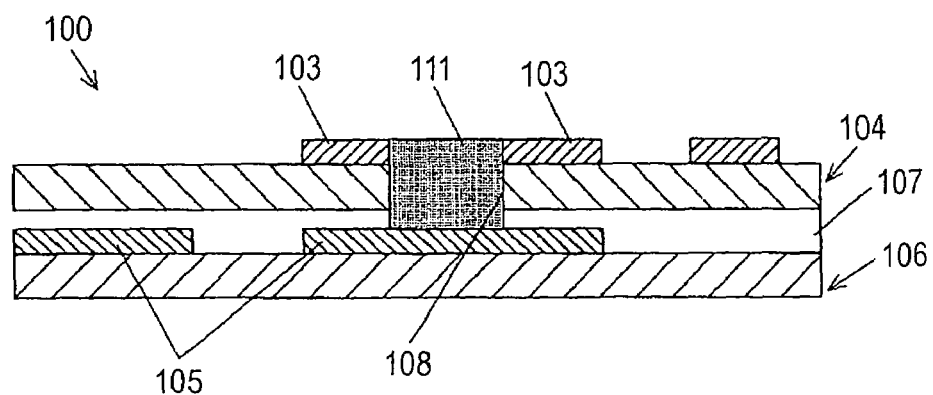
FIG. 1 is a sectional view of an essential part of a multi-layered FPC according to an embodiment of implementation of the invention.

Embodiments of implementation of the invention will be described in connection with the attached drawings. In the following views, where the members are the same, the same reference numerals are used. Therefore, duplicated description will not be made. The numeral values given in the following embodiments are examples of reference numerals that can be selected. The invention is not limited to these examples.

Embodiment 1

A multi-layered FPC according to en embodiment of implementation of the invention will be described hereinafter. Firstly, the multi-layered FPC of the invention will be described in connection with FIG. 1. FIG. 1 is a side sectional view of an essential part of a multi-layered FPC according to an embodiment of implementation of the invention.

Figure 2:
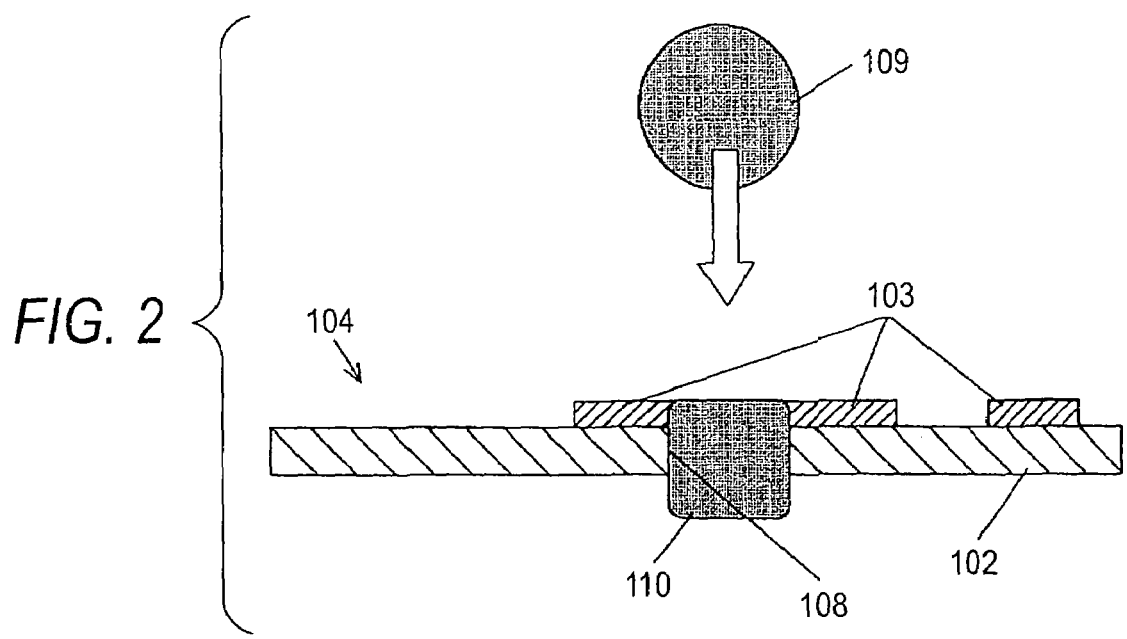
FIG. 2 is a sectional view of an essential part illustrating a part of process of producing a multi-layered FPC according to an embodiment of implementation of the invention.

In FIG. 1, the reference numeral 100 indicates a multi-layered FPC obtained by laminating a one-sided circuit board 104 having an upper circuit layer 103 provided on one side of an insulating layer 102 made of polyimide film and another one-sided circuit board 106 having a lower circuit layer 105 with an adhesive layer 107 interposed therebetween (The upper circuit layer 103 and the lower circuit layer 105 will be hereinafter occasionally referred generically to as "circuit layer"). The one-sided circuit board 104 has a through-hole 108 formed therein extending through the insulating layer 102 and the upper circuit layer 103. Though described in detail later, as shown in FIG. 2, one substantially spherical conductor 109 is press-fitted and deformed in the through-hole 108 to make connection to the upper circuit layer 103 and form an interlayer connection bump 110 extending from the one-sided circuit board 104. During the lamination of the one-sided circuit board 104 and the other one-sided circuit board 106 on each other, the protrusion of the interlayer connection bump 110 comes in contact with the lower circuit layer 105 so that it is press-deformed to form an interlayer conductor 111 connected to the lower circuit layer 105. Accordingly, the interlayer conductor 111 press-fitted in the interior of the through-hole 108 allows conduction of the upper circuit layer 103 to the lower circuit layer 105, i.e., electrical interlayer connection between the upper circuit layer 103 and the lower circuit layer 105.

Thus, in the interlayer conductor 111 causing interlayer connection in the multi-layered FPC 100, the interlayer connection bump 110 formed by press-fitting one substantially spherical conductor 109 into the interior of the through-hole 108 is connected to the upper circuit layer 103 and fills the interior of the through-hole 108 compactly. Further, the interlayer connection bump 110 which has been press-deformed is connected to the lower circuit layer 105 so that the upper circuit layer 103 and the lower circuit layer 105 are electrically connected to each other, making it possible to obtain a high connection reliability even with the connection of fine circuit layers.

In this arrangement, the greatest problem with interlayer connection with solder can be solved. In other words, a problem can be solved that when a conductor made of solder alone is heated, the solder in the through-hole expands beyond the insulating layer to cause the circuit layer and the solder on the surface of the insulating layer to be peeled off each other at the junction interface, making it impossible to assure the desired connection reliability against heat. Accordingly, the connection configuration of the multi-layered FPC 100 according to the present embodiment makes it possible to obtain a high reliability in electrical connection between the upper circuit layer 103 and the lower circuit layer 105.

As the material of the substantially spherical conductor 109, e.g., inter-layer conductor 111 there may be used a metal. Further, the material of the substantially spherical conductor 109 preferably contains at least one of soft metals. The constitution of the substantially spherical conductor 109 by a soft metal makes it possible to press-fit and deform the substantially spherical conductor 109 in the through-hole 108 under a low pressure. Moreover, the substantially spherical conductor 109 can be certainly connected to the circuit layer to form a highly-conductive metal post-shaped interlayer conductor 111 that fills the through-hole 108 compactly, making it possible to obtain a high connection reliability. The term "soft metal" as used herein is meant to indicate a metal that can be used for circuit purpose among metals having a good conductivity that are so ductile as to undergo plastic deformation.

Specific examples of the material of the substantially spherical conductor 109 include solder alloy, copper, copper alloy, nickel, nickel alloy, gold, silver, tin, and palladium. Preferred among these materials are solder alloy, copper, and copper alloy. When the substantially spherical conductor 109 contains a solder alloy or at least one of copper and copper alloy, the resulting substantially spherical conductor 109 is very soft and deformable, the process has no effects on the circuit layer. Further, the interlayer connection bump 110 thus deformed can be certainly connected to the circuit layer, making it possible to obtain a high reliability in connection to the circuit layer. In particular, when copper is used, the thermal expansion coefficient of the insulating layer 102 and the interlayer conductor 111 are the same, making it possible to obtain a high reliability against heat cycle strain. Further, the stress developed by the difference in thermal expansion coefficient can be relaxed by the interlayer conductor 111. Thus, the aforementioned substantially spherical conductor 109 is suitable for products requiring a high reliability. As the solder formulation of the solder alloy there may be used any of eutectic solder, high temperature solder and lead-free solder depending on the various conditions.

The opening shape of the through-hole 108 in which such a substantially spherical conductor 109 is press-fitted is not specifically limited but is preferably circle.

A method of producing the multi-layered FPC 100 according to the present embodiment that can realize a high reliability in electrical connection between the upper circuit layer 103 and the lower circuit layer 105 by using the aforementioned inter-layer conductor 111 will be described in detail in connection with FIGS. 3 to 11. In the following views, where the constituent elements are the same as those in FIG. 1, the same reference numerals as in FIG. 1 are used. Detailed description of these constituent elements will not be made.

Figure 3:
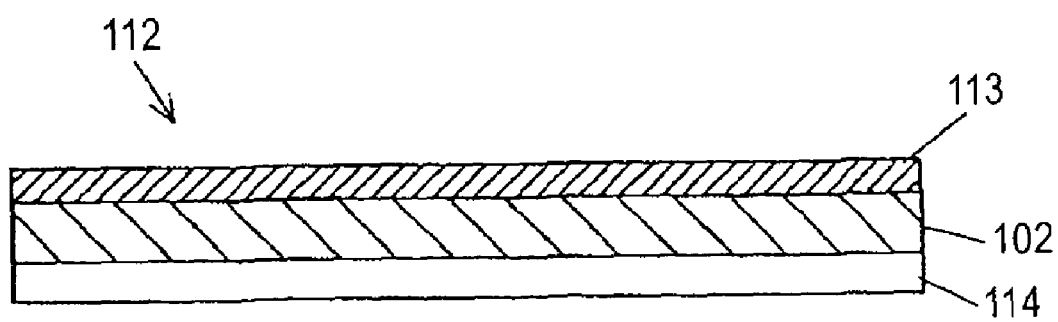
FIG. 3 is a sectional view of an essential part of a one-sided copper-clad laminated board with an insulating sheet which is an essential element of a multi-layered FPC according to an embodiment of implementation of the invention.
Figure 4:
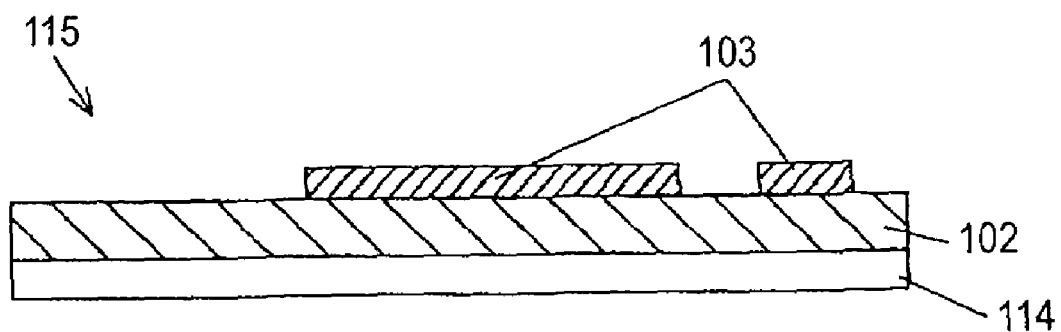
FIG. 4 is a sectional view of an essential part of a one-sided circuit board with an insulating sheet having a circuit layer according to an embodiment of implementation of the invention formed thereon.
Figure 5:
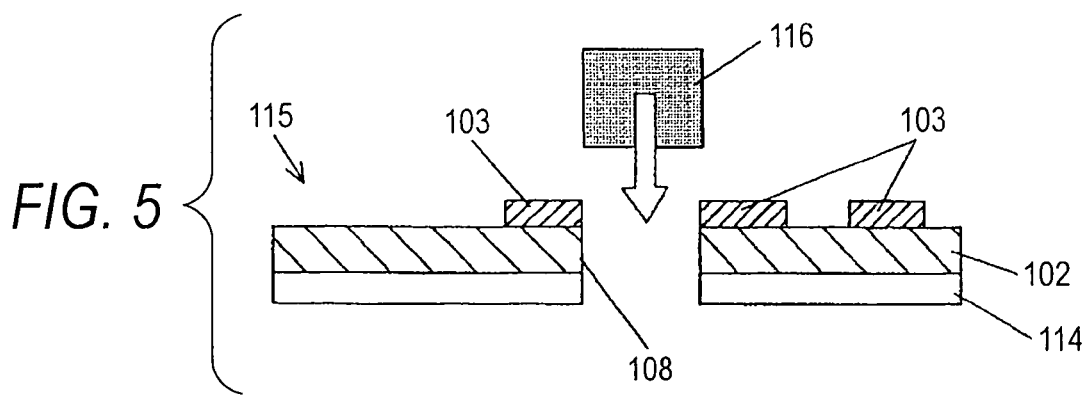
FIG. 5 is a sectional view of an essential part of a one-sided circuit board with an insulating sheet having a through-hole according to an embodiment of implementation of the invention formed therein.
Figure 6:
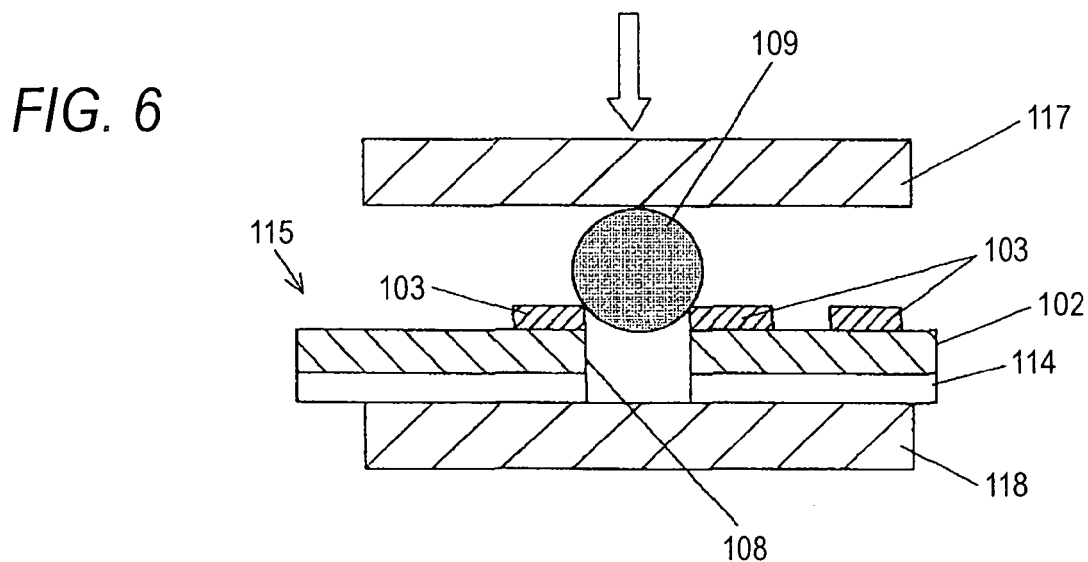
FIG. 6 is a sectional view of an essential part of a one-sided circuit board with an insulating sheet shown at the beginning of press-fitting of a substantially spherical conductor according to an embodiment of implementation of the invention.
Figure 7:
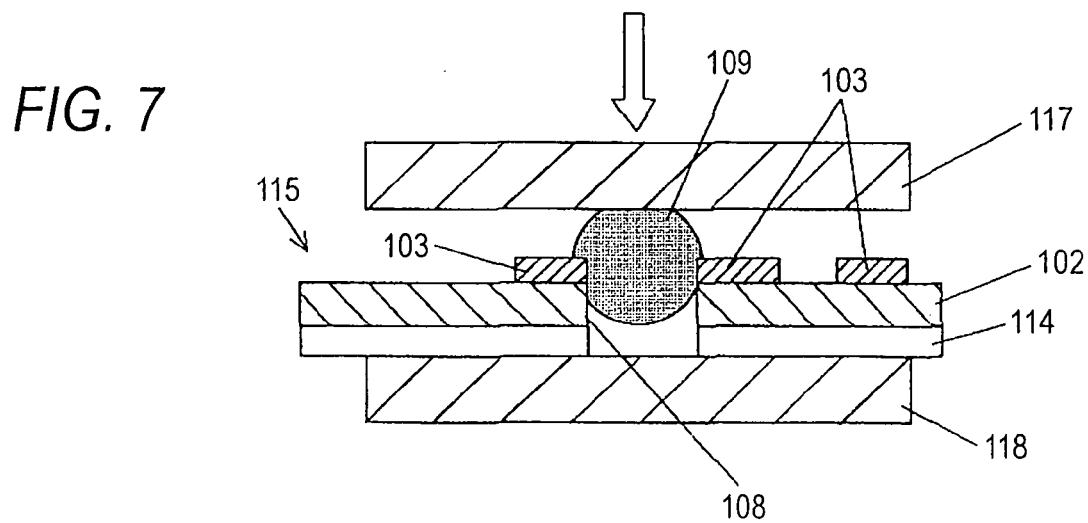
FIG. 7 is a sectional view of an essential part of a one-sided circuit board with an insulating sheet shown during the press-fitting and deformation of a substantially spherical conductor according to an embodiment of implementation of the invention.
Figure 8:
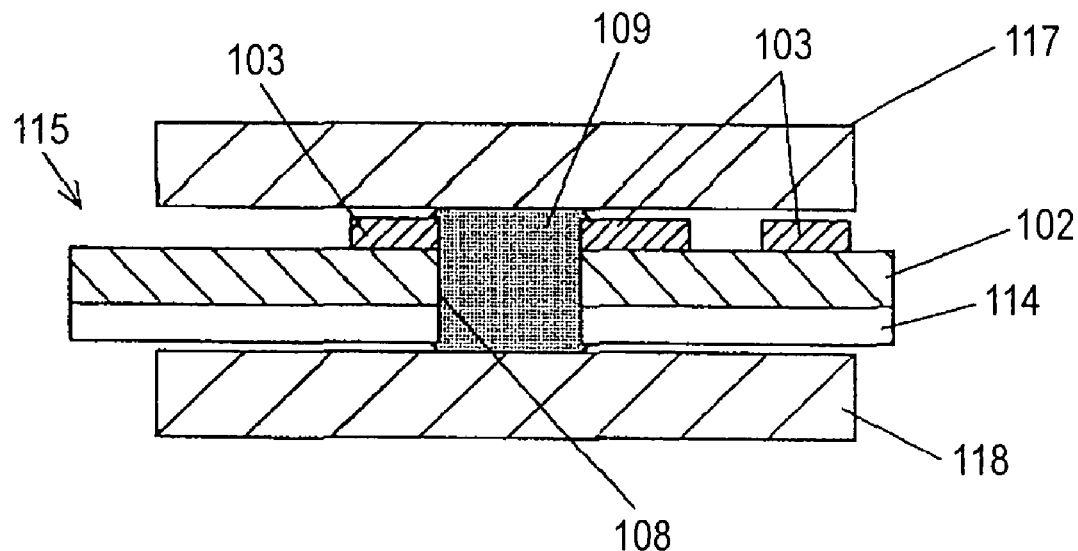
FIG. 8 is a sectional view of an essential part of a one-sided circuit board with an insulating sheet shown at the end of the press-fitting and deformation of a substantially spherical conductor according to an embodiment of implementation of the invention.
Figure 9:
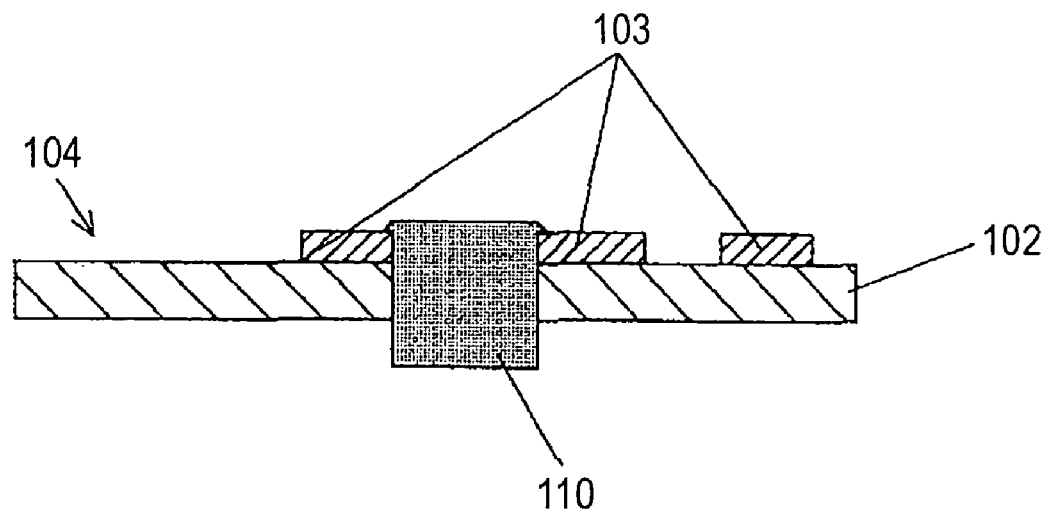
FIG. 9 is a sectional view of an essential part of a one-sided circuit board having an interlayer connection bump according to an embodiment of implementation of the invention formed thereon.
Figure 10:
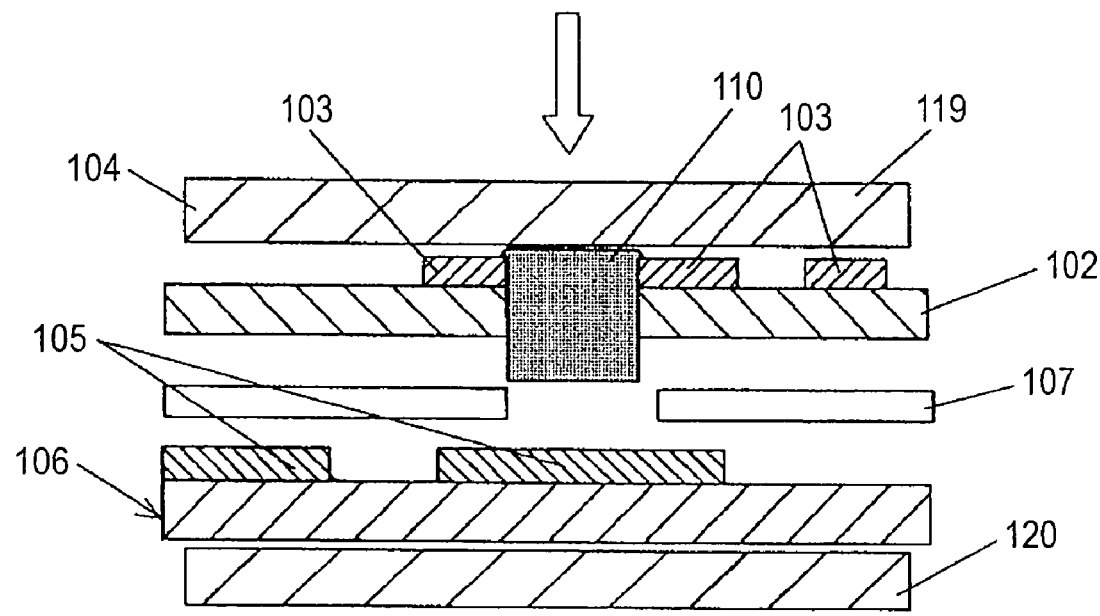
FIG. 10 is a sectional view of an essential part of a one-sided circuit board having an interlayer connection bump formed thereon which is being laminated on another one-sided circuit board with an adhesive layer according to an embodiment of implementation of the invention interposed therebetween.
Figure 11:
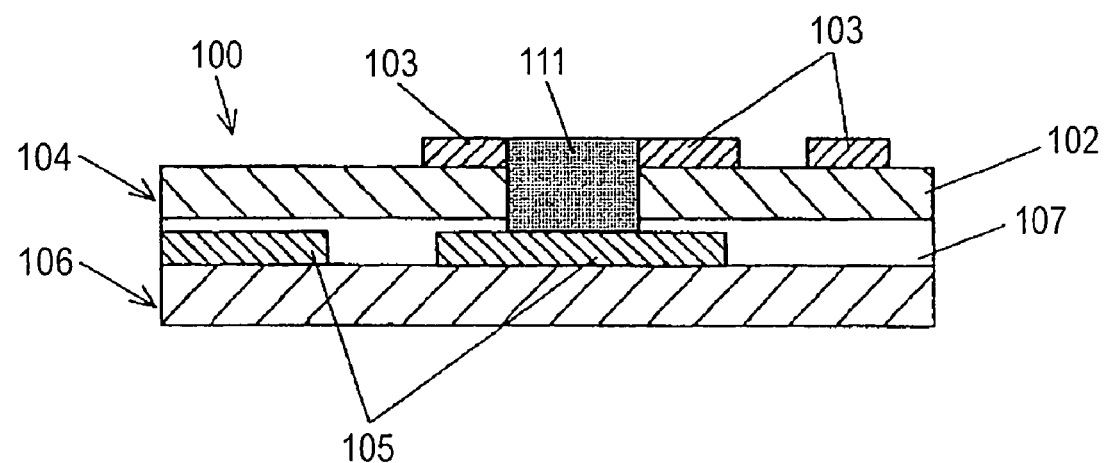
FIG. 11 is a sectional view of an essential part of a multi-layered FPC shown after interlayer connection according to an embodiment of implementation of the invention.

FIGS. 3 to 9 each are a diagram illustrating the procedure of producing the multi-layered FPC 100 according to Embodiment 1. FIG. 3 is a side sectional view of an essential part of a one-sided copper-clad laminated board with an adhesive sheet which is a constituent element of the multi-layered FPC according to an embodiment of implementation of the invention. FIG. 4 is a sectional view of an essential part of a one-sided circuit board with an insulating sheet having a circuit layer according to an embodiment of implementation of the invention formed thereon. FIG. 5 is a sectional view of an essential part of a one-sided circuit board with an insulating sheet having a through-hole according to an embodiment of implementation of the invention formed therein. FIG. 6 is a sectional view of an essential part of a one-sided circuit board with an insulating sheet shown at the beginning of press-fitting of a substantially spherical conductor according to an embodiment of implementation of the invention. FIG. 7 is a sectional view of an essential part of a one-sided circuit board with an insulating sheet shown during the press-fitting and deformation of a substantially spherical conductor according to an embodiment of implementation of the invention. FIG. 8 is a sectional view of an essential part of a one-sided circuit board with an insulating sheet shown at the end of the press-fitting and deformation of a substantially spherical conductor according to an embodiment of implementation of the invention. FIG. 9 is a sectional view of an essential part of a one-sided circuit board having an interlayer connection bump according to an embodiment of implementation of the invention formed thereon. FIG. 10 is a sectional view of an essential part of a one-sided circuit board having an interlayer connection bump formed thereon which is being laminated on another one-sided circuit board with an adhesive layer according to an embodiment of implementation of the invention interposed therebetween. FIG. 11 is a sectional view of an essential part of a multi-layered FPC shown after interlayer connection according to an embodiment of implementation of the invention.

In the aforementioned views, the reference numeral 112 indicates a one-sided copper-clad laminated board with an insulating sheet having a copper foil 113 formed on one side of an insulating layer 2 and an insulating sheet 114 formed on the other side thereof The reference numeral 115 indicates a one-sided circuit board with an insulating sheet having an upper circuit layer 103 formed thereon which is obtained by etching the one-sided copper-clad laminated board 112 with an insulating sheet. The reference numeral 116 indicates a punching die for forming through-hole. The reference numeral 117 indicates an upper pressure plate. The reference numeral 118 indicates a lower pressure plate. The reference numeral 119 indicates an upper heating pressure plate. The reference numeral 120 indicates a lower heating pressure plate.

The method of producing the multi-layered FPC 100 will be described in connection with the attached drawings. Firstly, as shown in FIG. 3, a one-sided copper-clad laminated board 112 with an insulating sheet having a copper foil 113 formed on one side of an insulating layer 2 and an insulating sheet 114 formed on the other side thereof is prepared. While the present embodiment is described with reference to the two-layer type one-sided copper-clad laminated board 112 free of adhesive layer between the insulating layer 102 and the copper foil 113 by way of example, the invention is not limited thereto. A three-layer type one-sided copper-clad laminated board with an insulating sheet having an adhesive layer interposed between the insulating layer 102 and the copper foil 113 or a one-sided copper-clad laminated board with an insulating sheet having more layers may be used. The layer configuration may be properly changed.

Subsequently, a mask material is formed on the surface of the copper foil 113 according to a circuit pattern. The copper foil 113 is then etched with a copper etching solution such as ferric chloride and copper chloride to obtain a one-sided circuit board 115 with an insulating sheet having an upper circuit layer 3 formed on the other side of the insulating layer 2 as shown in FIG. 4. The upper circuit layer 103 thus obtained cannot be affected at the subsequent steps. Accordingly, in accordance with the method of producing a multi-layered FPC according to the present embodiment, the reduction of the thickness of the copper foil 113 makes it possible to exert an effect of finely patterning the circuit layer.

Further, in the present embodiment, the one-sided circuit board 104 and the other one-sided circuit board 106 are connected to each other as described later. In this manner, one-sided etching suitable for fine patterning can be effected, making it possible to realize the upper circuit layer 103 more finely. Accordingly, the upper circuit layer 103 of the one-sided circuit board 115 with an insulating sheet obtained in the present embodiment can be patterned more finely than the circuit layer of an ordinary both-sided circuit board having a circuit layer formed directly on the both sides of an insulating layer.

The reason for this mechanism will be described hereinafter. Since the formation of a circuit layer on both-sided circuit board normally requires that the copper foil on the both sides of a both-sided copper-clad laminated board be etched at the same time, it is necessary that the etching solution be uniformly applied to the both-sided copper-clad laminated board on both the upper and lower sides thereof. However, when the etching solution is pressure-sprayed onto the both-sided copper-clad laminated board on both the upper and lower sides thereof, the etching solution sprayed onto the upper side of the both-sided copper-clad laminated board then forms a liquid stagnant that makes it impossible to keep the desired etching uniformity. Thus, the conditions under which the both-sided circuit board is etched are uneven and unstable, it is difficult to form a very fine circuit layer.

On the other hand, the formation of a circuit layer on the one-sided circuit board requires that the etching solution be sprayed onto the one-sided copper-clad laminated board (copper foil is formed on the lower side of the one-sided circuit board) only on the lower side thereof. Thus, the etching solution forms no liquid stagnant. Accordingly, the etching conditions can be predetermined to fall within an optimum range. Therefore, the method of forming a circuit layer on the one-sided circuit board according to the present embodiment is suitable for the fine circuit layer.

Subsequently, the one-sided circuit board 115 with an insulating sheet having a circuit layer formed thereon is punched using a punching die 116 to form a through-hole 108 as shown in FIG. 5. Subsequently, as shown in FIG. 6, one substantially spherical conductor 109 having a larger diameter than the diameter of the through-hole 8 is disposed at the position of the through-hole 108. Using an upper pressure plate 117 and a lower pressure plate 118, the substantially spherical conductor 109 is then press-fitted into the through-hole 108. In this manner, the substantially spherical conductor 109 begins to be press-fitted and deformed. The substantially spherical conductor 109 is basically in the form of substantial sphere. When the conductor 109 is in the form of sphere, it can be easily handled. Further, a metal ball (substantially spherical conductor 109) or a resin-cored metal ball described later can be easily produced to advantage. The volume of the substantially spherical conductor 109 is predetermined to be greater than the volume of the opening of the through-hole 108.

The disposition of the substantially spherical conductor 109 can be accomplished by a known method involving the mounting of solder ball on a semiconductor package called BGA (Ball Grid Array). In some detail, at the position corresponding to the through-hole 108 is prepared a suction plate having a suction hole having a smaller diameter than the diameter of the substantially spherical conductor 109 formed therein which is connected to a vacuum pump for adjusting the pressure in the suction hole. Subsequently, using the suction plate, the substantially spherical conductor 109 is sucked into the suction hole, positioned at the top of the through-hole 108, dropped and then positioned at the position of the through-hole 109. An equipment called ball mounter for performing the aforementioned operation may be used. While the present embodiment has been described with reference to the case where the substantially spherical conductor 109 is mounted by vacuum suction, electrostatic suction may be used.

Subsequently, as shown in FIG. 7, using the upper pressure plate 117 and the lower pressure plate 118, the substantially spherical conductor 109 is pressed so that it is sequentially press-fitted into the through-hole 108. Since the substantially spherical conductor 109 is made of a material containing a soft metal such as solder alloy, copper and copper alloy, the substantially spherical conductor 109 is sequentially deformed while being press-fitted in the course of press-fitting. Subsequently, the substantially spherical conductor 109 is deformed along the inner wall of the through-hole 108 while being connected to a part of the upper circuit layer 103 so that the interior of the through-hole 108 is sequentially filled compactly with the substantially spherical conductor 109.

Subsequently, as shown in FIG. 8, the substantially spherical conductor 109 comes in contact with the lower pressure plate 118 to undergo deformation. Thus, the press-fitting and deformation of the substantially spherical conductor 109 in the through-hole 108 is finished. Subsequently, the upper pressure plate 117 and the lower pressure plate 118 are detached and the insulating sheet 114 is removed. As a result, a one-sided circuit board 104 having an interlayer connection bump 110 extending from the other side of the insulating layer 102 (side opposite the upper circuit layer 103) as shown in FIG. 9 is obtained.

Subsequently, as shown in FIG. 10, the other one-sided circuit board 106 having a lower circuit layer 105 formed on one side thereof and the one-sided circuit board 104 having an interlayer connection bump 110 formed thereon are laminated on each other with an adhesive layer 107 interposed therebetween. The lower circuit layer 105 provided on the other one-sided circuit board 106 cannot be affected at the subsequent steps. Accordingly, in accordance with the method of producing a multi-layered FPC according to the present embodiment, the reduction of the thickness of the copper foil 113 makes it possible to exert an effect of finely patterning of the circuit layer.

The other one-sided circuit board 106 having a lower circuit layer 105 formed thereon, too, can be sprayed with the etching solution on the lower side of the one-sided copper-clad laminated board (copper foil is formed on the lower side of the one-sided circuit board) to form a lower circuit layer 105 similarly to the one-sided circuit board 104 having an upper circuit layer 103 formed thereon. In other words, the lower circuit layer 105 is finely patterned similarly to the upper circuit layer 103.

Subsequently, when the laminate is heated under pressure using the upper heating pressure plate 119 and the lower heating pressure plate 120, the interlayer connection bump 110 is connected to the lower circuit layer 105 to form an interlayer conductor 111 which is electrically connected to the lower circuit layer 105. In this manner, a multi-layered FPC 100 having the upper circuit layer 103 and the lower circuit layer 105 connected to each other with the interlayer conductor 111 interposed therebetween, i.e., having a fine circuit layer comprising the upper circuit layer 103 and the lower circuit layer 105 electrically conducted to each other as shown in FIG. 11 can be obtained by a very simple process.

While the present embodiment has been described with reference to the case where the ball diameter of the substantially spherical conductor 109 is greater than the diameter of the through-hole 108, the ball diameter of the substantially spherical conductor 109 may be the same as the diameter of the through-hole 108. In this case, too, the circuit layers can be connected to each other by the deformation of the substantially spherical conductor 109. However, taking into account the margin of deformation of the substantially spherical conductor 109 and the certainty of interlayer connection, the diameter of the substantially spherical conductor 109 is preferably greater than the diameter of the through-hole 108.

The aforementioned method of producing a multi-layered FPC according to the present embodiment has the following characteristics. Firstly, since as the substantially spherical conductor 109 for forming the interlayer conductor 111 that makes interlayer connection there is used a soft metal, the substantially spherical conductor 109 can be easily press-fitted and deformed in the through-hole 108 under a low pressure, making it assured that the substantially spherical conductor 109 can be connected to the circuit layer. In this manner, a highly-conductive metal post-shaped interlayer conductor 111 that fills the through-hole 108 compactly, making it possible to obtain a high reliability in electrical connection between the upper circuit layer 103 and the lower circuit layer 105. In particular, when the substantially spherical conductor 109 is made of copper, the stress developed by the difference in thermal expansion coefficient can be relaxed by the interlayer conductor 111, making it possible to obtain a high connection reliability.

Further, since the formation of the circuit layer is followed by the connection between the upper circuit layer 103 and the lower circuit layer 105, the process has no effects on the circuit layer. Accordingly, the reduction of the thickness of the copper foil 113 makes it possible to exert an effect of finely patterning the circuit layer. Thus, this process is suitable for the fine patterning of circuit layer. Further, since the interlayer connection between the upper circuit layer 103 and the lower circuit layer 105 can be made by a very simple process involving the press-fitting of the substantially spherical conductor 109 and the lamination and contact bonding of the one-sided circuit board 104 having an interlayer connection bump 110 and the other one-sided circuit board 106, the number of required steps is less than other interlayer connection methods, providing excellent productivity and production cost.

Accordingly, in accordance with the method of producing a multi-layered FPC according to the present embodiment, a multi-layered FPC having a high reliability of connection between circuit layers which is most suitable for fine patterning of circuit layer can be prepared at a good productivity.

Figure 12:
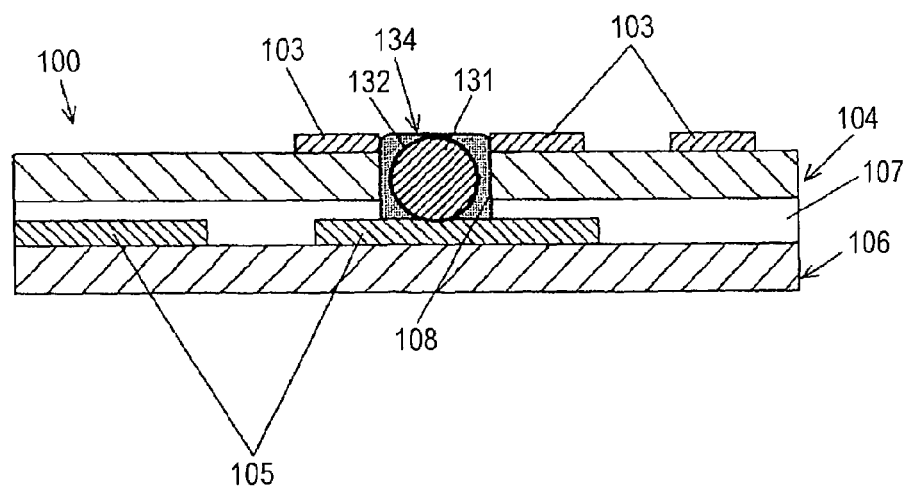
FIG. 12 is a sectional view of an essential part of a multi-layered FPC according to an embodiment of implementation of the invention.
Figure 13:
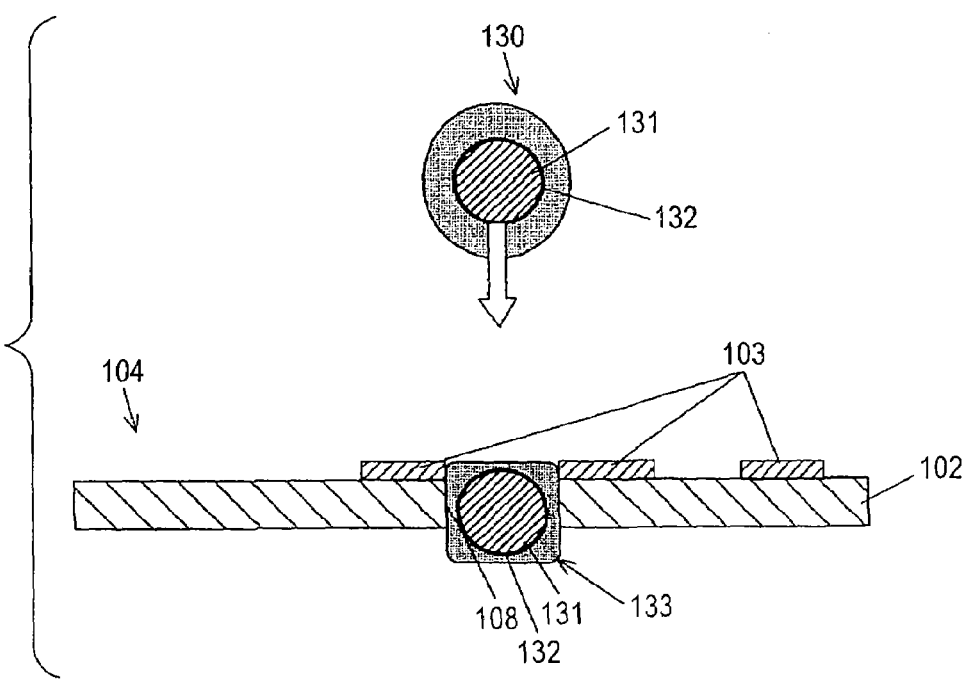
FIG. 13 is a sectional view of an essential part illustrating a part of a process of producing a multi-layered FPC according to an embodiment of implementation of the invention.

While the aforementioned description has been made with reference to the case where the substantially spherical conductor 109 is made of metal material alone, the substantially spherical conductor 109 may be a resin-cored metal ball having a resin ball having a smaller diameter than the through-hole 108 as a core and a surface metal coat layer. The case where the resin-cored metal ball is used will be described hereinafter in connection with FIGS. 12 and 13. In FIG. 12, the reference numeral 100 indicates a multi-layered FPC obtained by laminating a one-sided circuit board 104 having an upper circuit layer 103 provided on one side of an insulating layer 102 made of polyimide film and another one-sided circuit board 106 having a lower circuit layer 105 on each other with an adhesive layer 107 interposed therebetween. The one-sided circuit board 104 has a through-hole 108 formed therein extending through the insulating layer 102 and the upper circuit layer 103. The one-sided circuit board 104 is obtained, as shown in FIG. 13, by press-fitting and deforming one resin-cored metal ball 130 having a resin ball 131 having a smaller diameter than the diameter of the through-hole 108 as a core and a surface metal coat layer 132 into the through-hole 108 so that the substantially spherical conductor 109 is connected to the upper circuit layer 103 to form an interlayer connection bump 133 extending from the one-sided circuit board 104. Subsequently, during the lamination of the one-sided circuit board 104 and the other one-sided circuit board 106 on each other, the protrusion of the interlayer connection bump 133 comes in contact with the lower circuit layer 105 to undergo deformation under pressure. Thus, an interlayer conductor 134 connected to the lower circuit layer 105 is formed. Accordingly, the interlayer conductor 134 press-fitted into the interior of the through-hole 108 allows conduction of the upper circuit layer 103 to the lower circuit layer 105, i.e., electrical interlayer connection between the upper circuit layer 103 and the lower circuit layer 105.

Since the resin-cored metal ball 130 has a resin ball 131 in the core portion thereof, the Young's modulus of the interlayer conductor 134 can be lowered. Thus, the stress developed by the difference in thermal expansion coefficient can be relaxed by the resin ball 131. The resin ball 131, which is a sphere, can be easily handled. The use of the resin ball 131 is also advantageous in that the producibility of the ball member is excellent. Further, the deformation of the metal layer 132 on the surface of the resin-cored metal ball makes it possible to form the interlayer connection bump 133 having the resin-cored metal ball 130 packed closely and compactly in the through-hole 108. In this arrangement, the interlayer conductor 134 having the resin ball 131 provided therein makes it assured that the upper circuit layer 103 and the lower circuit layer 105 can be connected to each other. Thus, the upper circuit layer 103 and the lower circuit layer 105 can be certainly electrically connected or conducted to each other via the interlayer conductor 134. The aforementioned multi-layered FPC comprising the resin-cored metal ball 131 can be prepared in the same manner as the aforementioned method of producing a multi-layered FPC except that the resin-cored metal ball 130 is press-fitted into the through-hole 108 as a substantially spherical conductor to form the interlayer connection bump 133 and the interlayer connection bump 133 is used to form the interlayer conductor 134.

Embodiment 2

Figure 14:
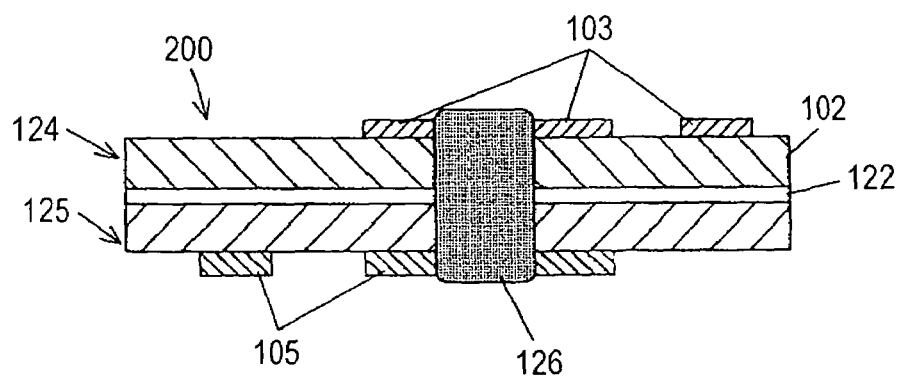
FIG. 14 is a sectional view of an essential part of a multi-layered FPC according to an embodiment of implementation of the invention.
Figure 15:
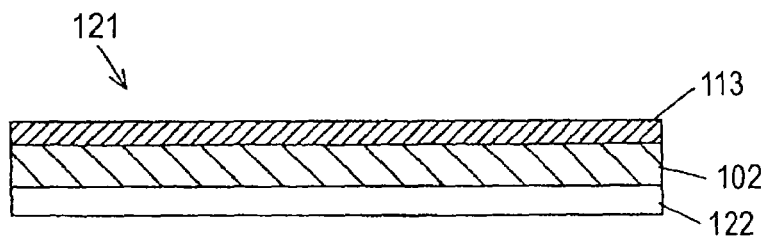
FIG. 15 is a sectional view of an essential part of a one-sided circuit board with an adhesive sheet which is a constituent element of a multi-layered FPC according to an embodiment of implementation of the invention.
Figure 16:
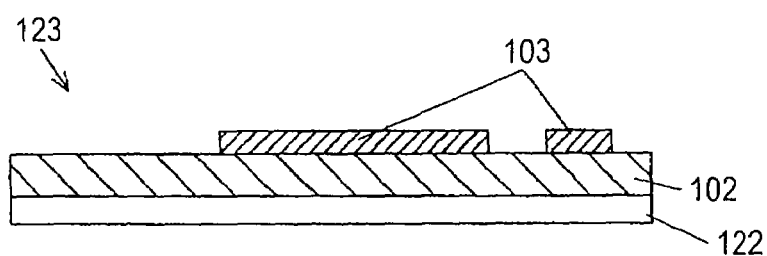
FIG. 16 is a sectional view of an essential part of a one-sided circuit board with an adhesive sheet having a circuit layer according to en embodiment of implementation of the invention formed thereon.
Figure 17:
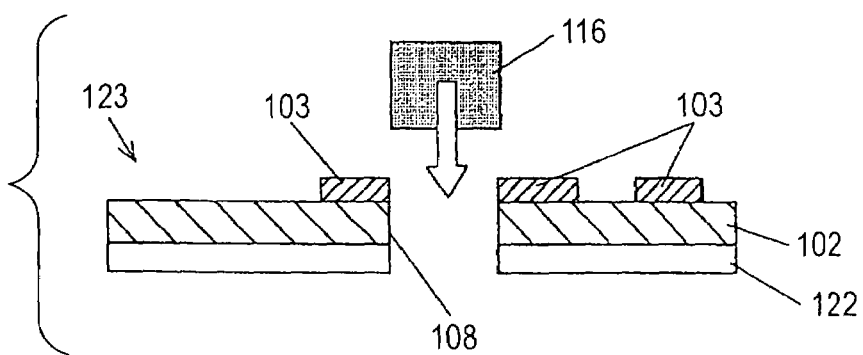
FIG. 17 is a sectional view of an essential part of a one-sided circuit board with an adhesive sheet having a through-hole according to an embodiment of implementation of the invention formed therein.
Figure 18:
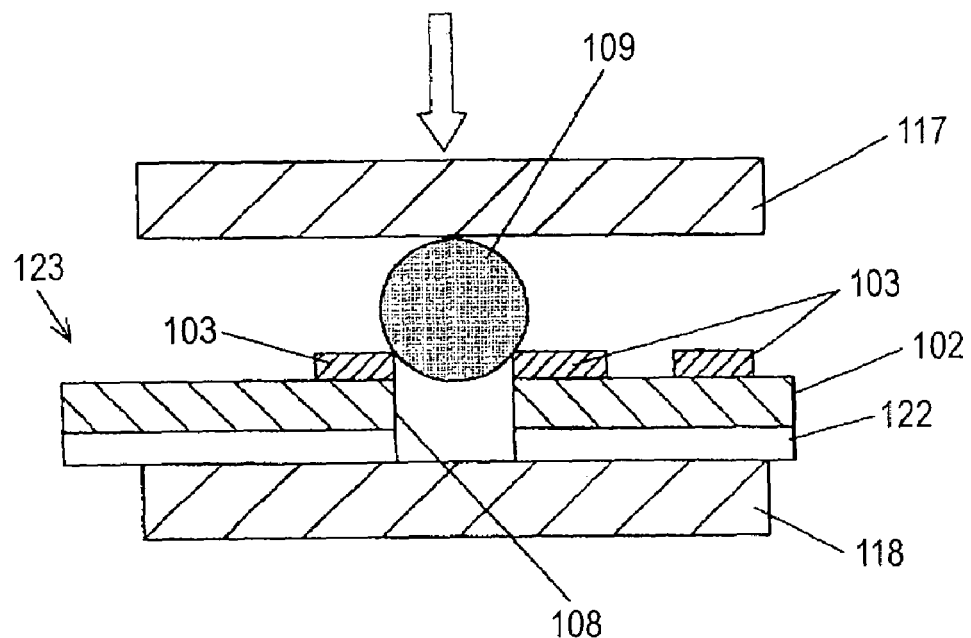
FIG. 18 is a sectional view of an essential part of a one-sided circuit board with an adhesive sheet shown at the beginning of press-fitting of a substantially spherical conductor according to en embodiment of implementation of the invention.
Figure 19:
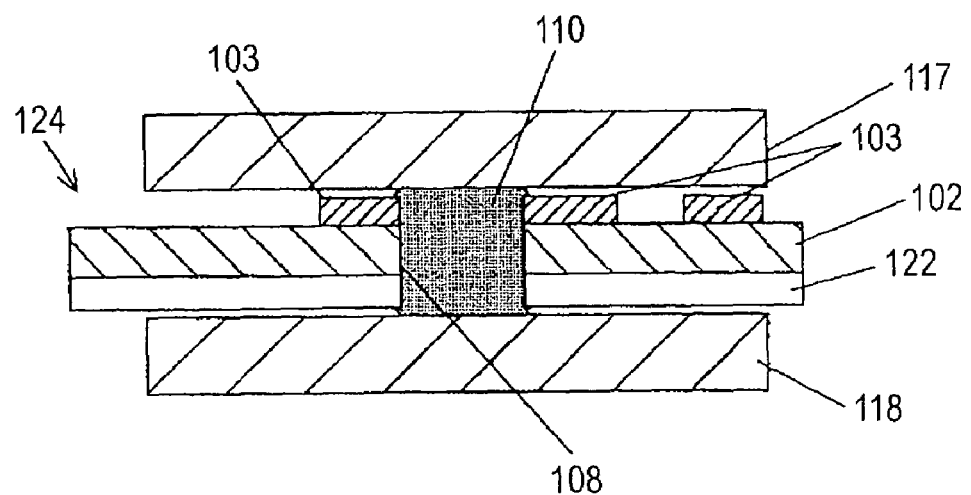
FIG. 19 is a sectional view of an essential part of a one-sided circuit board with an adhesive sheet shown at the end of press-fitting and deformation of a substantially spherical conductor according to an embodiment of implementation of the invention.
Figure 20:
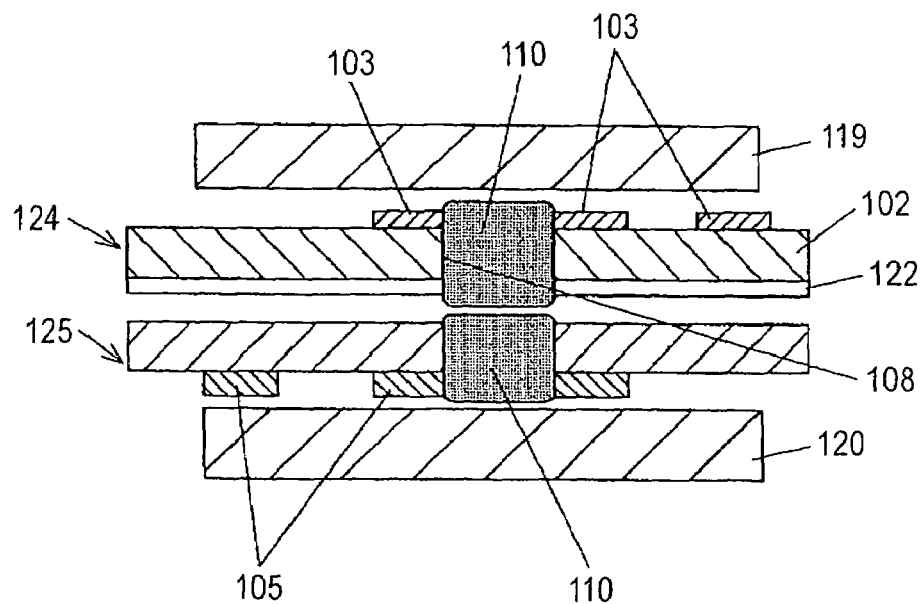
FIG. 20 is a sectional view of an essential part of a one-sided circuit board having an interlayer connection bump formed thereon which is being laminated on another one-sided circuit board with an adhesive layer according to an embodiment of implementation of the invention interposed therebetween.

Embodiment 2 will be described in detail with reference to a method of producing a multi-layered FPC according to another embodiment of implementation of the invention excellent in reliability of connection between circuit layers and fine patterning of circuit layer at a good productivity in connection with FIGS. 14 to 20. FIG. 14 is a sectional view of an essential part of a multi-layered FPC according to an embodiment of implementation of the invention. FIG. 15 is a sectional view of an essential part of a one-sided circuit board with an adhesive sheet which is a constituent element of a multi-layered FPC according to an embodiment of implementation of the invention. FIG. 16 is a sectional view of an essential part of a one-sided circuit board with an adhesive sheet having a circuit layer according to en embodiment of implementation of the invention formed thereon. FIG. 17 is a sectional view of an essential part of a one-sided circuit board with an adhesive sheet having a through-hole according to an embodiment of implementation of the invention formed therein. FIG. 18 is a sectional view of an essential part of a one-sided circuit board with an adhesive sheet shown at the beginning of press-fitting of a substantially spherical conductor according to en embodiment of implementation of the invention. FIG. 19 is a sectional view of an essential part of a one-sided circuit board with an adhesive sheet shown at the end of press-fitting and deformation of a substantially spherical conductor according to an embodiment of implementation of the invention. FIG. 20 is a sectional view of an essential part of a one-sided circuit board having an interlayer connection bump formed thereon which is being laminated on another one-sided circuit board with an adhesive layer according to an embodiment of implementation of the invention interposed therebetween.

In the aforementioned views, the reference numeral 200 indicates a multi-layered FPC having a circuit layer provided on the both sides of a laminate of a one-sided circuit board 124 with an adhesive sheet having an interlayer connection bump 110 formed thereon and another one-sided circuit board 125 having an interlayer connection bump formed thereon. The reference numeral 121 indicates a one-sided copper-clad laminated board with an adhesive sheet having a copper foil 113 formed on one side of an insulating layer 102 and a adhesive sheet 122 formed on the other side thereof The reference numeral 123 indicates a one-sided circuit board with an adhesive sheet obtained by etching the one-sided copper-clad laminated board 121 with an adhesive sheet to form an upper circuit layer 103. The reference numeral 124 indicates a one-sided circuit board with an adhesive sheet having an interlayer connection bump 110 formed thereon. The reference numeral 125 indicates another one-sided circuit board having an interlayer connection bump laminated on the one-sided circuit board 124 with an adhesive sheet having the interlayer connection bump 110 formed thereon. The reference numeral 126 indicates an interlayer conductor formed by the connection of two interlayer connection bumps 110. The reference numeral 116 indicates a punching die for forming a through-hole. The reference numeral 117 indicates an upper pressure plate. The reference numeral 118 indicates a lower pressure plate. The reference numeral 119 indicates an upper heating pressure plate. The reference numeral 120 indicates a lower heating pressure plate.

In the multi-layered FPC 200 according to the present embodiment, the interlayer conductor 126 press-fitted in the interior of the through-hole 108 allows electrical interlayer connection between the upper circuit layer 103 and the lower circuit layer 105 as shown in FIG. 14. The interlayer conductor 126 is formed by the connection of interlayer connection bumps 110 obtained by pressing one substantially spherical conductor 109 in the direction along the thickness of the insulating layer 12 as described later so that it is deformed.

As mentioned above, the interlayer conductor 126 causing the interlayer connection in the multi-layered FPC 200 is arranged such that the interlayer connection bump 110 formed by press-fitting the substantially spherical conductor 109 into the interior of the through-hole 108 is connected to the upper circuit layer 103 and the lower circuit layer 105 and fills the interior of the through-hole 108 compactly as in Embodiment 1. In this arrangement, the upper circuit layer 103 and the lower circuit layer 105 are electrically connected to each other via the interlayer conductor 126, making it possible to obtain a high connection reliability even with the connection of fine circuit layers.

Thus, the greatest problem with the case where solid is used to make interlayer connection can be solved even with the multi-layered FPC 200 according to Embodiment 2. In other words, a problem can be solved that when a conductor made of solder alone is heated, the solder in the through-hole expands beyond the insulating layer to cause the circuit layer and the solder on the surface of the insulating layer to be peeled off each other at the junction interface, making it impossible to assure the desired connection reliability against heat. Accordingly, the connection configuration of the multi-layered FPC 200 according to the present embodiment makes it possible to obtain a high reliability in electrical connection between the upper circuit layer 103 and the lower circuit layer 105.

The use of a soft metal, particularly at least one of solder alloy, copper and copper alloy, as the material of the interlayer conductor 126 as in Embodiment 1 makes it possible to obtain a higher reliability in interlayer connection between the upper circuit layer 103 and the lower circuit layer 105. This is because copper and copper alloy match most fairly with the substrate (insulating layer) in thermal expansion coefficient.

A method of the multi-layered FPC 200 according to Embodiment 2 that can realize such a high connection reliability will be described in detail in connection with the attached drawings.

Firstly, a one-sided copper-clad laminated board 121 with an adhesive sheet having a copper foil 113 formed directly on one side of an insulating layer 102 and an adhesive sheet 122 formed on the other side thereof as shown in FIG. 15 is prepared. While the present embodiment has been described with reference to the one-sided copper-clad laminated board 121 free of adhesive layer between the insulating layer 102 and the copper foil 113 by way of example, the invention is not limited thereto. A one-sided copper-clad laminated board with an insulating sheet having an adhesive layer interposed between the insulating layer 102 and the copper foil 113 or a one-sided copper-clad laminated board with an insulating sheet having more layers may be used. The layer configuration may be properly changed.

Subsequently, a mask material is formed on the surface of the copper foil 113 according to a circuit pattern. The copper foil 113 is then etched with a copper etching solution such as ferric chloride and copper chloride to obtain a one-sided circuit board 123 with an insulating sheet having an upper circuit layer 103 formed on the other side of the insulating layer 2 as shown in FIG. 16. In the present embodiment, two sheets of one-sided circuit boards 123 with an adhesive sheet are connected to each other as described above to form a both-sided circuit board. In this manner, one-sided etching suitable for fine patterning can be effected, making it possible to pattern the upper circuit layer 103 more finely. Accordingly, the upper circuit layer 103 of the one-sided circuit board 123 with an insulating sheet obtained in the present embodiment can be patterned more finely than the circuit layer of an ordinary both-sided circuit board having a circuit layer formed directly on the both sides of an insulating layer. The reason for this mechanism is the same as in Embodiment 1 above and will not be described in detail.

Subsequently, the one-sided circuit board 123 with an insulating sheet having a circuit layer 103 formed thereon is punched using a punching die 116 to form a through-hole 108 as shown in FIG. 17. Subsequently, as shown in FIG. 18, one substantially spherical conductor 109 having a larger diameter than the diameter of the through-hole 108 is disposed at the position of the through-hole 108. Using an upper pressure plate 117 and a lower pressure plate 118, the substantially spherical conductor 109 is then press-fitted into the through-hole 108. In this manner, the substantially spherical conductor 109 begins to be press-fitted and deformed. The volume of the substantially spherical conductor 109 is predetermined to be greater than the volume of the opening of the through-hole 108.

Subsequently, as shown in FIG. 19, the substantially spherical conductor 109 comes in contact with the lower pressure plate 118 to undergo deformation. Thus, the press-fitting and deformation of the substantially spherical conductor 109 in the through-hole 108 is finished. As a result, a one-sided circuit board 124 with an adhesive sheet having an interlayer connection bump 110 formed thereon is obtained. The interlayer connection bump 110 extends from the one-sided circuit board 124 with an adhesive sheet beyond the upper circuit layer 103 and the adhesive sheet 122 to fill the interior of the through-hole 108 compactly.

Subsequently, as shown in FIG. 20, the other one-sided circuit board 125 having the interlayer connection bump 110 formed thereon and the one-sided circuit board 124 having the interlayer connection bump 110 formed thereon are laminated on each other with the circuit layer of the two one-sided circuit boards disposed outside. The laminate is then heated under pressure using the upper heating pressure plate 119 and the lower heating pressure plate 120. During this procedure, the two one-sided circuit boards are disposed in such an arrangement that the interlayer connection bump 110 of the one-sided circuit board 124 with an adhesive sheet and the interlayer connection bump 110 of the other one-sided circuit board 125 come in contact with each other. In this arrangement, an interlayer conductor 126 having two interlayer connection bumps electrically connected to each other is formed. Thus, a multi-layered FPC 200 which is a both-sided circuit board having the upper circuit layer 103 and the lower circuit layer 105 connected to each other with the interlayer conductor 126 as shown in FIG. 14 is obtained.

The other one-sided circuit board 125 having a lower circuit layer 105 formed thereon, too, can be sprayed with the etching solution on the lower side of the one-sided copper-clad laminated board (copper foil is formed on the lower side of the one-sided circuit board) to form a lower circuit layer 105 similarly to the one-sided circuit board 124 with an adhesive sheet having an upper circuit layer 103 formed thereon. In other words, the lower circuit layer 105 is finely patterned similarly to the upper circuit layer 103.

In accordance with the aforementioned method of producing a multi-layered FPC according to Embodiment 2, one-sided circuit boards are laminated on each other, making it possible to pattern the circuit layer more finely than in the case where an ordinary both-sided circuit board is used. Further, since the formation of interlayer connection bump and the formation of adhesive layer are effected at once, the process can be simplified, making it possible to assure a high productivity.

Further, the interlayer connection bumps 110 to be connected are pressed and deformed by each other to raise the connection area as well as the bonding strength thereof. Moreover, the action of the adhesive sheet 122 makes it possible to keep them connected. Accordingly, even when given various external stresses, the circuit layer and the electrically-conductive member can be prevented from being peeled off each other at the connection interface, making it possible to make interlayer connection with a higher reliability. Thus, the present embodiment, too, can provide a multi-layered FPC having a high reliability of connection between circuit layers which is most suitable for fine patterning of circuit layer at a high productivity.

The interposition of solder metal between the interlayer connection bumps 110 at the interface makes it possible to raise further the bonding strength. In other words, in accordance with this production method, when a substantially spherical conductor having solder alloy incorporated therein in the surface thereof is used to form the interlayer connection bump 110, the solder alloy in the surface of the interlayer connection bumps 110 come in contact with each other during the connection of the two interlayer connection bumps 110 to each other, making it easy for the interlayer connection bump 110 to be pressure-deformed on the surface of the circuit layer. It is thus assured that the inter-layer connection bump 110 and the circuit layer can be electrically connected to each other to obtain a high connection reliability. Further, the connection portion is made of solder alloy. Accordingly, when the laminate is heated and cooled with the interlayer connection bumps in contact with each other, the solder is fused and solidified to cause the interlayer connection bumps 110 to be easily connected to each other, making it possible to further enhance the connection reliability.

Embodiment 3

Figure 21:
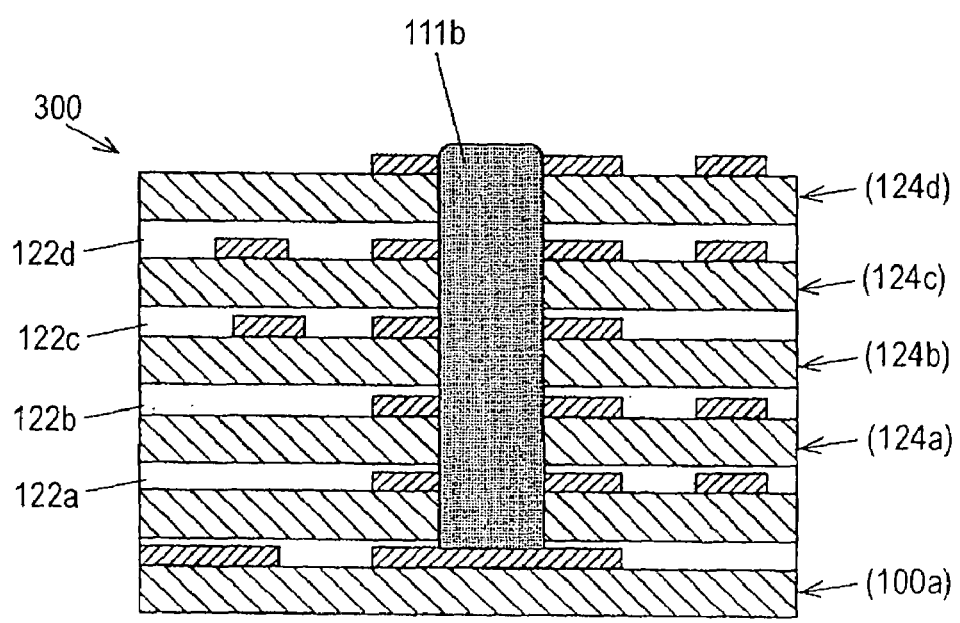
FIG. 21 is a sectional view of an essential part of a multi-layered FPC which has been finished in lamination according to an embodiment of implementation of the invention.
Figure 22:
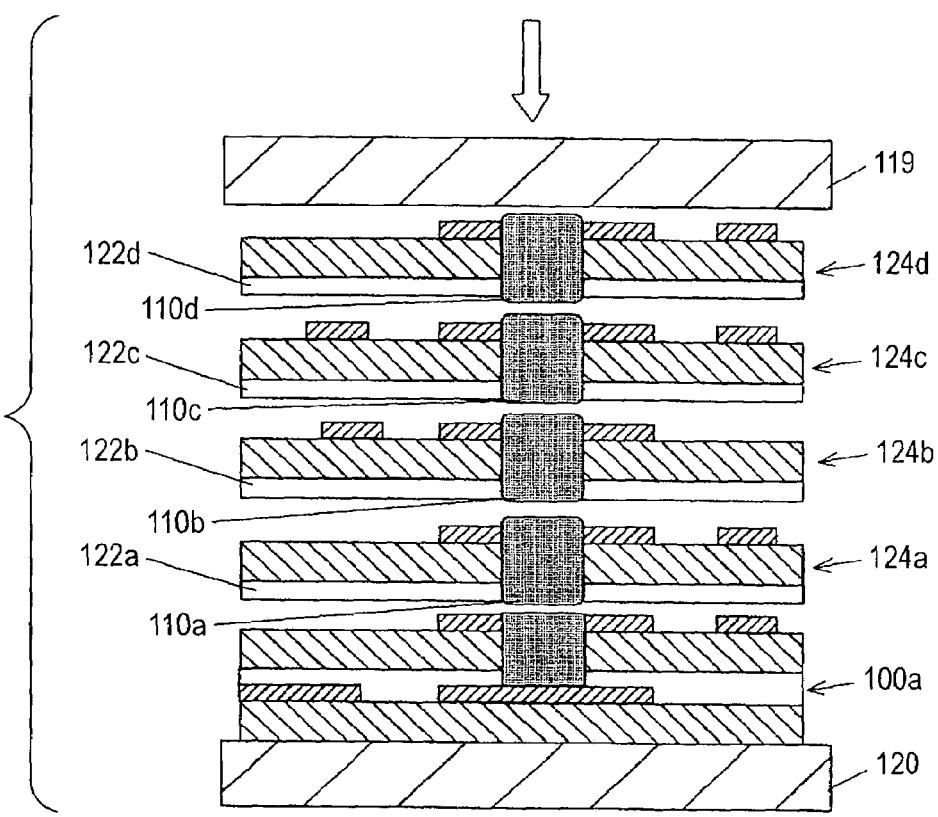
FIG. 22 is a sectional view of an essential part of a multi-layered FPC in the course of lamination according to an embodiment of implementation of the invention.
Figure 23:
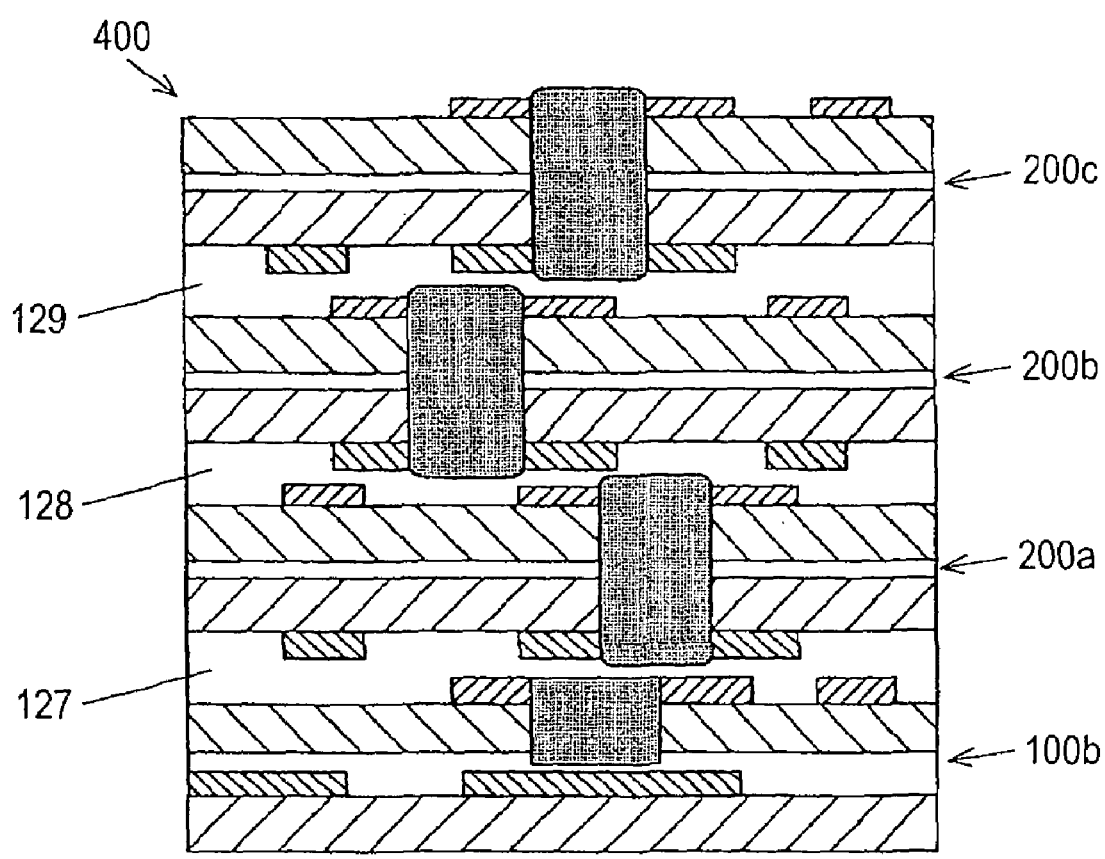
FIG. 23 is a sectional view of an essential part of another multi-layered FPC which has been finished in lamination according to an embodiment of implementation of the invention.

Embodiment 3 will be described hereinafter with reference to a multi-layered FPC according to the invention obtained by further laminating the aforementioned multi-layered FPC. FIG. 21 is a sectional view of an essential part of a multi-layered FPC which has been finished in lamination according to an embodiment of implementation of the invention. FIG. 22 is a sectional view of an essential part of a multi-layered FPC in the course of lamination according to an embodiment of implementation of the invention. FIG. 23 is a sectional view of an essential part of another multi-layered FPC which has been finished in lamination according to an embodiment of implementation of the invention.

Firstly, in FIG. 21, the reference numeral 300 indicates a multi-layered FPC obtained by laminating the multi-layered FPC 100a produced by the aforementioned method of producing a multi-layered FPC according to Embodiment 1 and the one-sided circuit boards 24a, 24b, 24c and 24d with an adhesive sheet comprising an interlayer connection bump formed in the course of the aforementioned method of producing a multi-layered FPC according to Embodiment 2 on each other. In the multi-layered FPC 300, the multi-layered FPC 100a and the one-sided circuit boards 124a, 124b, 124c and 124d with an adhesive sheet have no complete trace of the original form and thus are represented by a parenthesized numeral like (100a) in FIG. 21. In the multi-layered FPC 300, the multi-layered FPC 100a and the one-sided circuit boards 124a, 124b, 124c and 124d with an adhesive sheet having an interlayer connection bump formed thereon, which are constituent members of the multi-layered FPC 300, have fine circuit layers with a high reliability in connection therebetween. Accordingly, even the multi-layered FPC 300, which comprises more circuit layers than in Embodiments 1 and 2, provides a high reliability in interlayer connection as well as an excellent fineness in the circuit layer. Further, the provision of the interlayer conductor 111b allows connection between various adjacent circuit layers in the multi-layered FPC 100a and the one-sided circuit boards 124a, 124b, 124c and 124d.

In order to prepare the aforementioned multi-layered FPC 300, the multi-layered FPC 100a produced in Embodiment 1 above and the one-sided circuit boards 124a, 124b, 124c and 124d with an adhesive sheet comprising an interlayer connection bump formed in the course of the aforementioned method of producing a multi-layered FPC according to Embodiment 2 are laminated on each other in this order in such an arrangement the interlayer conductor 111a and the interlayer connection bumps 110a, 110b, 110c and 110d come in contact with each other as shown in FIG. 22. Subsequently, the laminate is heated under pressure using the upper heating pressure plate 19 and the lower heating pressure plate 20 so that the components are bonded to each other. In this manner, the interlayer connection bumps 110a, 110b, 110c and 110d are deformed to connect to the circuit layer and the interlayer conductor 111a. Further, the provision of the adhesive sheets 122a, 122b, 122c and 122d causes the multi-layered FPC 100a and the one-sided circuit boards 124a, 124b, 124c and 124d with an adhesive sheet to be bonded to each other. Thus, a multi-layered FPC 300 having more circuit layers is obtained as shown in FIG. 21. The method of producing a multi-layered FPC 100a and the one-sided circuit boards 124a, 124b, 124c and 124d with an adhesive sheet are the same as mentioned above and thus will not be described in detail.

In accordance with this production method, when a substantially spherical conductor having solder alloy incorporated therein in the surface thereof is used to form the interlayer connection bumps 110a, 110b, 110c and 110d, the solder alloy in the surface of the interlayer connection bumps 110a, 110b, 110c and 110d come in contact with each other during the connection of the two interlayer connection bumps 110 to each other, making it easy for the interlayer connection bumps to be pressure-deformed. On the surface of the circuit layer. It is thus assured that the interlayer connection bumps and the circuit layer can be electrically connected to each other to obtain a high connection reliability. Further, the connection portion is made of solder alloy. Accordingly, when the laminate is heated and cooled with the interlayer connection bumps in contact with each other, the solder is fused and solidified to cause the interlayer connection bumps 110a, 110b, 110c and 110d to be easily connected to each other, making it possible to further enhance the connection reliability.

In FIG. 23, the reference numeral 400 indicates a multi-layered FPC obtained by laminating the multi-layered FPC 100b produced by the aforementioned method of producing a multi-layered FPC according to Embodiment 1 and the multi-layered FPC 200a, 200b and 200c on each other with adhesive layers 127, 128 and 129 interposed therebetween, respectively. In the multi-layered FPC 400, the multi-layered FPC 100b and the multi-layered 200a, 200b and 200c have fine circuit layers with a high reliability in connection therebetween. Accordingly, even the multi-layered FPC 400, which comprises more circuit layers than in Embodiments 1 and 2, provides a high reliability in interlayer connection as well as an excellent fineness in circuit layer.

In order to prepare the aforementioned multi-layered FPC 400, the multi-layered FPC 100b and the multi-layered FPC 200a produced in Embodiment 1 above are laminated on and bonded to each other with an adhesive layer 127 interposed therebetween. The multi-layered FPC comprising the two multi-layered FPC 100b and 200a laminated on each other and the multi-layered FPC 200b produced in Embodiment 2 above are then laminated on and bonded to each other with an adhesive layer 128 interposed therebetween. The multi-layered FPC comprising the three multi-layered FPC 100b, 200a and 200b laminated on each other and the multi-layered FPC 200c produced in Embodiment 2 above are then laminated on and bonded to each other with an adhesive layer 129 interposed therebetween. In this manner, a multi-layered FPC 400 having more circuit layers can be obtained. The method of producing the multi-layered FPC 100b and the multi-layered FPC 200a, 200b and 200c are the same as mentioned above and thus will not be described in detail. The order of lamination of the aforementioned components may be arbitrary.

The multi-layered FPC 300 and 400 according to the present embodiment thus obtained are formed by further laminating multi-layered FPC having fine circuit layers connected to each other with a high reliability and thus provide a high reliability in interlayer connection and an excellent fineness in circuit layers. Since the interlayer connection of multi-layered FPC, too, is carried out by the use of the aforementioned conductor, the interlayer connection material doesn't need to be newly used, making it possible to obtain a higher productivity. Accordingly, the present embodiment, too, can provide a multi-layered FPC having a high reliability in interlayer connection which is most suitable for fineness of circuit layers at a high productivity.

Embodiment 4

Figure 24:
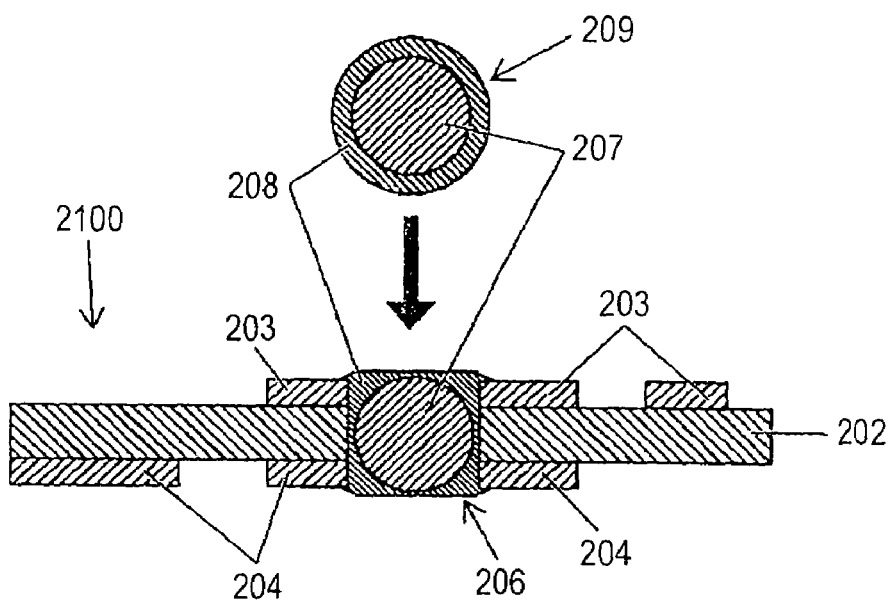
FIG. 24 is a sectional view of an essential part of a multi-layered FPC according to an embodiment of implementation of the invention.

A multi-layered FPC according to an embodiment of implementation of the invention will be described hereinafter. Firstly, the multi-layered FPC of the invention will be described in connection with FIG. 24. FIG. 24 is a sectional view of an essential part of a multi-layered FPC according to Embodiment 4.

In FIG. 24, the reference numeral 2100 indicates a multi-layered FPC according to the present embodiment having an upper circuit layer 203 and a lower circuit layer 204 formed on the both sides of an insulating layer 202 made of polyimide film. With a conductor 206 press-fitted in the interior of the through-hole 205, electrical interlayer connection is established between the upper circuit layer 203 and the lower circuit layer 204. The conductor 206 is formed by pressing one resin-cored metal ball 209 having a resin ball 207 having a smaller diameter than the diameter of the through-hole 205 as a core portion and a surface metal coat layer 208 formed on the surface thereof in the direction along the thickness of the insulating layer 202 as described later so that the metal coat layer 208 on the surface of the resin-cored metal ball 209 is deformed to allow the resin-cored metal ball 209 to be press-fitted into the through-hole 205.

Thus, the conductor 206 that causes interlayer connection in the multi-layered FPC 2100 has the resin ball 207 provided in the core thereof In this arrangement, the Young's modulus of the interlayer conductor 206 can be lowered, making it possible for the resin ball 207 to relax the stress developed by the difference in thermal expansion coefficient between the insulating layer 202 and the conductor 206. The resin ball 207, which is a sphere, can be easily handled. The use of the resin ball 207 is also advantageous in that the producibility of the ball member is excellent. Further, the deformation of the metal layer 208 on the surface of the resin-cored metal ball 209 makes it possible to dispose the resin-cored metal ball 209 (conductor 206) in the through-hole 205 with the resin-cored metal ball 209 in contact with the upper circuit layer 203 and the lower circuit layer 204 and in close contact with the through-hole 205. As a result, in the multi-layered FPC 2100, the upper circuit layer 203 and the lower circuit layer 204 can be certainly electrically connected or conducted to each other via the resin-cored metal ball 209 (conductor 206).

In this arrangement, the greatest problem with interlayer connection with solder can be solved. In other words, a problem can be solved that when a conductor made of solder alone is heated, the solder in the through-hole expands beyond the insulating layer to cause the circuit layer and the solder on the surface of the insulating layer to be peeled off each other at the junction interface, making it impossible to assure the desired connection reliability against heat. Accordingly, the connection configuration of the multi-layered FPC 2100 according to the present embodiment makes it possible to obtain a high reliability in electrical connection between the upper circuit layer 203 and the lower circuit layer 204.

When the metal layer 208 on the surface of the resin-cored metal ball 209 is made of at least one of soft metals, only the metal layer 208 on the surface of the resin-cored metal ball 209 can be deformed without giving any damage to the resin ball 207, making it possible to obtain a higher reliability in electrical connection between the upper circuit layer 203 and the lower circuit layer 204. The term "soft metal" as used herein is meant to indicate a metal that can be used for circuiting purpose among metals having a good conductivity that are so ductile as to undergo plastic deformation. From the standpoint of producibility of the resin-cored metal ball 209, this soft metal can be preferably deposited on the surface of the resin core by plating method. However, the invention is not limited to plating method. Specific examples of the soft metal employable herein include solder alloy, copper, copper alloy, nickel, nickel alloy, gold, silver, and palladium. Preferred among these soft metals are solder alloy, copper, and copper alloy. As the solder formulation of solder alloy there may be used any solder material such as eutectic solder, high temperature solder and lead-free solder. Any solder material may be used depending on the conditions.

The opening shape of the through-hole in which such a resin-cored metal ball 209 is press-fitted is not specifically limited but is preferably circle.

A method of producing the multi-layered FPC 2100 according to the present embodiment that can realize a high reliability in electrical connection between the upper circuit layer 203 and the lower circuit layer 204 by using the aforementioned resin-cored metal ball 209 will be described in detail in connection with FIGS. 25 to 31. In the following views, where the constituent elements are the same as those in FIG. 24, the same reference numerals as in FIG. 24 are used. Detailed description of these constituent elements will not be made.

Figure 25:
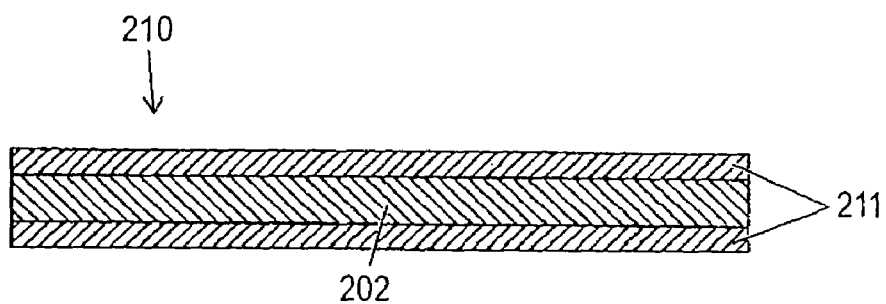
FIG. 25 is a sectional view of an essential part of a both-sided copper-clad laminated board which is a constituent element of a multi-layered FPC according to an embodiment of implementation of the invention.
Figure 26:
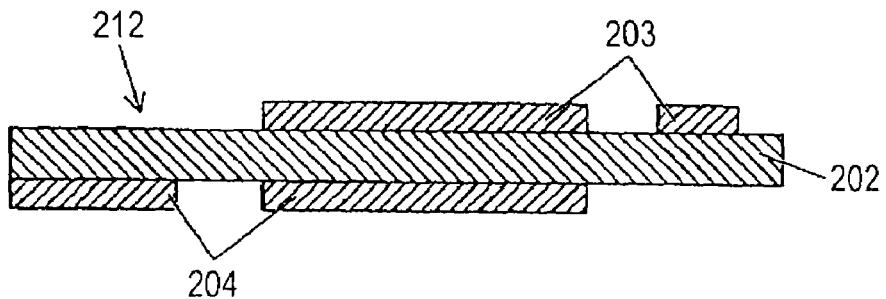
FIG. 26 is a sectional view of an essential part of a both-sided circuit board having a circuit layer according to en embodiment of implementation of the invention formed thereon.
Figure 27:
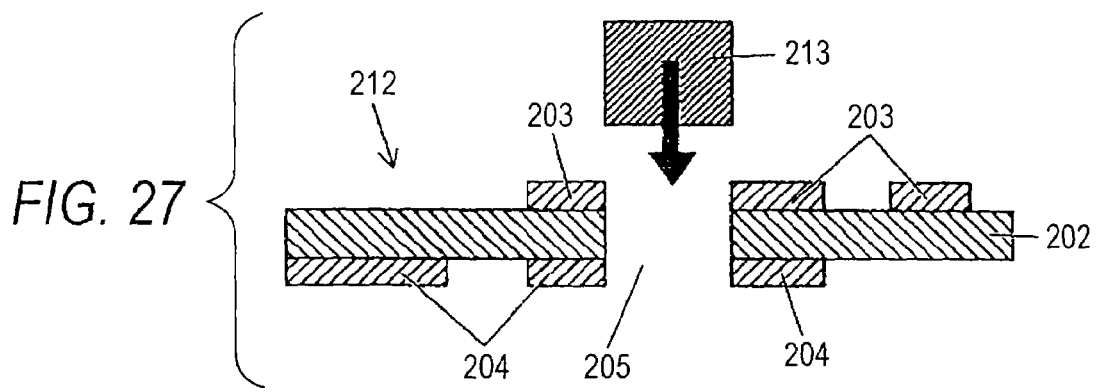
FIG. 27 is a sectional view of an essential part of a both-sided circuit board having a through-hole according to an embodiment of implementation of the invention formed therein.
Figure 28:
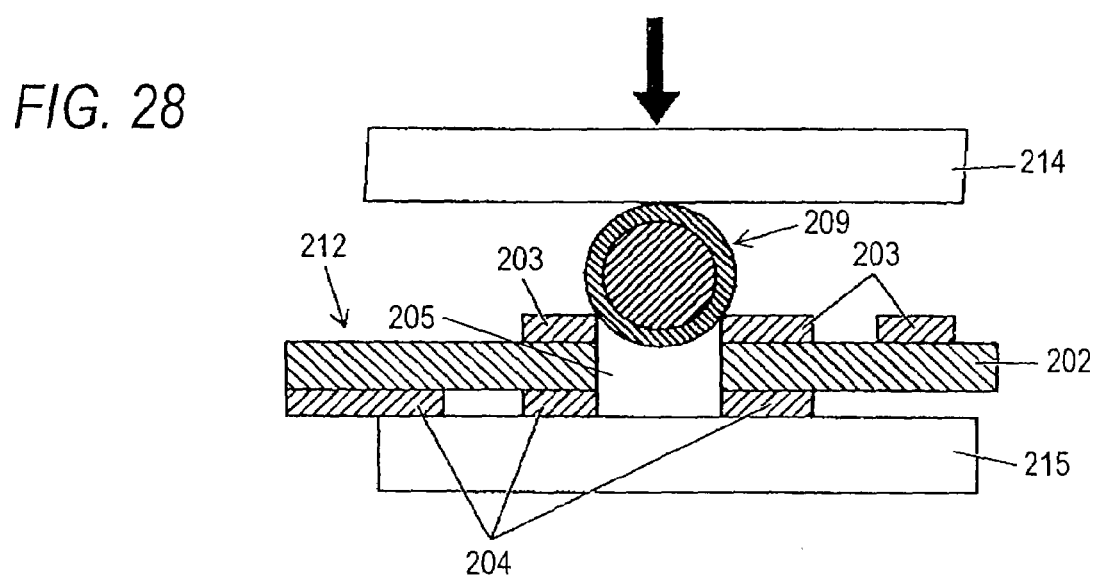
FIG. 28 is a sectional view of an essential part of a both-sided circuit board shown at the beginning of press-fitting of a resin-cored metal ball according to an embodiment of implementation of the invention.
Figure 29:
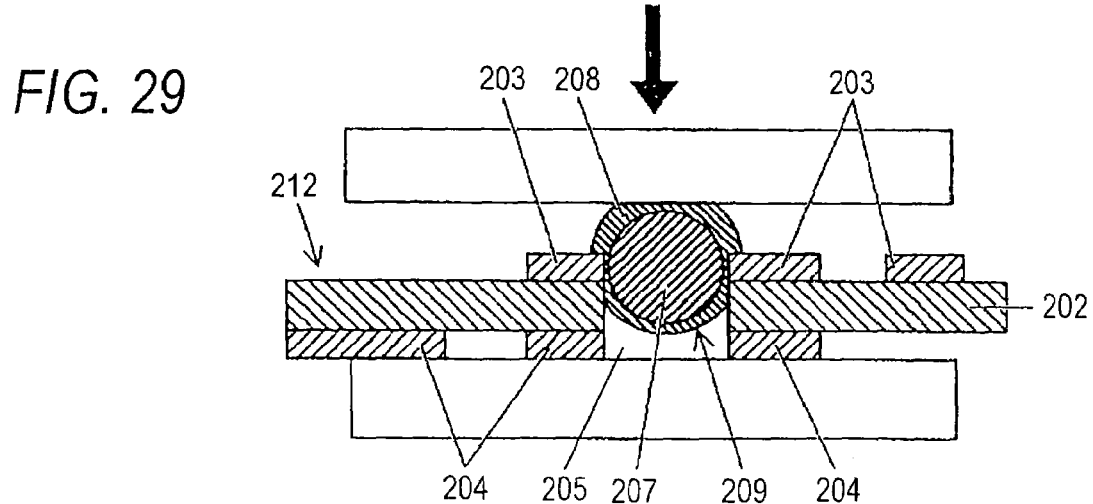
FIG. 29 is a sectional view of an essential part of a both-sided circuit board in the course of press-fitting and deformation of a resin-cored metal ball according to an embodiment of implementation of the invention.
Figure 30:
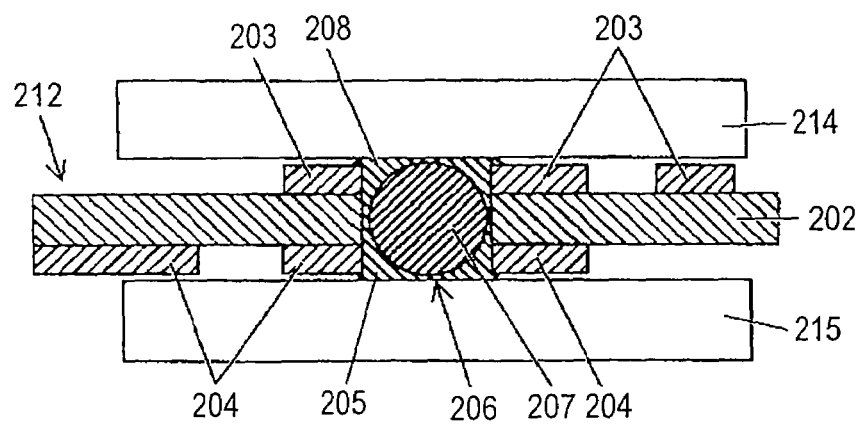
FIG. 30 is a sectional view of an essential part of a both-sided circuit board shown at the end of press-fitting and deformation of a resin-cored metal ball according to an embodiment of implementation of the invention.
Figure 31:
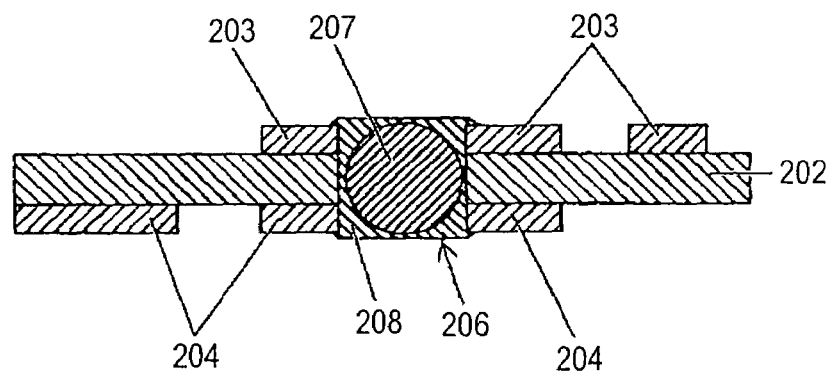
FIG. 31 is a sectional view of an essential part of a multi-layered FPC shown after interlayer connection according to an embodiment of implementation of the invention.
Figure 32:
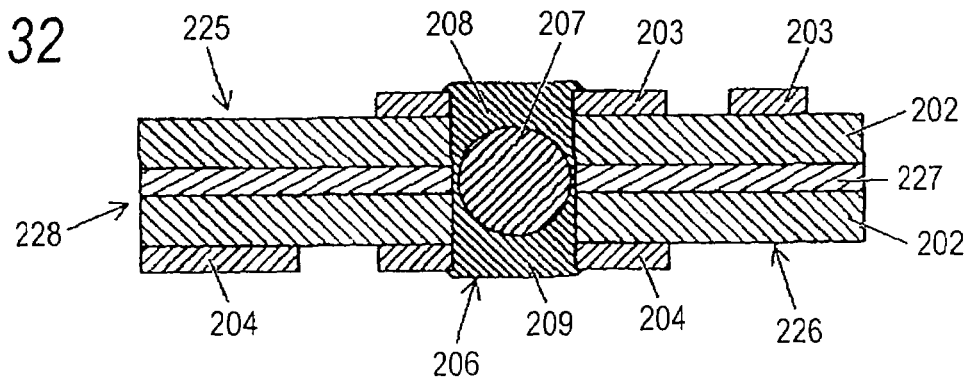
FIG. 32 is a sectional view of an essential part of a multi-layered FPC shown after interlayer connection according to an embodiment of implementation of the invention.

FIGS. 25 to 31 each are a diagram illustrating the procedure of producing the multi-layered FPC 2100 according to Embodiment 4. FIG. 25 is a sectional view of an essential part of a both-sided copper-clad laminated board which is a constituent element of a multi-layered FPC according to an embodiment of implementation of the invention. FIG. 26 is a sectional view of an essential part of a both-sided circuit board having a circuit layer according to en embodiment of implementation of the invention formed thereon. FIG. 27 is a sectional view of an essential part of a both-sided circuit board having a through-hole according to an embodiment of implementation of the invention formed therein. FIG. 28 is a sectional view of an essential part of a both-sided circuit board shown at the beginning of press-fitting of a resin-cored metal ball according to an embodiment of implementation of the invention. FIG. 29 is a sectional view of an essential part of a both-sided circuit board in the course of press-fitting and deformation of a resin-cored metal ball according to an embodiment of implementation of the invention. FIG. 30 is a sectional view of an essential part of a both-sided circuit board shown at the end of press-fitting and deformation of a resin-cored metal ball according to an embodiment of implementation of the invention. FIG. 31 is a sectional view of an essential part of a multi-layered FPC shown after interlayer connection according to an embodiment of implementation of the invention. FIG. 32 is a sectional view of an essential part of a multi-layered FPC shown after interlayer connection according to an embodiment of implementation of the invention.

In the aforementioned views, a both-sided copper-clad laminated board 210 is a both-sided copper-clad laminated board having a copper foil 211 formed directly on both sides of an insulating layer 202. A both-sided circuit board 212 is a both-sided circuit board obtained by etching the both-sided copper-clad laminated board 210 to form an upper circuit layer 203 and a lower circuit layer 204. A punching die 213 is used to form a through-hole 205. An upper pressure plate 214 and a lower pressure plate 15 are used to press-fit and deform the resin-cored metal ball 209.

A method of producing a multi-layered FPC 2100 will be described hereinafter in connection with the attached drawings. Firstly, a both-sided copper-clad laminated board 210 having a copper foil 211 formed directly on both sides of an insulating layer 202 as shown in FIG. 25 is prepared. While the present embodiment is described with reference to the two-layer type both-sided copper-clad laminated board 210 free of adhesive layer between the insulating layer 202 and the copper foil 211 by way of example, the invention is not limited thereto. A three-layer type both-sided copper-clad laminated board having an adhesive layer interposed between the insulating layer 202 and the copper foil 211 or a both-sided copper-clad laminated board having more layers may be used. The layer configuration may be properly changed.

Subsequently, a mask material is formed on the surface of the copper foil 211 according to a circuit pattern. The copper foil 211 is then etched with a copper etching solution such as ferric chloride and copper chloride to obtain a both-sided circuit board 212 having an upper circuit layer 203 and a lower circuit layer 204 formed on the respective side of the insulating layer 202 as shown in FIG. 26 (The upper circuit layer 203 and the lower circuit layer 204 will be hereinafter occasionally referred generically to as "circuit layer").

Subsequently, the one-sided circuit board 212 having a circuit layer formed thereon is punched using a punching die 213 to form a through-hole 205 as shown in FIG. 27. Subsequently, as shown in FIG. 28, one resin-cored metal ball 209 is disposed at the position of the through-hole 205. Using an upper pressure plate 214 and a lower pressure plate 215, the resin-cored metal ball 209 is then press-fitted into the through-hole 205. In this manner, the resin-cored metal ball 209 begins to be press-fitted and deformed.

The resin-cored metal ball 209 is in the form of sphere. When the conductor 209 is in the form of sphere, it can be easily handled. Further, a resin-cored metal ball can be easily produced to advantage. The diameter of the resin ball 207 which is the core of the resin-cored metal ball 209 is predetermined to be smaller than the diameter of the through-hole 205. Further, the metal layer 208 on the surface of the resin-cored metal ball 209 is made of at least one of soft metals such as solder alloy, copper and copper alloy as described above. In this arrangement, only the metal layer 208 on the surface of the resin-cored metal ball 209 can be deformed without giving any damage to the resin ball 207. Referring to the entire resin-cored metal ball 209, the diameter of the resin-cored metal ball 209 is predetermined to be greater than the diameter of the through-hole 205. The volume of the resin-cored metal ball 209 is predetermined to be greater than the volume of the opening of the through-hole 205.

The disposition of the resin-cored metal ball 209 can be accomplished by a known method involving the mounting of solder ball on a semiconductor package called BGA (Ball Grid Array). In some detail, at the position corresponding to the through-hole 205 is prepared a suction plate having a suction hole having a smaller diameter than the diameter of the solder ball formed therein which is connected to a vacuum pump for adjusting the pressure in the suction hole. Subsequently, using the suction plate, the solder ball is sucked into the suction hole, positioned at the top of the through-hole 205, dropped and then positioned at the position of the through-hole 205. An equipment called ball mounter for performing the aforementioned operation may be used. While the present embodiment has been described with reference to the case where the solder ball is mounted by vacuum suction, electrostatic suction may be used.

Subsequently, as shown in FIG. 29, using the upper pressure plate 214 and the lower pressure plate 215, the resin-cored metal ball 209 is pressed so that it is sequentially press-fitted into the through-hole 205. Since the metal layer 208 on the surface of the resin-cored metal ball 209 is made of a material containing a soft metal such as solder alloy, copper and copper alloy, the metal layer 208 is sequentially deformed while being press-fitted in the course of press-fitting by the resin-cored metal ball 209. Subsequently, the metal layer 208 is deformed along the inner wall of the through-hole 205 while being connected to a part of the upper circuit layer 203 so that the interior of the through-hole 205 is sequentially filled compactly with the resin-cored metal ball 209. Since as the resin ball 207 as core of the resin-cored metal ball 209 there is used one having a smaller diameter than the diameter of the through-hole 205, the resin ball 207 cannot be deformed. Thus, the deformation of the metal layer 208 on the surface of the resin-cored metal ball 209 causes the progress of press-fitting and deformation of the resin-cored metal ball 209. In this manner, the resin-cored metal ball 209 can be press-fitted into the through-hole 205 without giving any damage to the resin ball 207.

Subsequently, as shown in FIG. 30, the metal layer 208 under the resin-cored metal ball 209, i.e., metal layer 208 of the resin-cored metal ball 209 on the lower pressure plate 215 side thereof comes in contact with the lower pressure plate 215 to undergo deformation so that it is connected to the lower circuit layer 204. Thus, the press-fitting and deformation of the resin-cored metal ball 209 in the through-hole 205 is finished. Since the resin-cored metal ball 209 has a greater volume than the volume of the opening of the through-hole 205, the interior of the through-hole 205 can be certainly filled with the resin-cored metal ball 209, making it assured that interlayer connection can be established between the upper circuit layer 203 and the lower circuit layer 204. In this manner, a multi-layered FPC 2100 having interlayer connection as shown in FIG. 31, i.e., having the upper circuit layer 203 and the lower circuit layer 204 electrically conducted to each other can be obtained by a very simple process.

While the present embodiment has been described with reference to the case where the ball diameter of the resin-cored metal ball 209 is greater than the diameter of the through-hole 205, the ball diameter of the resin-cored metal ball 209 may be the same as the diameter of the through-hole 205. In this case, too, the circuit layers can be connected to each other by the deformation of the metal layer portion on both the upper and lower sides of the resin-cored metal ball 209. However, taking into account the margin of deformation of the metal layer 208 and the certainty of interlayer connection, the diameter of the resin-cored metal ball 209 is preferably greater than the diameter of the through-hole 205.

The aforementioned method of producing a multi-layered FPC according to the present embodiment has the following characteristics. Firstly, since the resin-cored metal ball 209 which is a conductor for making interlayer connection has a resin ball 207 provided therein, eventually making it possible for the resin ball 207 to relax the stress developed by the difference in thermal expansion coefficient between the conductor 206 and the insulating layer 202 that make interlayer connection. In this manner, the exfoliation of these layers at the connection interface attributed to the difference in thermal expansion coefficient can be prevented, making it possible to obtain a high reliability in electrical connection between the upper circuit layer 203 and the lower circuit layer 204.

Further, since the formation of the circuit layer is followed by the connection between the upper circuit layer 203 and the lower circuit layer 204, the process has no effects on the circuit layer. Accordingly, the reduction of the thickness of the copper foil 113 makes it possible to exert an effect of finely patterning the circuit layer. Thus, this process is suitable for the fineness of circuit layer. Further, since the interlayer connection between the upper circuit layer 203 and the lower circuit layer 204 can be made by a very simple process involving the press-fitting and deformation of the resin-cored metal ball 209, the number of required steps is less than other interlayer connection methods, providing excellent productivity and production cost.

Accordingly, in accordance with the method of producing a multi-layered FPC according to the present embodiment, a multi-layered FPC having a high reliability of connection between circuit layers which is most suitable for fine patterning of circuit layer can be prepared at a good productivity.

While the method of producing a both-sided circuit board according to Embodiment 4 has been described with reference to the case where the copper foil 211 is formed directly on the both sides of the insulating layer 202, the following method of forming a both-sided circuit board may be used. In some detail, a copper foil 211 is formed directly on one side of the insulating layer 202. The copper foil 211 is then etched to form a circuit layer thereon. Two sheets of such one-sided circuit boards are then prepared. Subsequently, the two sheets of one-sided circuit boards are laminated on each other with an adhesive layer interposed therebetween with the circuit layer side thereof are disposed outside. In this manner, a both-sided circuit board formed by laminating two sheets of one-sided circuit boards as shown in FIG. 32 can be formed. In FIG. 32, the reference numeral 225 indicates a one-sided circuit board having an upper circuit layer 203 formed on one side of the insulating layer 202. The reference numeral 226 indicates another one-sided circuit board having a lower circuit layer 204 formed on one side of the insulating layer 202. The reference numeral 228 indicates a both-sided circuit board formed by laminating the one-sided circuit board 225 and the other one-sided circuit board 226 on each other with an adhesive layer 227 with the circuit layer thereof disposed outside. The upper circuit layer 203 and the lower circuit layer 204 are connected to each other via the conductor 206. A one-sided circuit board allows finer patterning of circuit layer than a both-sided circuit board. The both-sided circuit board obtained by laminating two sheets of one-sided circuit boards has finer circuit layers. The fine patterning of circuit layers on the one-sided circuit board will be described in detail in the following Embodiment 5.

Embodiment 5

Figure 34:
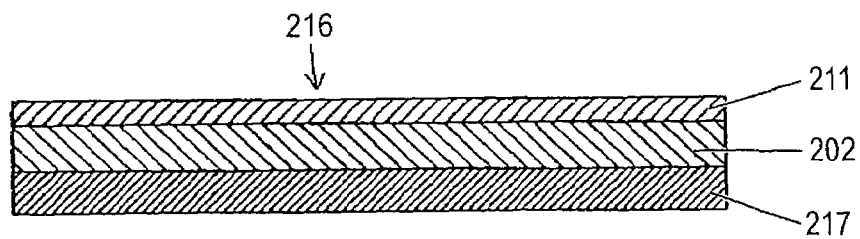
FIG. 34 is a sectional view of an essential part of a one-sided copper-clad laminated board with an adhesive layer which is a constituent element of a multi-layered FPC according to an embodiment of implementation of the invention.
Figure 35:
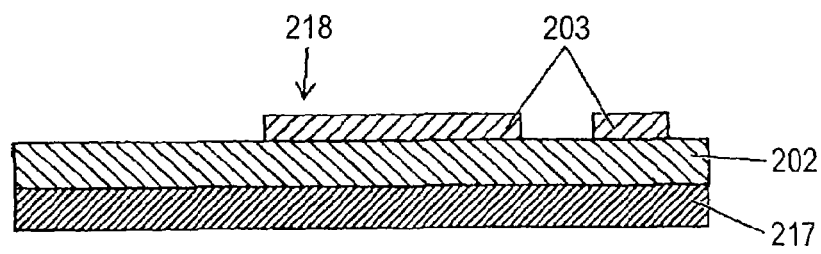
FIG. 35 is a sectional view of an essential part of a one-sided circuit board with an adhesive layer having a circuit layer according to an embodiment of implementation of the invention formed thereon.
Figure 36:
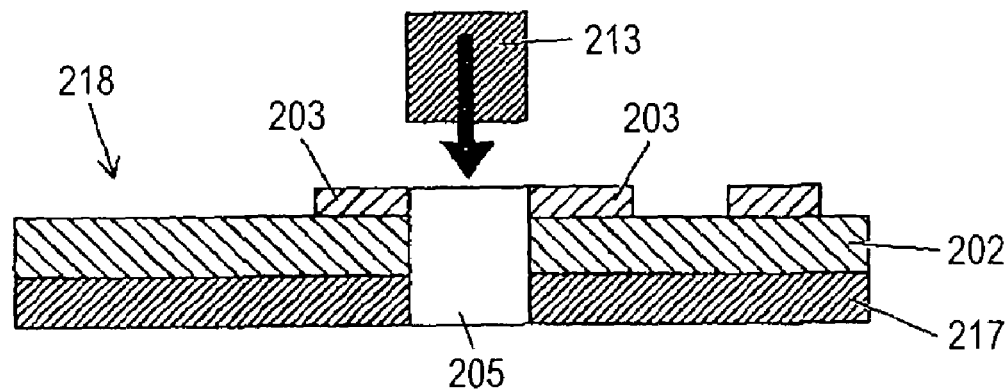
FIG. 36 is a sectional view of an essential part of a one-sided circuit board with an adhesive layer having a through-hole according to an embodiment of implementation of the invention formed therein.
Figure 37:
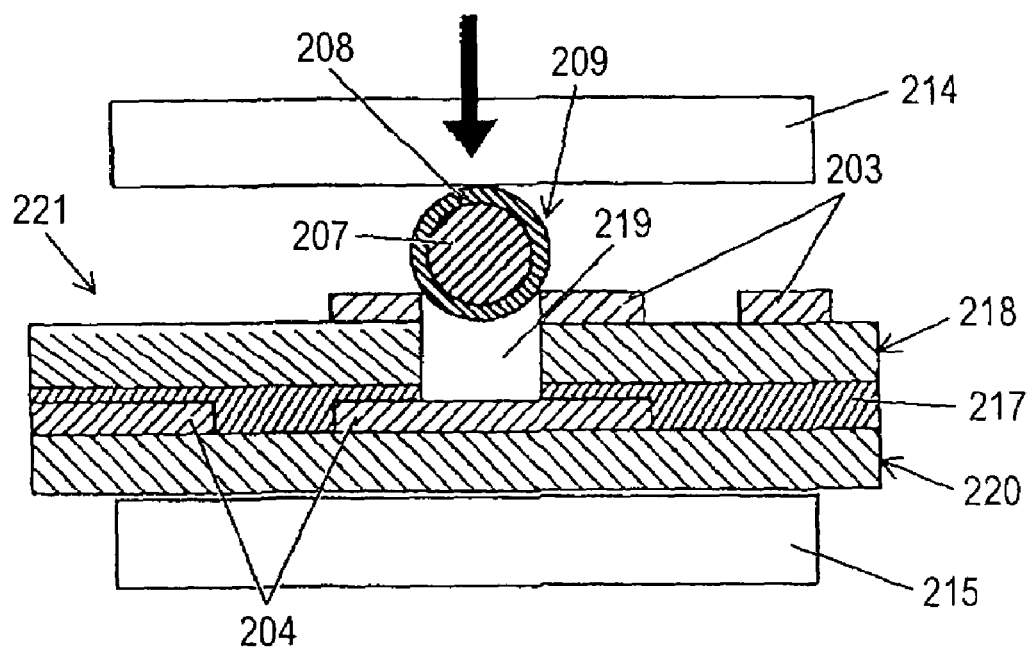
FIG. 37 is a sectional view of an essential part shown at the beginning of press-fitting of a resin-cored metal ball into a multi-layered circuit layer having a blind via hole according to en embodiment of implementation of the invention formed therein.

Embodiment 5 will be described in detail hereinafter with reference to a method of producing a multi-layered FPC according to another embodiment of implementation of the invention excellent in reliability in connection between circuit layers and fine pattering of circuit layers in connection with FIGS. 33 to 37. FIG. 34 is a sectional view of an essential part of a one-sided copper-clad laminated board with an adhesive layer which is a constituent element of a multi-layered FPC according to an embodiment of implementation of the invention. FIG. 35 is a sectional view of an essential part of a one-sided circuit board with an adhesive layer having a circuit layer according to an embodiment of implementation of the invention formed thereon. FIG. 36 is a sectional view of an essential part of a one-sided circuit board with an adhesive layer having a through-hole according to an embodiment of implementation of the invention formed therein. FIG. 37 is a sectional view of an essential part shown at the beginning of press-fitting of a resin-cored metal ball into a multi-layered circuit layer having a blind via hole according to en embodiment of implementation of the invention formed therein.

In the aforementioned views, the reference numeral 2200 indicates a multi-layered FPC having the upper circuit layer 203 and the lower circuit layer 204 electrically connected to each other via the conductor 206. The reference numeral 216 indicates a one-sided copper-clad laminated board with an adhesive layer having a copper foil 211 formed on one side of the insulating layer 202 and an adhesive layer 217 formed on the other side thereof The reference numeral 218 indicates a one-sided circuit board with an adhesive layer having an upper circuit layer 203 formed by etching the one-sided copper-clad laminated board 216 with an adhesive layer. The reference numeral 220 indicates another one-sided circuit board having a lower circuit layer 204 to be laminated on the one-sided circuit board 218 with an adhesive layer. The reference numeral 221 indicates a multi-layered circuit layer formed by laminating the one-sided circuit board 218 with an adhesive layer and the other one-sided circuit board 220 on each other in such an arrangement that a blind via hole 219 is formed for interlayer connection. A punching die 213 is used to form a through-hole 205. An upper pressure plate 214 and a lower pressure plate 215 are used to press-fit and deform the resin-cored metal ball 209.

Figure 33:
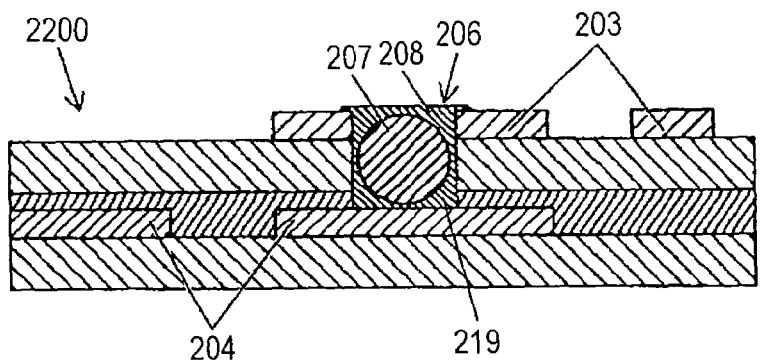
FIG. 33 is a sectional view of an essential part of a multi-layered FPC shown after interlayer connection according to an embodiment of implementation of the invention.

In the multi-layered FPC 2200 according to the present embodiment, a conductor 6 press-fitted in the interior of the blind via hole 219 causes electrical interlayer connection between the upper circuit layer 203 and the lower circuit layer 204 as shown in FIG. 33. The conductor 206 is formed by pressing one resin-cored metal ball 209 having a resin ball 207 having a smaller diameter than the diameter of the blind via hole 219 as a core portion and a surface metal coat layer 208 formed on the surface thereof in the direction along the thickness of the insulating layer 202 as described later so that the metal coat layer 208 on the surface of the resin-cored metal ball 209 is deformed.

Thus, the conductor 206 that causes interlayer connection in the multi-layered FPC 2200 has the resin ball 207 provided in the core thereof as in Embodiment 4. In this arrangement, the Young's modulus of the conductor 206 can be lowered, making it possible for the resin ball 207 to relax the stress developed by the difference in thermal expansion coefficient. Further, the deformation of the metal layer 208 on the surface of the resin-cored metal ball 209 makes it possible to dispose the resin-cored metal ball 209 (conductor 206) in the through-hole 205 with the resin-cored metal ball 209 in contact with the upper circuit layer 203 and the lower circuit layer 204 and in close contact with the blind via hole 219. As a result, the upper circuit layer 203 and the lower circuit layer 204 can be certainly electrically connected to each other via the resin-cored metal ball 209 (conductor 206).

Thus, the greatest problem with the case where solid is used to make interlayer connection can be solved even with the multi-layered FPC 2200 according to Embodiment 5. In other words, a problem can be solved that when a conductor made of solder alone is heated, the solder in the through-hole expands beyond the insulating layer to cause the circuit layer and the solder on the surface of the insulating layer to be peeled off each other at the junction interface, making it impossible to assure the desired connection reliability against heat. Accordingly, the connection configuration of the multi-layered FPC 2200 according to Embodiment 5, too, makes it possible to obtain a high reliability in electrical connection between the upper circuit layer 203 and the lower circuit layer 204.

In the present embodiment of implementation of the invention, the conductor 206 for interlayer connection is press-fitted in the blind via hole 219 having the lower circuit layer 204 at the bottom thereof In this arrangement, as compared with the arrangement such that the conductor 206 for interlayer connection is press-fitted in the through-hole, the connection area between the conductor 206 and the circuit layer can be raised. The bonding strength between the two layers, too, can be raised. Accordingly, even when given various external stresses in the multi-layered FPC 2200, the circuit layer and the conductor 206 can be prevented from being peeled off each other at the connection interface, making it possible to realize a multi-layered FPC 2200 having a higher connection reliability.

When the metal layer 208 on the surface of the resin-cored metal ball 209, in the same way as in Embodiment 4, is made of a soft metal, particularly at least one of soft metals such as solder alloy, copper and copper alloy, only the metal layer 208 on the surface of the resin-cored metal ball 209 can be deformed without giving any damage to the resin ball 207, making it possible to obtain a higher reliability in electrical connection between the upper circuit layer 203 and the lower circuit layer 204.

A method of producing a multi-layered FPC 2200 according to Embodiment 5 that realizes such a high connection reliability will be described in detail in connection with the attached drawings.

Firstly, as shown in FIG. 34, a one-sided copper-clad laminated board 216 with an insulating layer having a copper foil 211 formed on one side of an insulating layer 202 and an adhesive layer 217 formed on the other side thereof is prepared. While the present embodiment has been described with reference to the one-sided copper-clad laminated board 216 free of adhesive layer between the insulating layer 202 and the copper foil 211 by way of example, the invention is not limited thereto. A one-sided copper-clad laminated board with an insulating sheet having an adhesive layer interposed between the insulating layer 202 and the copper foil 211 or a one-sided copper-clad laminated board with an insulating sheet having more layers may be used. The layer configuration may be properly changed.

Subsequently, a mask material is formed on the surface of the copper foil 211 according to a circuit pattern. The copper foil 211 is then etched with an etching solution such as ferric chloride and copper chloride to obtain a one-sided circuit board 218 with an adhesive layer having an upper circuit layer 203 formed thereon as shown in FIG. 35. In the present embodiment, unlike the case where the circuit layer on the aforementioned both-sided circuit board is formed, one-sided etching suitable for fineness can be effected, making it possible to pattern the upper circuit layer 203 more finely. Accordingly, the upper circuit layer 203 of the one-sided circuit board 218 with an adhesive layer obtained in the present embodiment can be patterned more finely than the circuit layer of the aforementioned both-sided circuit board.

The reason for this mechanism will be described hereinafter. Since the formation of a circuit layer on both-sided circuit board normally requires that the copper foil on the both sides of a both-sided copper-clad laminated board be etched at the same time, it is necessary that the etching solution be uniformly applied to the both-sided copper-clad laminated board on both the upper and lower sides thereof. However, when the etching solution is pressure-sprayed onto the both-sided copper-clad laminated board on both the upper and lower sides thereof, the etching solution sprayed onto the upper side of the both-sided copper-clad laminated board then forms a liquid stagnant that makes it impossible to keep the desired etching uniformity. Thus, the conditions under which the both-sided circuit board is etched are uneven and unstable, making it difficult to form a very fine circuit layer.

On the other hand, the formation of a circuit layer on the one-sided circuit board requires that the etching solution be sprayed onto the one-sided copper-clad laminated board (copper foil is formed on the lower side of the one-sided circuit board) only on the lower side thereof Thus, the etching solution forms no liquid stagnant. Accordingly, the etching conditions can be predetermined to fall within an optimum range. Therefore, the method of forming a circuit layer on the one-sided circuit board according to the present embodiment is suitable for the fineness of circuit layer.

Subsequently, the one-sided circuit board 218 with an adhesive layer having an upper circuit layer 203 formed thereon is punched using a punching die 213 to form a through-hole 205 as shown in FIG. 36. Subsequently, as shown in FIG. 37, the one-sided circuit board 218 with an adhesive layer having a through-hole 205 formed therein and the other one-sided circuit board 220 having a lower circuit layer 204 formed thereon are laminated on each other with the adhesive layer 217 interposed therebetween with the lower circuit layer 204 and the adhesive layer 217 opposed to each other to obtain a multi-layered circuit board 221 having a blind via hole 219 formed therein for interlayer connection.

The other one-sided circuit board 220 having a lower circuit layer 204 formed thereon, too, can be sprayed with the etching solution on the lower side of the one-sided copper-clad laminated board (copper foil is formed on the lower side of the one-sided circuit board) to form a lower circuit layer 204 similarly to the one-sided circuit board 218 with an adhesive layer having an upper circuit layer 203 formed thereon. In other words, the lower circuit layer 204 is finely patterned similarly to the upper circuit layer 203. Accordingly, the multi-layered circuit board 221 thus obtained comprises one-sided circuit boards having finely patterned circuit layers laminated on each other. Therefore, the circuit layers on the multi-layered circuit board 221 are more finely patterned than the circuit layers on the aforementioned both-sided circuit board.

Subsequently, as shown in FIG. 33, one resin-cored metal ball 209 is disposed at the position of the opening of the blind via hole 219. Using an upper pressure plate 214 and a lower pressure plate 215, the resin-cored metal ball 209 is then press-fitted into the blind via hole 219. In this manner, the resin-cored metal ball 209 begins to be press-fitted and deformed. When the entire resin-cored metal ball 209 is press-fitted into the blind via hole 219, the resin-cored metal ball 209 makes electrical interlayer connection between the upper circuit layer 203 and the lower circuit layer 204 as a conductor 206 press-fitted in the interior of the blind via hole 219 as shown in FIG. 33, making it possible to obtain a multi-layered FPC 2200 excellent in fineness of circuit layers.

Referring to the resin-cored metal ball 209 to be press-fitted into the blind via hole 219, the diameter of the resin ball 207 as core of the resin-cored metal ball 209 is predetermined to be smaller than the diameter of the opening of the blind via hole 219. The metal layer 208 on the surface of the resin-cored metal ball 209 is made of a soft metal such as solder alloy, copper and copper alloy as in Embodiment 4. Further, the ball diameter of the entire resin-cored metal ball 209 is predetermined to be greater than the diameter of the opening of the blind via hole 219. The volume of the resin-cored metal ball 209 is predetermined to be greater than the volume of the opening of the blind via hole 219. The effect of this arrangement is the same as in Embodiment 4.

In the present embodiment, the conductor 206 for interlayer connection (resin-cored metal ball 209) is press-fitted into the blind via hole 219 having a lower circuit layer 204 at the bottom thereof In this arrangement, as compared with the arrangement such that the conductor 206 for interlayer connection (resin-cored metal ball 209) is press-fitted in the through-hole, the connection area of the conductor 206 with the circuit layer can be raised. The bonding strength between the two layers, too, can be raised. Accordingly, even when given various external stresses, the circuit layer and the conductor 206 can be prevented from being peeled off each other at the connection interface, making it possible to obtain a higher connection reliability.

In accordance with the aforementioned method of producing a multi-layered FPC according to Embodiment 5, one-sided circuit boards are laminated on each other, making it possible to pattern the circuit layer more finely than in the case where a both-sided circuit board is used. Further, since the conductor 206 formed by press-fitting and deforming the resin-cored metal ball 209 is press-fitted into the blind via hole 219, a higher reliability in interlayer connection can be obtained than in the case where the conductor 6 formed by press-fitting and deforming the resin-cored metal ball 209 is press-fitted into the through-hole 205. Accordingly, in the present embodiment, too, a multi-layered FPC having a high reliability of connection between circuit layers which is most suitable for fineness of circuit layer can be prepared at a good productivity.

Embodiment 6

Figure 38:
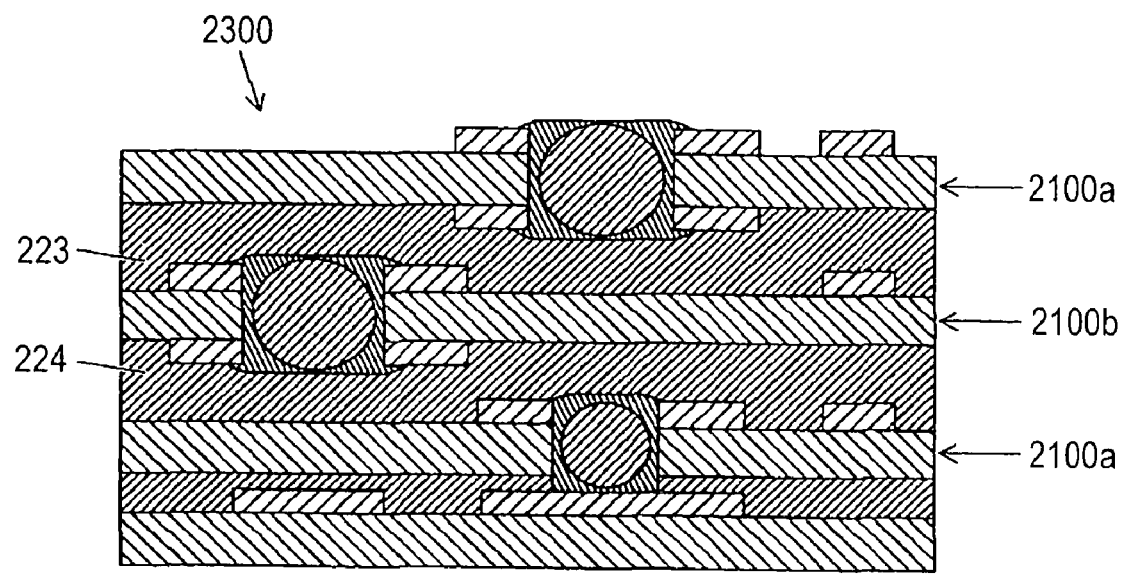
FIG. 38 is a sectional view of an essential part of a multi-layered FPC which has been finished in lamination according to an embodiment of implementation of the invention.
Figure 39:
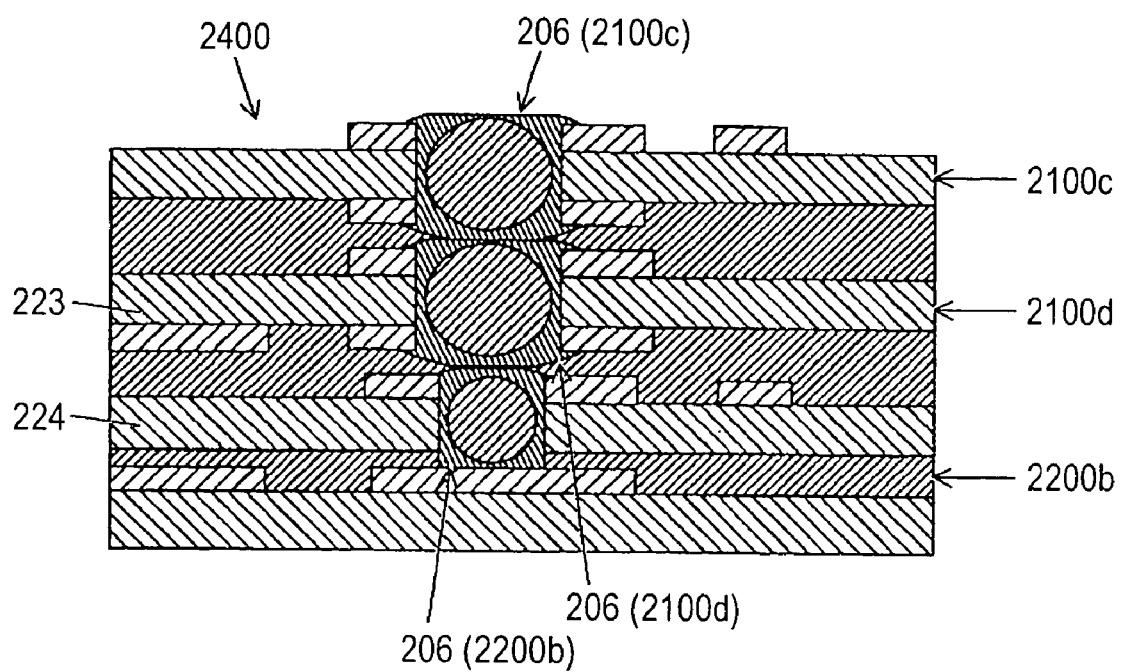
FIG. 39 is a sectional view of an essential part of another multi-layered FPC which has been finished in lamination according to an embodiment of implementation of the invention.

Embodiment 6 will be described with reference to a multi-layered FPC according to the present embodiment of implementation of the invention obtained by further laminating the aforementioned multi-layered FPC. FIG. 38 is a sectional view of an essential part of a multi-layered FPC which has been finished in lamination according to an embodiment of implementation of the invention. FIG. 39 is a sectional view of an essential part of another multi-layered FPC which has been finished in lamination according to an embodiment of implementation of the invention.

In FIG. 38, the reference numeral 2300 indicates a multi-layered FPC obtained by laminating two multi-layered FPC 2100a and 2100b produced in Embodiment 4 above and multi-layered FPC 2200a produced in Embodiment 5 above with adhesive layers 223 and 224 interposed therebetween. In the multi-layered FPC 2300, the multi-layered FPC 2100a and 2100b and the multi-layered FPC 2200a, which are constituent members of the multi-layered FPC 2300, have fine circuit layers with a high reliability in connection therebetween. Accordingly, even the multi-layered FPC 2300, which comprises more circuit layers than in Embodiments 4 and 5, provides a high reliability in interlayer connection as well as an excellent fineness of circuit layer.

In order to prepare the aforementioned multi-layered FPC 2300, two multi-layered FPC 2100a and 2100b produced in Embodiment 4 are laminated on and bonded to each other with an adhesive layer 223. Subsequently, the multi-layered FPC comprising the two multi-layered FPC 2100a and 2100b laminated on each other and the multi-layered FPC 2200a produced in Embodiment 5 above are laminated on and bonded to each other with an adhesive layer 224. In this manner, a multi-layered FPC 2300 having more circuit layers can be obtained. The method of producing the multi-layered FPC 2100a and 2100b and multi-layered FPC 2200a are the same as mentioned above and will not be described in detail. The lamination of the multi-layered FPC 2100a may be effected after the lamination of the multi-layered FPC 2100b and the multi-layered FPC 2200a.

In FIG. 39, the reference numeral 2400 indicates a multi-layered FPC obtained by laminating the two multi-layered FPC 2100c and 2100d produced in Embodiment 4 above and the multi-layered FPC 2200b produced in Embodiment 5 above on each other with an adhesive layer 223 and an adhesive layer 224 interposed therebetween in such an arrangement that the conductor 206 thereof come in contact with each other. In the multi-layered FPC 2400, the multi-layered FPC 2100c and 2100d and the multi-layered FPC 200b, which are constituent members of the multi-layered FPC 2400, have fine circuit layers with a high reliability in connection therebetween. Accordingly, even the multi-layered FPC 2400, which comprises more circuit layers than in Embodiments 4 and 5, provides a high reliability in interlayer connection as well as an excellent fineness of circuit layer. Further, the conductor 206 has a surface metal layer and thus allows connection between various adjacent circuit layers in the multi-layered FPC 2100c and 2100d and the multi-layered FPC 2200b.

In order to prepare the multi-layered FPC 2400, the two multi-layered FPC 2100c and 2100d produced in Embodiment 4 above are laminated on and bonded to each other with an adhesive layer 223 interposed therebetween in such an arrangement that the conductor 206 for the multi-layered FPC 2100c and 2100d come in contact with each other. Subsequently, the multi-layered FPC comprising the two multi-layered FPC 2100c and 2100d laminated on each other and the multi-layered FPC 2200b produced in Embodiment 5 above are laminated on and bonded to each other with an adhesive layer 224 interposed therebetween in such an arrangement that the conductor 206 (2100d) for the multi-layered FPC 2100d and the conductor 206 (2200b) for the multi-layered FPC 2200b come in contact with each other. In this arrangement, a multi-layered FPC 2400 having more circuit layers can be obtained. Further, the conductor 206 has a surface metal layer and thus allows connection between various adjacent circuit layers in the multi-layered FPC 2100c and 2100d and the multi-layered FPC 2200b.

The method of producing the multi-layered FPC 2100c and 2100d and multi-layered FPC 2200b are the same as mentioned above and will not be described in detail. The lamination of the multi-layered FPC 2100c may be effected after the lamination of the multi-layered FPC 2100d and the multi-layered FPC 2200b. In the case where resin-cored metal balls comprising soldier or solder alloy incorporated in the surface of the conductors 206 (2100c), 206 (2100d) and 206 (2200b) are used in the present producing method, when these resin-cored metal balls are heated and cooled with the conductors 206 (2100c), 206 (2100d) and 206 (2200b) in contact with each other, the solder or solder alloy on the surface of the conductors 206 (2100c), 206 (2100d) and 206 (2200b) is fused and solidified to cause the conductors 206 (2100c), 206 (2100d) and 206 (2200b) to be easily connected to each other, making it possible to further enhance the connection reliability.

The multi-layered FPC 2300 and 2400 according to the present embodiment thus obtained are formed by further laminating multi-layered FPC having fine circuit layers connected to each other with a high reliability and thus provide a high reliability in interlayer connection and an excellent fineness of circuit layers. Since the interlayer connection of multi-layered FPC, too, is carried out by the use of the aforementioned conductor, the interlayer connection material doesn't need to be newly used, making it possible to obtain a higher productivity. Accordingly, the present embodiment, too, can provide a multi-layered FPC having a high reliability in interlayer connection which is most suitable for fineness of circuit layers at a high productivity.

Embodiment 7

Figure 40:
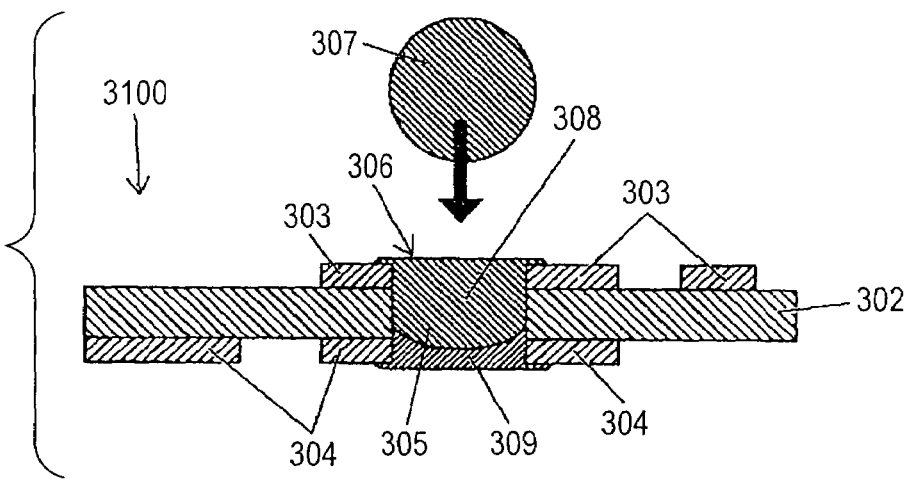
FIG. 40 is a sectional view of an essential part of a multi-layered FPC according to an embodiment of implementation of the invention.

A multi-layered FPC according to an embodiment of implementation of the invention will be described hereinafter. Firstly, a multi-layered FPC of the invention will be described in connection with FIG. 40. FIG. 40 is a sectional view of an essential part of a multi-layered FPC according to Embodiment 7.

In FIG. 40, the reference numeral 3100 indicates a multi-layered FPC according to the present embodiment having an upper circuit layer 303 and a lower circuit layer 304 formed on the both sides of an insulating layer 302 made of polyimide film. With a conductor 306 press-fitted in the interior of the through-hole 305, continuity between the upper circuit layer 303 and the lower circuit layer 304, that is, electrical interlayer connection is established between the upper circuit layer 303 and the lower circuit layer 304. The conductor 306 is formed by a laminate of a metal plug 308 formed by press-fitting one substantially spherical conductor 307 and a solder connector 309 made of solder alloy as shown in FIG. 40. As the solder formulation of the solder connector 309 there may be used any of eutectic solder, high temperature solder and lead-free solder depending on the various conditions without any limitation.

Thus, the conductor 306 that makes interlayer connection in the multi-layered FPC 3100 is formed by a laminate of the metal plug 308 formed by press-fitting the substantially spherical conductor 307 and the solder connector 309 made of solder material. In this arrangement, the metal plug 308 having a drastically smaller thermal expansion coefficient than that of solder material and the solder connector 309 can be combined to lower the thermal expansion coefficient of the entire conductor 306 to that of the insulating layer 302.

In this arrangement, the greatest problem with interlayer connection with solder can be solved. In other words, a problem can be solved that when a conductor made of solder alone is heated, the solder in the through-hole expands beyond the insulating layer to cause the circuit layer and the solder on the surface of the insulating layer to be peeled off each other at the junction interface, making it impossible to assure the desired connection reliability against heat. Accordingly, the connection configuration of the multi-layered FPC 3100 according to the present embodiment makes it possible to obtain a high reliability in electrical connection between the upper circuit layer 303 and the lower circuit layer 304.

As the substantially spherical conductor 307 there may be used a sphere metal particle excellent in uniformity in particle diameter and sphericity obtained by uniform metal droplet spraying method, though poor in productivity, or a substantially spherical metal particle obtained by atomizing method, which is poor in uniformity in particle diameter and sphericity but suitable for mass production. Taking into account the difference in productivity, the former method provides an expensive member while the latter method provides in inexpensive member. In the invention, even when the particle diameter of substantially spherical conductors 307 is uneven, the solder connector 309 can be disposed interposed between the substantially spherical conductors 307 to absorb the dispersion of particle diameter of the substantially spherical conductors 307, making it possible to obtain desired interlayer connection. Accordingly, as the substantially spherical conductor 307 to be used in the invention there may be used a substantially spherical metal particle obtained by the atomizing method, which is poor in uniformity in particle diameter and sphericity but inexpensive. In this arrangement, a multi-layered FPC having a high reliability in connection between circuit layers can be realized at reduced cost. Further, the substantially spherical conductor to be used as a material constituting the metal plug can be easily handled. Moreover, the substantially spherical conductor can be easily produced to advantage.

As the material of the substantially spherical conductor 307 there may be used a metal. Further, the material of the substantially spherical conductor 307 preferably contains at least one of soft metals. The constitution of the substantially spherical conductor 307 by a soft metal makes it possible to smoothly press-fit the substantially spherical conductor 307 into the through-hole 305 without breaking the through-hole 305. Thus, a metal plug 308 kept fully in contact with the wall surface of the through-hole 305 can be formed. Since the metal plug 308 is embedded in the through-hole 305 with a high adhesivity, a higher connection reliability can be obtained. The term "soft metal" as used herein is meant to indicate a metal that can be used for circuit purpose among metals having a good conductivity that conform with the substrate or insulating layer 302 in thermal expansion coefficient and are so ductile as to undergo plastic deformation. Specific examples of the material of the substantially spherical conductor 307 include copper, aluminum, nickel, gold, silver, palladium, and alloy thereof Preferred among these materials are copper and copper alloy. This is because copper and copper alloy conform most fairly with the substrate (insulating layer) in thermal expansion coefficient.

The opening shape of the through-hole 305 in which the conductor 306 having such a laminated structure is press-fitted is not specifically limited but is preferably circle.

A method of producing the multi-layered FPC 100 according to the present embodiment that can realize a high reliability in electrical connection between the upper circuit layer 303 and the lower circuit layer 304 by using the conductor 306 having such a laminated structure will be described in detail in connection with FIGS. 41 to 48. In the following views, where the constituent elements are the same as those in FIG. 40, the same reference numerals as in FIG. 40 are used. Detailed description of these constituent elements will not be made.

Figure 41:
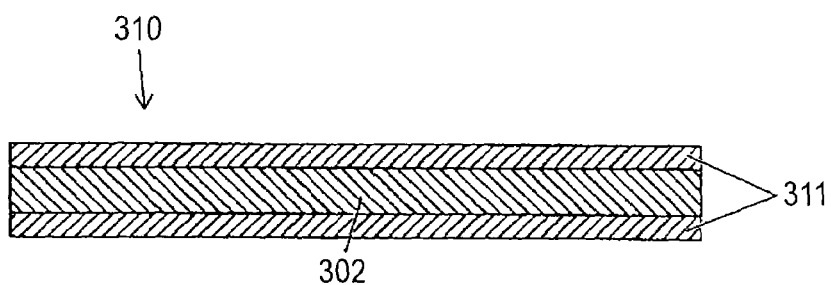
FIG. 41 is a sectional view of an essential part of a both-sided copper-clad laminated board which is a constituent element of a multi-layered FPC according to an embodiment of implementation of the invention.
Figure 42:
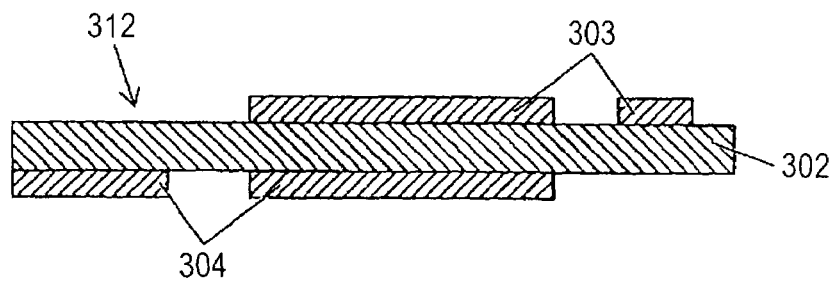
FIG. 42 is a sectional view of an essential part of a both-sided circuit board having a circuit layer according to an embodiment of implementation of the invention formed thereon.
Figure 43:
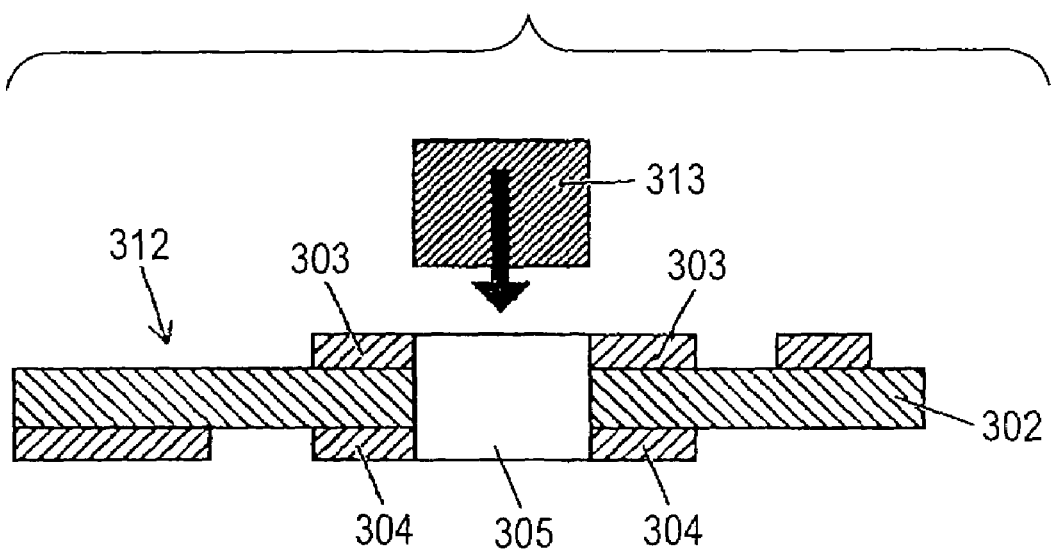
FIG. 43 is a sectional view of an essential part of a both-sided circuit board having a through-hole according to an embodiment of implementation of the invention formed therein.
Figure 44:
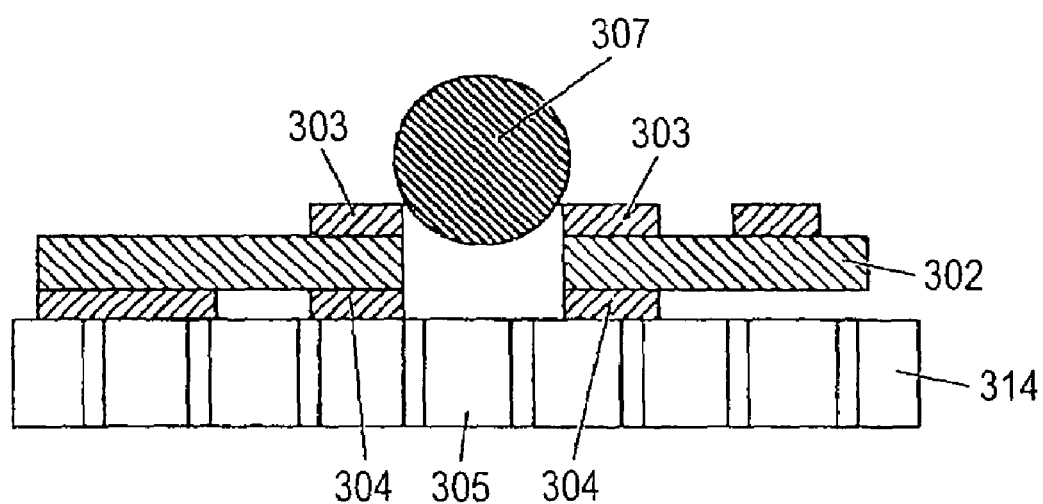
FIG. 44 is a sectional view of an essential part of a both-sided circuit board having a substantially spherical conductor according to an embodiment of implementation of the invention disposed thereon.
Figure 45:
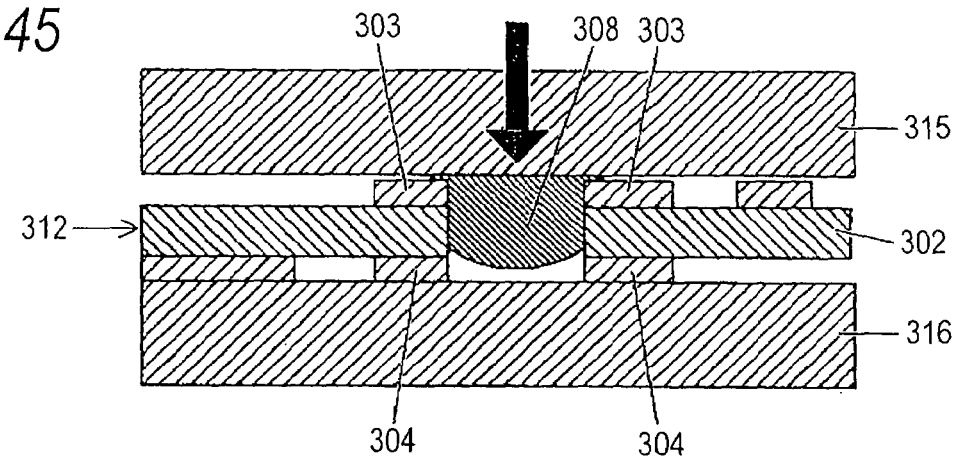
FIG. 45 is a sectional view of an essential part of a both-sided circuit board having a substantially spherical conductor according to an embodiment of implementation of the invention press-fitted therein.
Figure 46:
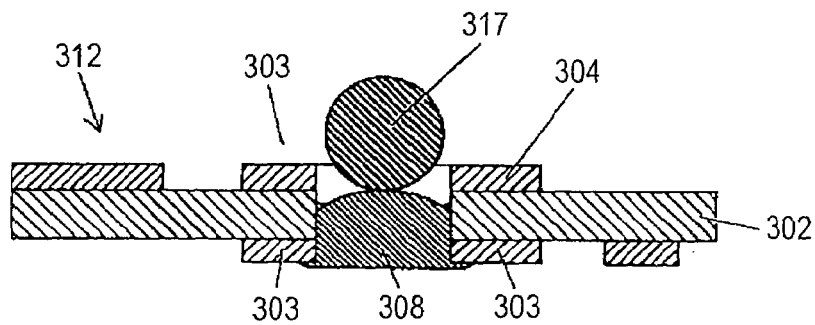
FIG. 46 is a sectional view of an essential part of a both-sided circuit board having a solder ball according to an embodiment of implementation of the invention disposed thereon.
Figure 47:
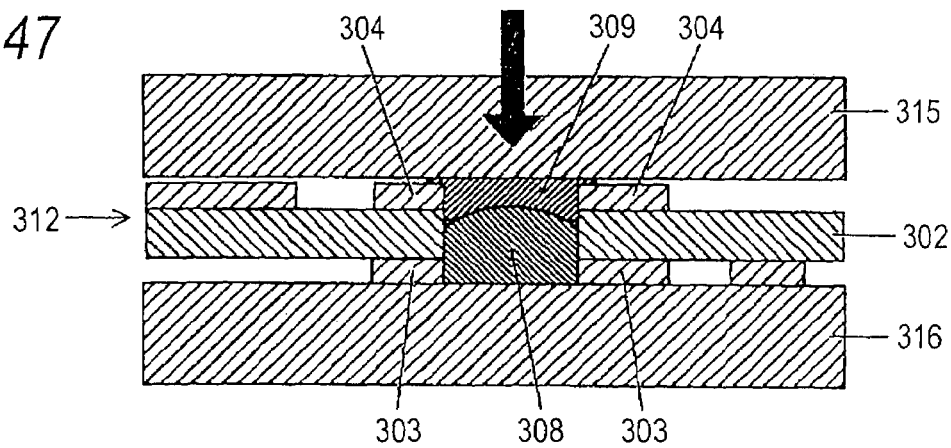
FIG. 47 is a sectional view of an essential part of a both-sided circuit board having a solder ball according to an embodiment of implementation of the invention press-fitted therein.
Figure 48:
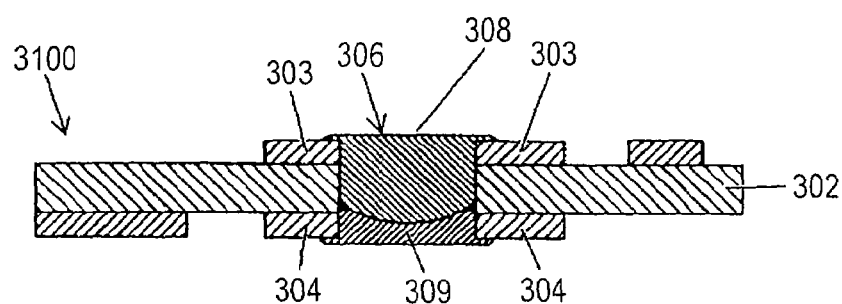
FIG. 48 is a sectional view of an essential part of a multi-layered FPC shown after interlayer connection according to an embodiment of implementation of the invention.
Figure 49:
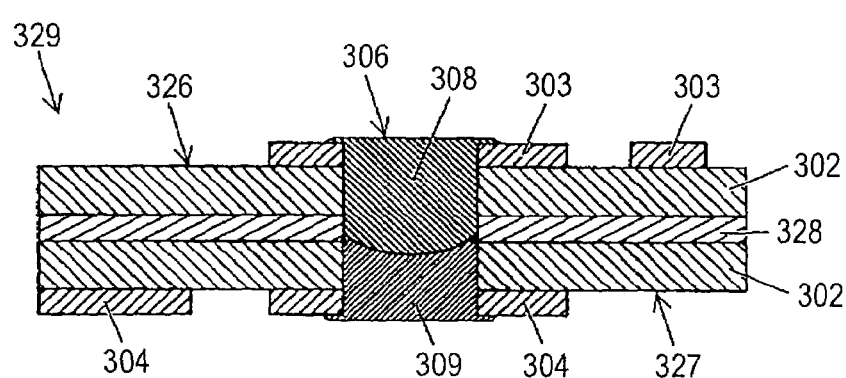
FIG. 49 is a sectional view of an essential part of a multi-layered FPC according to an embodiment of implementation of the invention.

FIGS. 41 to 48 each are a diagram illustrating a procedure of producing the multi-layered FPC 100 according to Embodiment 7. FIG. 41 is a sectional view of an essential part of a both-sided copper-clad laminated board which is a constituent element of a multi-layered FPC according to an embodiment of implementation of the invention. FIG. 42 is a sectional view of an essential part of a both-sided circuit board having a circuit layer according to an embodiment of implementation of the invention formed thereon. FIG. 43 is a sectional view of an essential part of a both-sided circuit board having a through-hole according to an embodiment of implementation of the invention formed therein. FIG. 44 is a sectional view of an essential part of a both-sided circuit board having a substantially spherical conductor according to an embodiment of implementation of the invention disposed thereon. FIG. 45 is a sectional view of an essential part of a both-sided circuit board having a substantially spherical conductor according to an embodiment of implementation of the invention press-fitted therein. FIG. 46 is a sectional view of an essential part of a both-sided circuit board having a solder ball according to an embodiment of implementation of the invention disposed thereon. FIG. 47 is a sectional view of an essential part of a both-sided circuit board having a solder ball according to an embodiment of implementation of the invention press-fitted therein. FIG. 48 is a sectional view of an essential part of a multi-layered FPC shown after interlayer connection according to an embodiment of implementation of the invention. FIG. 49 is a sectional view of an essential part of a multi-layered FPC according to an embodiment of implementation of the invention.

In the aforementioned views, the reference numeral 310 indicates a both-sided copper-clad laminated board having a copper foil 311 formed on the both sides of an insulating layer 302. The reference numeral 312 indicates a both-sided circuit board having an upper circuit layer 303 and a lower circuit layer 304 formed thereon obtained by etching the both-sided copper-clad laminated board 310. The reference numeral 313 indicates a punching die for forming through-hole. The reference numeral 314 indicates a suction board for disposing the substantially spherical conductor 307. The reference numeral 315 indicates a pressing top plate which moves vertically for press-fitting. The reference numeral 316 indicates a pressing bottom plate. The reference numeral 317 indicates a solder ball which is press-fitted to become a solder connector 309.

The method of producing the multi-layered FPC 3100 will be described in connection with the attached drawings. Firstly, as shown in FIG. 41, a both-sided copper-clad laminated board 310 having a copper foil 311 formed on both sides of an insulating layer 302 is prepared. While the present embodiment is described with reference to the two-layer type both-sided copper-clad laminated board 310 free of adhesive layer between the insulating layer 302 and the copper foil 311 by way of example, the invention is not limited thereto. A three-layer type both-sided copper-clad laminated board having an adhesive layer interposed between the insulating layer 302 and the copper foil 311 or a both-sided copper-clad laminated board having more layers may be used. The layer configuration may be properly changed.

Subsequently, a mask material is formed on the surface of the copper foil 311 according to a circuit pattern. The copper foil 311 is then etched with a copper etching solution such as ferric chloride and copper chloride to obtain a both-sided circuit board 312 having an upper circuit layer 303 and a lower circuit layer 304 formed on the respective side of the insulating layer 302 as shown in FIG. 42 (The upper circuit layer 303 and the lower circuit layer 304 will be hereinafter occasionally referred generically to as "circuit layer"). The upper circuit layer thus obtained cannot be affected at the subsequent steps. Accordingly, in accordance with the method of producing a multi-layered FPC according to the present embodiment, the reduction of the thickness of the copper foil 311 makes it possible to exert an effect of fine circuit layer.

Subsequently, the both-sided circuit board 312 having a circuit layer formed thereon is punched using the punching die 313 to form a through-hole 305 therein as shown in FIG.

43. Subsequently, as shown in FIG. 44, using the suction board 314, air is sucked on the through-hole 305 side so that one substantially spherical conductor 307 is disposed on one of the openings of the through-hole 305 (on the upper circuit layer 303 side). Subsequently, as shown in FIG. 45, the both-sided circuit board 312 is put on the pressing bottom plate 316. The pressing top plate 315 is then moved downward to press-fit the substantially spherical conductor 307 into the through-hole 305 so that a metal plug 308 is formed in the through-hole 305.

Subsequently, as shown in FIG. 46, the both-sided circuit board 312 having the metal plug 308 formed thereon is turned over. A solder ball 317 is then put on the other through-hole 305, i.e., on the side opposite the metal plug 308 (on the lower circuit layer 304 side). The disposition of a solder ball 317 here can be accomplished by a known method involving the mounting of solder ball 317 on a semiconductor package called BGA (Ball Grid Array). In some detail, at the position corresponding to the through-hole 305 is prepared a suction plate having a suction hole having a smaller diameter than the diameter of the solder ball 317 formed therein which is connected to a vacuum pump for adjusting the pressure in the suction hole. Subsequently, using the suction plate, the solder ball 317 is sucked into the suction hole, positioned at the top of the other opening of the through-hole 305, dropped and then positioned at the top of the other opening of the through-hole 305. An equipment called ball mounter for performing the aforementioned operation may be used. While the present embodiment has been described with reference to the case where the solder ball 317 is mounted by vacuum suction, electrostatic suction may be used. A suitable method may be properly selected.

Subsequently, the both-sided circuit board 312 having the solder ball 317 disposed thereon is put on the pressing bottom plate 316 as shown in FIG. 47. The pressing top plate 315 is then moved downward to press-fit the solder ball 317 into the through-hole 305 so that a solder connector 309 connected to the metal plug 308 is formed. In this manner, a conductor 306 having the metal plug 308 and the solder connector 309 laminated on each other can be formed, making it possible to establish interlayer connection between the upper circuit layer 303 and the lower circuit layer 304. Thereafter, the laminate is removed from the press as shown in FIG. 48. As a result, a multi-layered FPC 3100 having the upper circuit layer 303 and the lower circuit layer 304 connected to each other with the conductor 306 formed by laminating the metal plug 308 and the solder connector 309 on each other can be obtained by a very simple process.

The aforementioned method of producing a multi-layered FPC according to the present embodiment has the following characteristics. Since the conductor 306 having the metal plug 308 and the solder connector 309 laminated on each other is formed as conductor for interlayer connection, a multi-layered FPC having a high connection reliability can be prepared. In other words, since the metal plug 308 having a drastically smaller thermal expansion coefficient than that of the solder material and the solder connector 309 are combined to form the conductor 306, the thermal expansion coefficient of the entire conductor 306 can be lowered to that of the insulating layer 302. In this manner, the exfoliation of the circuit layer and the solder on the surface of the insulating layer 302 off each other at the connection interface attributed to the thermal expansion of solder in the case where solder is used to make interlayer connection can be prevented. Accordingly, a high reliability in interlayer connection between the upper circuit layer 303 and the lower circuit layer 304 can be established.

Further, since the formation of the circuit layer is followed by the interlayer connection between the upper circuit layer 303 and the lower circuit layer 304, the process has no effects on the circuit layer. Accordingly, the reduction of the thickness of the copper foil 311 makes it possible to exert an effect of fine circuit layer. Further, since the interlayer connection between the upper circuit layer 303 and the lower circuit layer 304 can be made by a very simple process involving the press-fitting of the substantially spherical conductor 307 and the solder ball 317, the number of required steps is less than other interlayer connection methods, providing excellent productivity and production cost.

Accordingly, in accordance with the method of producing a multi-layered FPC according to the present embodiment, a multi-layered FPC having a high reliability of connection between circuit layers which is most suitable for fineness of circuit layer can be prepared at a good productivity.

While the aforementioned description has been made with reference to the case where the formation of the solder connector 309 is accomplished by the press-fitting of the solder ball 317, a particulate solder material may be packed and fused in the through-hole 305 to form a solder connector which is then connected to the metal plug. In accordance with this producing method, the particulate solder material is fused and solidified once. Thus, a rigid alloy layer can be formed at the interface of the solder connector with the metal plug, making it possible to obtain a multi-layered FPC having a higher connection reliability. The method of forming the solder connector 309 can be properly selected depending on the conditions and should not be specifically limited.

While the method of producing a both-sided circuit board according to Embodiment 7 has been described with reference to the case where the copper foil 311 is formed directly on the both sides of the insulating layer 302, the following method of forming a both-sided circuit board may be used. In some detail, a copper foil 311 is formed directly on one side of the insulating layer 302. The copper foil 311 is then etched to form a circuit layer thereon. Two sheets of such one-sided circuit boards are then prepared. Subsequently, the two sheets of one-sided circuit boards are laminated on each other with an adhesive layer interposed therebetween with the circuit layer side thereof are disposed outside. In this manner, a both-sided circuit board formed by laminating two sheets of one-sided circuit boards as shown in FIG. 49 can be formed. In FIG. 49, the reference numeral 326 indicates a one-sided circuit board having an upper circuit layer 303 formed on one side of the insulating layer 302. The reference numeral 327 indicates another one-sided circuit board having a lower circuit layer 304 formed on one side of the insulating layer 302. The reference numeral 329 indicates a both-sided circuit board formed by laminating the one-sided circuit board 326 and the other one-sided circuit board 327 on each other with an adhesive layer 328 with the circuit layer thereof disposed outside. The upper circuit layer 303 and the lower circuit layer 304 are connected to each other via the conductor 306. A one-sided circuit board allows finer circuit layer than a both-sided circuit board. The both-sided circuit board obtained by laminating two sheets of one-sided circuit boards has finer circuit layers. The fine circuit layers on the one-sided circuit board will be described in detail in the following Embodiment 8.

In this producing method, a substantially spherical conductor 307 having a surface coat layer of solder material formed thereon may be used. In this case, the metal plug 308 is formed in the through-hole 305. Subsequently, the solder ball 317 is press-fitted into the through-hole 305 to form the solder connector 309. When the solder connector 309 is then heated and cooled, the solder material on the surface of the metal plug 308 and the solder connector 309 are fused and solidified, allowing firmer connection between the metal plug 308 and the solder connector 309 and making it possible to further enhance the reliability in interlayer connection.

Embodiment 8

Figure 50:
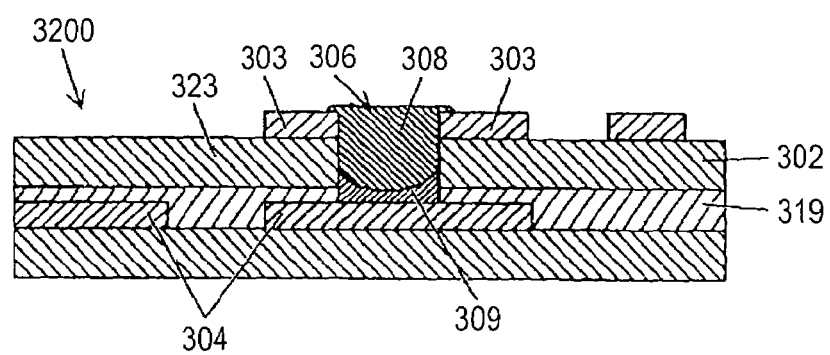
FIG. 50 is a sectional view of an essential part of a multi-layered FPC shown after interlayer connection according to an embodiment of implementation of the invention.
Figure 51:
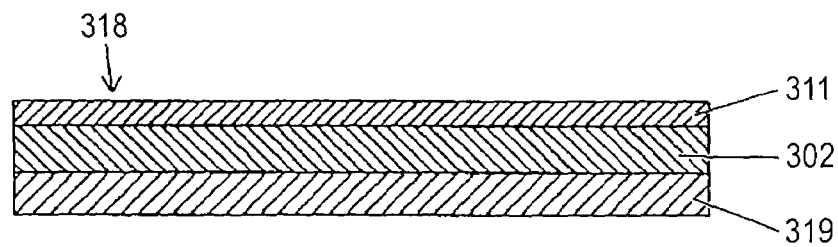
FIG. 51 is a sectional view of an essential part of a one-sided copper-clad laminated board with an adhesive layer which is a constituent element of a multi-layered FPC according to an embodiment of implementation of the invention.
Figure 52:
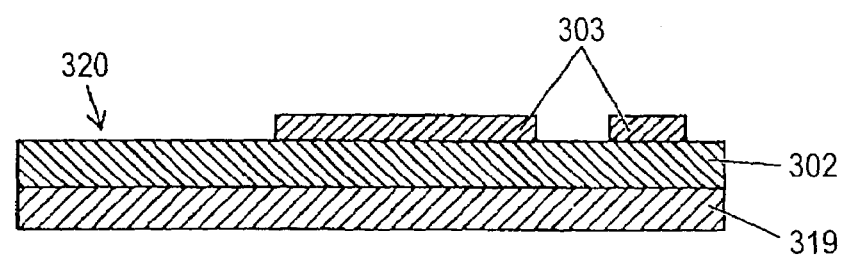
FIG. 52 is a sectional view of an essential part of a one-sided circuit board with an adhesive layer having a circuit layer according to an embodiment of implementation of the invention formed thereon.
Figure 53:
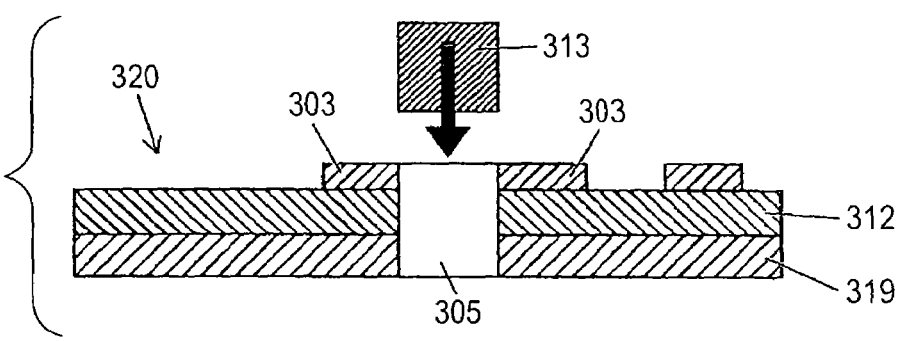
FIG. 53 is a sectional view of an essential part of a one-sided circuit board with an adhesive layer having a through-hole according to an embodiment of implementation of the invention formed therein.
Figure 54:
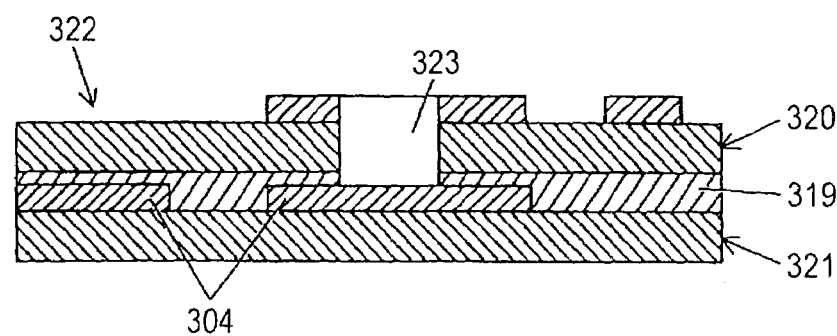
FIG. 54 is a sectional view of an essential part of a laminated circuit board having a blind via hole according to an embodiment of implementation of the invention formed therein.

Embodiment 8 will be described in detail hereinafter with reference to a method of producing a multi-layered FPC according to another embodiment of implementation of the invention excellent in reliability in connection between circuit layers and fine circuit layers in connection with FIGS. 50 to 54. FIG. 50 is a sectional view of an essential part of a multi-layered FPC shown after interlayer connection according to an embodiment of implementation of the invention. FIG. 51 is a sectional view of an essential part of a one-sided copper-clad laminated board with an adhesive layer which is a constituent element of a multi-layered FPC according to an embodiment of implementation of the invention. FIG. 52 is a sectional view of an essential part of a one-sided circuit board with an adhesive layer having a circuit layer according to an embodiment of implementation of the invention formed thereon. FIG. 53 is a sectional view of an essential part of a one-sided circuit board with an adhesive layer having a through-hole according to an embodiment of implementation of the invention formed therein. FIG. 54 is a sectional view of an essential part of a laminated circuit board having a blind via hole according to an embodiment of implementation of the invention formed therein.

In the aforementioned views, the reference numeral 3200 indicates a multi-layered FPC having the upper circuit layer 303 and the lower circuit layer 304 electrically connected to each other via the conductor 306. The reference numeral 318 indicates a one-sided copper-clad laminated board with an adhesive layer having a copper foil 311 formed on one side of the insulating layer 302 and an adhesive layer 319 formed on the other side thereof The reference numeral 320 indicates a one-sided circuit board with an adhesive layer having an upper circuit layer 303 formed by etching the one-sided copper-clad laminated board 318 with an adhesive layer. The reference numeral 321 indicates another one-sided circuit board having a lower circuit layer 304 to be laminated on the one-sided circuit board 320 with an adhesive layer. The reference numeral 322 indicates a laminated circuit board formed by laminating the one-sided circuit board 320 with an adhesive layer and the other one-sided circuit board 321 on each other in such an arrangement that a blind via hole 323 is formed for interlayer connection. A punching die 313 is used to form a through-hole 305.

In the multi-layered FPC 3200 according to the present embodiment, a conductor 306 press-fitted in the interior of the blind via hole 323 causes electrical interlayer connection between the upper circuit layer 303 and the lower circuit layer 304 as shown in FIG. 50. The conductor 306 is formed by a laminate of a metal plug 308 having a drastically smaller thermal expansion coefficient than that of the solder material formed by press-fitting one substantially spherical conductor 307 and a solder connector 309 made of solder material as in Embodiment 7. In this arrangement, the thermal expansion coefficient of the entire conductor 306 can be lowered to that of the insulating layer 302. In this manner, the exfoliation of the circuit layer and the solder on the surface of the insulating layer 302 off each other at the connection interface attributed to the thermal expansion of solder in the case where solder is used to make interlayer connection can be prevented. Accordingly, in the multi-layered FPC 3200 according to the present embodiment of implementation of the invention, too, the upper circuit layer 303 and the lower circuit layer 304 can be certainly electrically connected to each other via the conductor 306, making it possible to obtain a high reliability in interlayer connection between the upper circuit layer 303 and the lower circuit layer 304.

In the present embodiment of implementation of the invention, the conductor 306 for interlayer connection is press-fitted in the blind via hole 323 having a lower circuit layer 304 at the bottom thereof. In this arrangement, as compared with the arrangement such that the conductor 306 for interlayer connection is press-fitted in the through-hole, the connection area between the conductor 306 and the circuit layer can be raised. The bonding strength between the two layers, too, can be raised. Accordingly, in the multi-layered FPC 3200, even when given various external stresses, the circuit layer and the conductor 306 can be prevented from being peeled off each other at the connection interface, making it possible to realize a multi-layered FPC 3200 having a higher connection reliability.

Further, the use a soft metal, particularly at least one of copper and copper alloy, as the metal plug 308 (substantially spherical conductor 307), in the same way as in Embodiment 7, makes it possible to obtain a higher reliability in interlayer connection between the upper circuit layer 303 and the lower circuit layer 304. This is because copper and copper alloy match most fairly with the substrate (insulating layer) in thermal expansion coefficient.

A method of the multi-layered FPC 200 according to Embodiment 8 that can realize such a high connection reliability will be described in detail in connection with the attached drawings.

Firstly, a one-sided copper-clad laminated board 318 with an adhesive sheet having a copper foil 311 formed directly on one side of an insulating layer 302 and an adhesive layer 319 formed on the other side thereof as shown in FIG. 51 is prepared. While the present embodiment has been described with reference to the one-sided copper-clad laminated board 318 free of adhesive layer between the insulating layer 302 and the copper foil 311 by way of example, the invention is not limited thereto. A one-sided copper-clad laminated board having an adhesive layer interposed between the insulating layer 302 and the copper foil 311 or a one-sided copper-clad laminated board having more layers may be used. The layer configuration may be properly changed.

Subsequently, a mask material is formed on the surface of the copper foil 311 according to a circuit pattern. The copper foil 311 is then etched with an etching solution such as ferric chloride and copper chloride to obtain a one-sided circuit board 320 with an adhesive layer having an upper circuit layer 303 formed thereon as shown in FIG. 52. In the present embodiment, unlike the case where the circuit layer on the aforementioned both-sided circuit board is formed, one-sided etching suitable for fineness can be effected, making it possible to pattern the upper circuit layer 303 more finely. Accordingly, the upper circuit layer 303 of the one-sided circuit board 320 with an adhesive layer obtained in the present embodiment can be patterned more finely than the circuit layer of the aforementioned both-sided circuit board.

The reason for this mechanism will be described hereinafter. Since the formation of a circuit layer on both-sided circuit board normally requires that the copper foil on the both sides of a both-sided copper-clad laminated board be etched at the same time, it is necessary that the etching solution be uniformly applied to the both-sided copper-clad laminated board on both the upper and lower sides thereof However, when the etching solution is pressure-sprayed onto the both-sided copper-clad laminated board on both the upper and lower sides thereof, the etching solution sprayed onto the upper side of the both-sided copper-clad laminated board then forms a liquid stagnant that makes it impossible to keep the desired etching uniformity. Thus, the conditions under which the both-sided circuit board is etched are uneven and unstable, making it difficult possible to form a very fine circuit layer.

On the other hand, the formation of a circuit layer on the one-sided circuit board requires that the etching solution be sprayed onto the one-sided copper-clad laminated board (copper foil is formed on the lower side of the one-sided circuit board) only on the lower side thereof Thus, the etching solution forms no liquid stagnant. Accordingly, the etching conditions can be predetermined to fall within an optimum range. Therefore, the method of forming a circuit layer on the one-sided circuit board according to the present embodiment is suitable for the fine circuit layer.

Subsequently, the one-sided circuit board 320 with an adhesive layer having an upper circuit layer 303 formed thereon is punched using a punching die 313 to form a through-hole 305 as shown in FIG. 53. Subsequently, as shown in FIG. 54, the one-sided circuit board 320 with an adhesive layer having a through-hole 305 formed therein and the other one-sided circuit board 321 having a lower circuit layer 304 formed thereon are laminated on each other with the adhesive layer 319 interposed therebetween with the lower circuit layer 304 and the adhesive layer 319 opposed to each other to obtain a laminated circuit board 322 having a blind via hole 323 formed therein for interlayer connection.

The other one-sided circuit board 321 having a lower circuit layer 304 formed thereon, too, can be sprayed with the etching solution on the lower side of the one-sided copper-clad laminated board (copper foil is formed on the lower side of the one-sided circuit board) to form a lower circuit layer 304 similarly to the one-sided circuit board 320 with an adhesive layer having an upper circuit layer 303 formed thereon. In other words, the lower circuit layer 304 is finely patterned similarly to the upper circuit layer 303. Accordingly, the multi-layered circuit board 322 thus obtained comprises one-sided circuit boards having fine circuit layers laminated on each other. Therefore, the circuit layers on the multi-layered circuit board are more finely patterned than the circuit layers on the aforementioned both-sided circuit board.

Finally, the interior of the blind via hole 323 is previously filled with a solder ball made of solder material or a particulate solder. One substantially spherical conductor is then pressed onto the solder ball or particulate solder in the blind via hole 323 to form a conductor 306 formed by a laminate of a solder connector 309 formed by a solder ball or particulate solder and a metal plug 308 formed by a substantially spherical conductor. In this manner, a multi-layered FPC 3200 excellent in fineness of circuit layers having the upper circuit layer 303 and the lower circuit layer 304 electrically conducted to each other with the conductor 306 can be obtained as shown in FIG. 50.

In the method of producing a multi-layered FPC according to the present embodiment, the conductor 306 for interlayer connection is press-fitted into the blind via hole 323 having a lower circuit layer 304 at the bottom thereof In this arrangement, as compared with the arrangement such that the conductor 306 for interlayer connection is press-fitted in the through-hole, the connection area of the conductor 306 with the circuit layer can be raised. The bonding strength between the two layers, too, can be raised. Accordingly, even when given various external stresses, the circuit layer and the conductor 306 can be prevented from being peeled off each other at the connection interface, making it possible to obtain a higher connection reliability.

In accordance with the aforementioned method of producing a multi-layered FPC according to the present embodiment of implementation of the invention, one-sided circuit boards are laminated on each other, making it possible to pattern the circuit layer more finely than in the case where a both-sided circuit board is used. Further, since the conductor 306 formed by press-fitting a solder ball and a substantially spherical conductor is press-fitted into the blind via hole 323, a higher reliability in connection between circuit layers can be obtained than in the case where the conductor 306 formed by press-fitting a solder ball and a substantially spherical conductor is press-fitted into the through-hole 305. Accordingly, in the present embodiment, too, a multi-layered FPC having a high reliability of connection between circuit layers which is most suitable for fineness of circuit layer can be prepared at a good productivity.

In this producing method, a substantially spherical conductor coated with a solder material on the surface thereof can be used. In this case, the formation of a conductor 306 formed by a laminate of a solder connector 309 formed by a solder ball or particulate solder and a metal plug 308 formed by the substantially spherical conductor is followed by heating and cooling as mentioned above. In this manner, the solder material on the surface of the metal plug 308 and the solder connector 309 are fused and solidified, allowing firmer bonding between the metal plug 308 and the solder connector 309 and making it possible to further enhance the reliability in interlayer connection.

Embodiment 9

Figure 55:
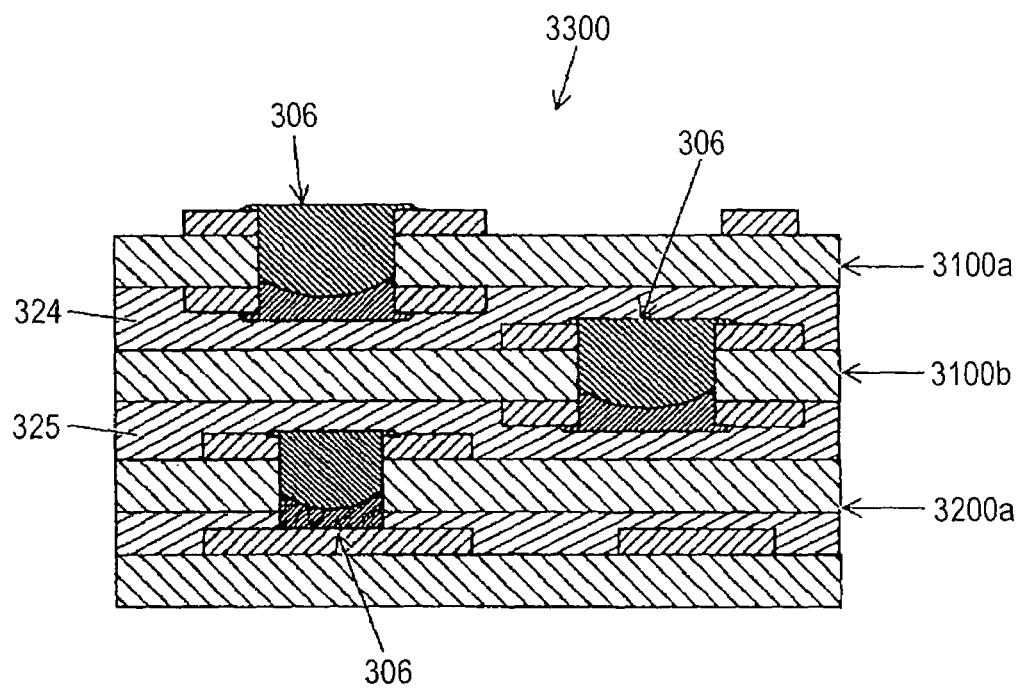
FIG. 55 is a sectional view of an essential part of a multi-layered FPC which has been finished in lamination according to an embodiment of implementation of the invention.
Figure 56:
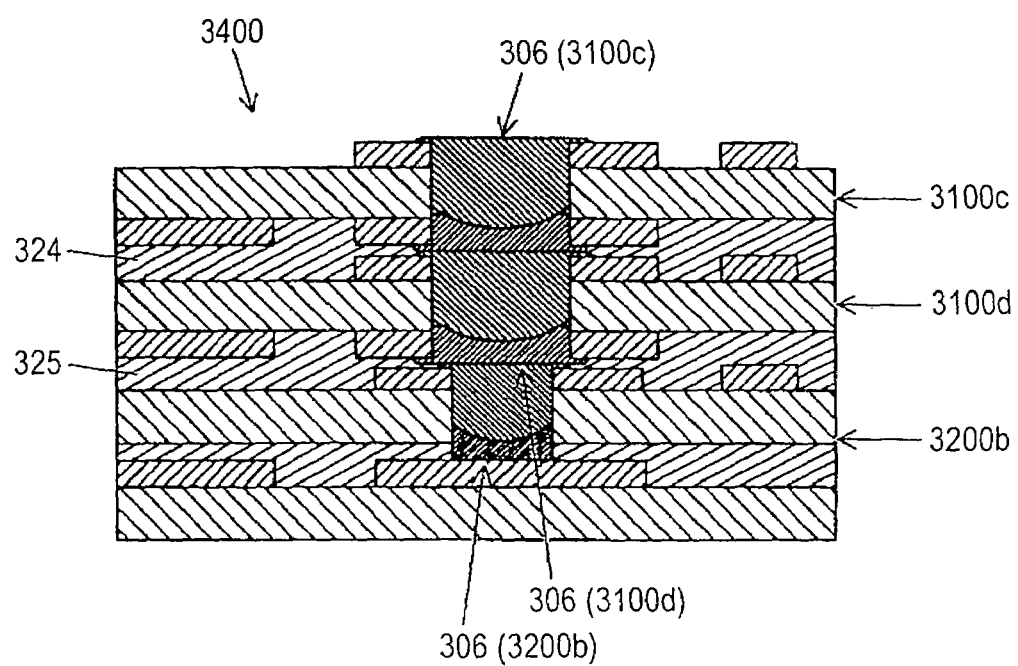
FIG. 56 is a sectional view of an essential part of another multi-layered FPC which has been finished in lamination according to an embodiment of implementation of the invention.

Embodiment 9 will be described hereinafter with reference to a multi-layered FPC according to the invention obtained by further laminating the aforementioned multi-layered FPC. FIG. 55 is a sectional view of an essential part of a multi-layered FPC which has been finished in lamination according to an embodiment of implementation of the invention. FIG. 56 is a sectional view of an essential part of another multi-layered FPC which has been finished in lamination according to an embodiment of implementation of the invention.

In FIG. 55, the reference numeral 3300 indicates a multi-layered FPC obtained by laminating the multi-layered FPC 3100a and 3100b produced in Embodiment 7 above and the multi-layered FPC 3200a produced in Embodiment 8 above on each other with adhesive layers 324 and 325 interposed therebetween, respectively. In the multi-layered FPC 3300, the multi-layered FPC 3100a and 3100b and the multi-layered FPC 3200a, which are constituent members of the multi-layered FPC 3300, have fine circuit layers with a high reliability in connection therebetween. Accordingly, even the multi-layered FPC 3300, which comprises more circuit layers than in Embodiments 7 and 8, provides the multi-layered FPC having a high reliability in interlayer connection as well as an excellent fineness in circuit layer.

In order to prepare the aforementioned multi-layered FPC 3300, the two multi-layered FPC 3100a and 3100b produced in Embodiment 7 above are laminated on and bonded to each other with an adhesive layer 324 interposed therebetween. Subsequently, when the laminate is heated and cooled with the conductor 306 on the two multi-layered FPC in contact with each other, the solder connector 309 on the surface of the conductor 306 is then fused and solidified to cause the conductor 306 and the circuit layer to be easily connected to each other.

Subsequently, the multi-layered FPC having two multi-layered FPC 3100a and 3100b laminated on each other and the multi-layered FPC 3200a produced in Embodiment 8 above are laminated on and bonded to each other with an adhesive layer 325 interposed therebetween. Subsequently, when the laminate is heated and cooled with the conductors 306 in contact with each other, the solder connector 309 on the surface of the conductor 306 is fused and solidified to cause the conductor 306 and the circuit layer to be easily connected to each other. In this manner, a multi-layered FPC 3300 having more circuit layers can be obtained. The method of producing a multi-layered FPC 3100a and 3100b and the multi-layered FPC 3200a are the same as mentioned above and thus will not be described in detail. Further, the lamination of the multi-layered FPC 3100a may be effected after the lamination of the multi-layered FPC 3100b and the multi-layered FPC 3200a on each other.

In FIG. 56, the reference numeral 3400 indicates a multi-layered FPC obtained by laminating the two multi-layered FPC 3100c and 3100d produced in Embodiment 7 above and the multi-layered FPC 3200b produced in Embodiment 8 above on each other with adhesive layers 324 and 325 interposed therebetween, respectively, in such an arrangement that the conductor 306 on the these multi-layered FPC come in contact with each other. In the multi-layered FPC 3400, the multi-layered FPC 3100c and 3100d and the multi-layered FPC 3200b, which are constituent members of the multi-layered FPC 3400, have fine circuit layers with a high reliability in connection therebetween. Accordingly, even the multi-layered FPC 3400, which comprises more circuit layers than in Embodiments 7 and 8, provides the multi-layered FPC having a high reliability in interlayer connection as well as an excellent fineness in circuit layer. Further, since the surface of the conductor 306 is the metal plug 308 or solder connector 309, the various adjacent circuit layers can be electrically connected to each other in the multi-layered FPC 3100c and 3100d and the multi-layered FPC 3200b.

In order to prepare the aforementioned multi-layered FPC 3400, the two multi-layered FPC 3100c and 3100d produced in Embodiment 7 are laminated on and bonded to each other with an adhesive layer 324 with the conductors 306 (for 3100c) and 306 (for 3100d) in contact with each other. When the laminate is then heated and cooled with the conductors 306 in contact with each other, the solder connector 309 on the surface of the conductor 306 is fused and solidified to cause the conductors 306 to be easily connected to each other.

Subsequently, the multi-layered FPC comprising the two multi-layered FPC 3100c and 3100d laminated on each other and the multi-layered FPC 3200b produced in Embodiment 8 above are laminated on and bonded to each other with an adhesive layer 325 in such an arrangement that the conductor 306 (3100d) for the multi-layered FPC 3100d and the conductor 306 (3200b) for the multi-layered FPC 3200b come in contact with each other. Subsequently, when the laminate is heated and cooled with the conductors 306 in contact with each other, the solder connector 309 on the surface of the conductor 306 is fused and solidified to cause the conductors 306 to be easily connected to each other. In this manner, a multi-layered FPC 3400 having more circuit layers can be obtained. Further, since the surface of the conductor 306 is the metal plug 308 or solder connector 309, the various adjacent circuit layers can be electrically connected to each other in the multi-layered FPC 3100c and 3100d and the multi-layered FPC 3200b.

The method of producing the multi-layered FPC 3100c and 3100d and multi-layered FPC 3200b are the same as mentioned above and will not be described in detail. The lamination of the multi-layered FPC 3100c may be effected after the lamination of the multi-layered FPC 3100d and the multi-layered FPC 3200b.

The multi-layered FPC 300 and 400 according to the present embodiment thus obtained are formed by further laminating multi-layered FPC having fine circuit layers connected to each other with a high reliability and thus provide a high reliability in interlayer connection and an excellent fineness in circuit layers. Since the interlayer connection of multi-layered FPC, too, is carried out by the use of the aforementioned conductor, the interlayer connection material doesn't need to be newly used, making it possible to obtain a higher productivity. Accordingly, the present embodiment, too, can provide a multi-layered FPC having a high reliability in interlayer connection which is most suitable for fineness of circuit layers at a high productivity.

Embodiment 10

Figure 57:
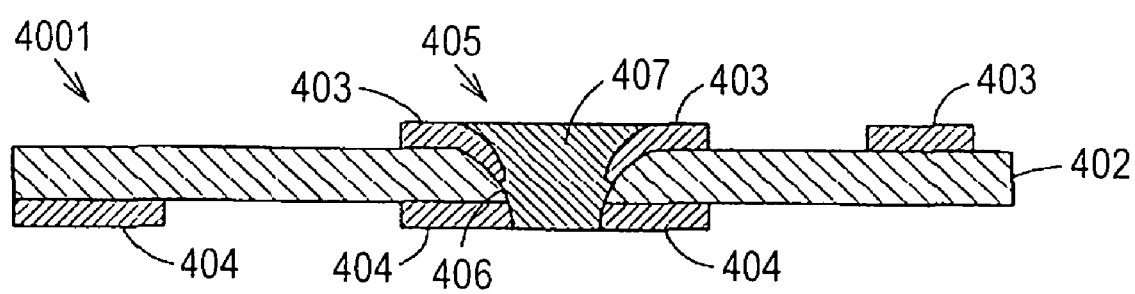
FIG. 57 is a side sectional view of an essential part of a flexible print circuit board according to Embodiment 1.

FIG. 57 is a side sectional view of an essential part of a flexible print circuit board according to Embodiment 10.

In FIG. 57, the reference numeral 4001 indicates a flexible print circuit board according to Embodiment 10. The reference numeral 402 indicates an insulating layer made of polyimide film. The reference numeral 403 indicates an upper electrically-conductive layer having a predetermined conductor pattern formed thereon by etching a copper foil stuck to the upper side of the insulating layer 402. The reference numeral 404 indicates a lower electrically-conductive layer having a predetermined conductor pattern formed thereon by etching a copper foil stuck to the lower side of the insulating layer 402. The reference numeral 405 indicates an interlayer connection portion electrically connecting between the upper electrically-conductive layer 403 and the lower electrically-conductive layer 404. The reference numeral 406 indicates a cone-shaped conductor press-fit hole for the interlayer connection portion 405 formed in the upper electrically-conductive layer 403, the insulating layer 402 and the lower electrically-conductive layer 404 and opened wider towards the upper electrically-conductive layer 403. The reference numeral 407 indicates a conductor at the interlayer connection portion 405 which is adapted to be press-fitted into the conductor press-fit hole 406 to electrically connect between the upper side of the upper electrically-conductive layer 403 and the surface of the upper electrically-conductive layer 403 on the conductor press-fit hole 406 side thereof and the surface of the lower electrically-conductive layer 404 on the conductor press-fit hole 406 side thereof A method of producing the flexible print circuit board 4001 according to Embodiment 10 having the aforementioned constitution will be described hereinafter in connection with the attached drawings.

FIG. 58A is a sectional view of an essential part of a both-sided copper-clad laminated board to be used in the production of a flexible print circuit board according to Embodiment 1. FIG. 58B is a side sectional view of an essential part illustrating a both-sided circuit board. FIG. 58C is a side sectional view illustrating a conductor press-fit hole forming step. FIG. 58D is a side sectional view of an essential part illustrating a conductor press-fitting step. FIG. 58E is a side sectional view of an essential part illustrating how the conductor is press-fitted into the conductor press-fit hole.

Figure 58:
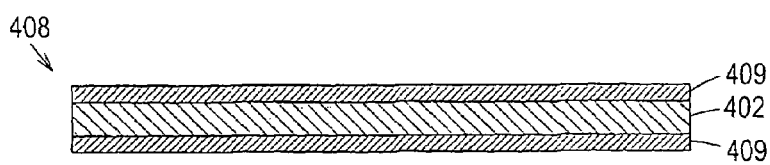
FIG. 58($a$) is a sectional view of an essential part of a both-sided copper-clad laminated board to be used in the production of a flexible print circuit board according to Embodiment 1.
Figure 58:
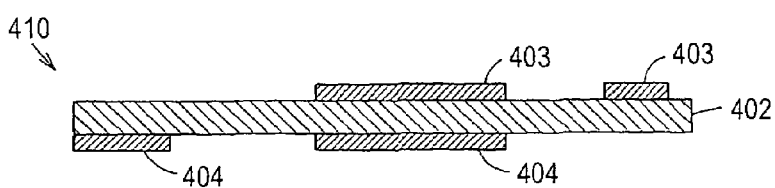
Figure 58:
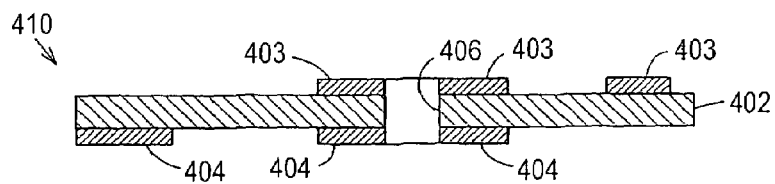
Figure 58:
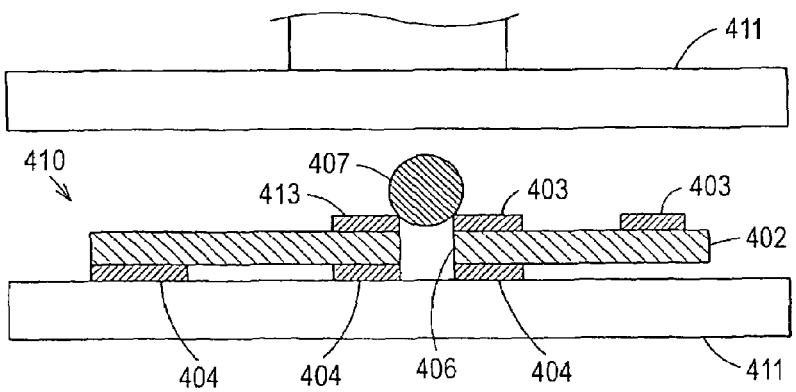
Figure 58:
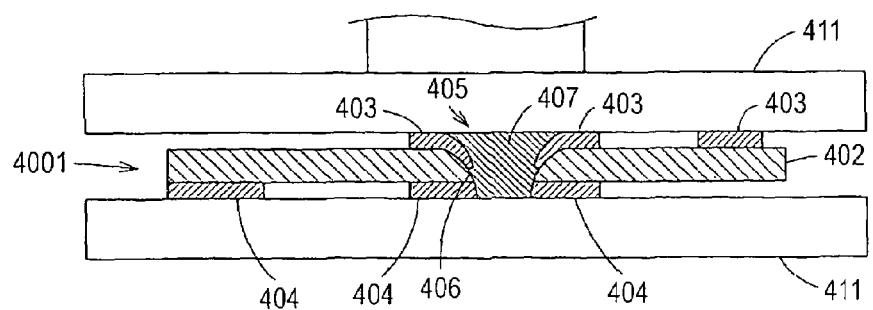

In FIG. 58, the reference numeral 408 indicates a both-sided copper-clad laminated board. The reference numeral 409 indicates a copper stuck to the both sides of the insulating layer 402. The reference numeral 410 indicates a both-sided circuit board having an upper electrically-conductive layer 403 and a lower electrically-conductive layer 404 formed by etching the copper foil 409 such that a predetermined conductor pattern is formed. The reference numeral 411 indicates a pressing portion for press-fitting the conductor 407 into the conductor press-fit hole 406 of the both-sided circuit board 410.

Firstly, as shown in FIG. 58A, a both-sided copper-clad laminated board 408 having a copper foil 409 stuck to the both sides of an insulating layer 402 is prepared. As the copper foil 409 there may be used electrolytic copper foil or rolled copper foil. While Embodiment 10 has been described with reference to the case where the both-sided copper-clad laminated board 408 having the copper foil 409 stuck to the insulating layer 402 without any adhesive is used, the invention is not limited thereto. The copper foil 409 may be bonded to the insulating layer 402 with an adhesive made of a synthetic resin such as epoxy-based and acrylic resins.

Subsequently, as shown in FIG. 58B, an etching resist (not shown) having a predetermined shape is formed on the surface of the copper foil 409 stuck to the upper and lower sides of the insulating layer 402. The copper foil 409 is then etched with an etching solution such as ferric chloride solution and cupric chloride solution. The etching resist is then removed to obtain a both-sided circuit board 410 having an upper electrically-conductive layer 403 and a lower electrically-conductive layer 404 formed thereon.

Subsequently, as shown in FIG. 58C, using a punching die, NC drill machine, laser machining tool or the like, a conductor press-fit hole 406 is formed extending through the upper electrically-conductive layer 403, the insulating layer 402 and the lower electrically-conductive layer 404 (conductor press-fit hole forming step).

Subsequently, as shown in FIG. 58D, a conductor 407 in the form of substantial sphere is press-fitted into the conductor press-fit hole 406 of the both-sided laminated board 410 by the pressing portion 411 (conductor press-fitting step).

The conductor 407 is formed by solder, copper alloy or the like. The maximum diameter of the conductor 407 is from not smaller than 1.1 times to not greater than 1.8 times the diameter of the conductor press-fit hole 406. Referring to the reason for this limitation, it was found that as the maximum diameter of the conductor 407 decreases from 1.1 times the diameter of the conductor press-fit hole 406, it becomes more difficult for the conductor 407 to fill the interior of the interlayer connection portion compactly and deform the conductor press-fit hole 406 to cone shape. On the contrary, as the maximum diameter of the conductor 407 increases from 1.8 times the diameter of the conductor press-fit hole 406, it becomes more difficult for the conductor 407 to be press-fitted into the conductor press-fit hole 406. Further, the interlayer connection portion 405 thus formed by press-fitting is raised on the wider end thereof, making it difficult to laminate another flexible print circuit board thereon. The conductor 407 thus formed is then press-fitted into the conductor press-fit hole 406 of the both-sided circuit board 410 by the pressing portion 411 to form a cone-shaped interlayer connection portion 405 as shown in FIG. 58E.

The flexible print circuit board 4001 according to Embodiment 10 and its producing method have the aforementioned constitution and thus have the following advantages.

(1) Since the interlayer connection portion 405 comprises the conductor 407 electrically connecting between the upper side of the upper electrically-conductive layer 403 and the surface of the upper electrically-conductive layer 403 on the conductor press-fit hole 406 side thereof and the surface of the lower electrically-conductive layer 404 on the conductor press-fit hole 406 side thereof, the contact area of the interlayer connection portion 405 with the upper electrically-conductive layer 403 is so great as to enhance the reliability in electrical connection.

(2) Since the interlayer connection portion 405 is in the form of cone, the stress in the thickness direction due to thermal expansion can be relaxed, making it possible to prevent the exfoliation at the connection interface due to heating.

(3) Since the conductor 407 is formed by solder, copper alloy or the like, the ductility of such a metal makes it easy for the conductor 407 to be deformed into cone. It is thus assured that the conductor 407 can come in close contact with the upper electrically-conductive layer 403 and the lower electrically-conductive layer 404 to connect between the two electrically-conductive layers. At the same time, the conductor 407 formed by such a metal can be difficultly oxidized and thus can enhance the reliability in electrical connection.

(4) Since the interlayer connection portion 405 is formed after the etching of the upper and lower copper foils 409 on the insulating layer 402 resulting in the formation of the upper electrically-conductive layer 403 and the lower electrically-conductive layer 404, the interlayer connection doesn't cause the rise of the thickness of the upper electrically-conductive layer 403 and the lower electrically-conductive layer 404 unlike related art plated through-hole method, allowing finer conductor pattern and hence providing higher circuit density.

(5) Since the interlayer connection portion 405 can be formed merely by forming a conductor press-fit hole 406 and then press-fitting the conductor 407 into the conductor press-fit hole 406, a flexible print circuit board having a high reliability in electrical connection can be produced by a simple method involving a few steps.

(6) Since the maximum diameter of the substantially spherical conductor 407 is from not smaller than 1.1 times to not greater than 1.8 times the diameter of the conductor press-fit hole 406, the press-fitting of the conductor 407 makes it possible to deform the conductor press-fit hole 406 into cone and fill the interior of the interlayer connection portion 405 compactly. At the same time, it is not likely that the surface of the interlayer connection portion thus formed by press-fitting can be raised on the wider end thereof, making it possible to laminate another flexible print circuit board thereon. Further, the resulting self-alignment action makes it easy to position the conductor 407 at the center of the conductor press-fit hole 406.

Embodiment 11

Figure 59:
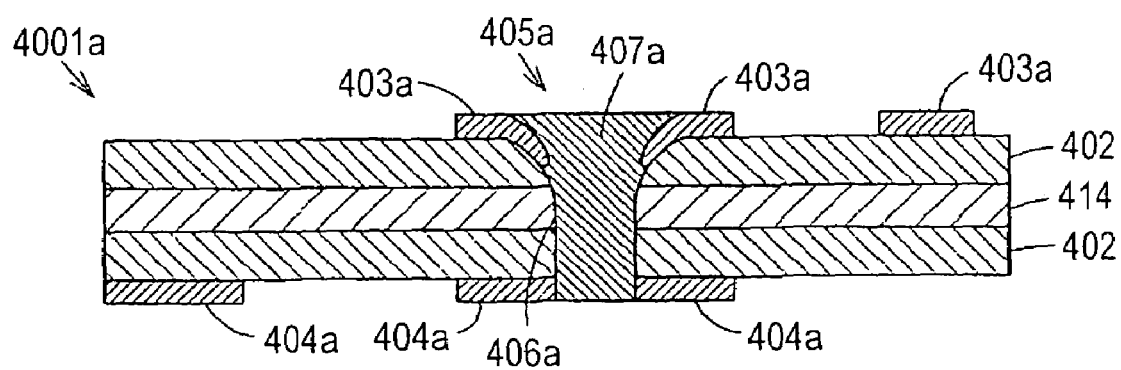
FIG. 59 is a side sectional view of an essential part of a flexible print circuit board according to Embodiment 2.

FIG. 59 is a side sectional view of an essential part of a flexible print circuit board according to Embodiment 11.

In FIG. 59, the flexible print circuit board 4001a according to Embodiment 11 differs from the flexible print circuit board 4001 according to Embodiment 10 in that the insulating layer 402 having the upper electrically-conductive layer 403a formed thereon and the insulating layer 402 having the lower electrically-conductive layer 404a formed thereon are laminated on each other with an adhesive layer 414 with the insulating layers 402 opposed to each other and the conductor 407a is press-fitted in the cone-shaped conductor press-fit hole 406a formed in the interlayer connection portion 405a extending between the upper electrically-conductive layer 403a and the lower electrically-conductive layer 404a.

A method of producing the flexible print circuit board 4001a according to Embodiment 11 having the aforementioned constitution will be described hereinafter in connection with the attached drawings.

FIG. 60A is a side sectional view of an essential part of a one-sided copper-clad laminated board to be used in the production of the flexible print circuit board according to Embodiment 2. FIG. 60B is a side sectional view of an essential part illustrating a both-sided circuit board forming step. FIG. 60C is a side sectional view of an essential part illustrating a both-sided circuit board.

Figure 60:
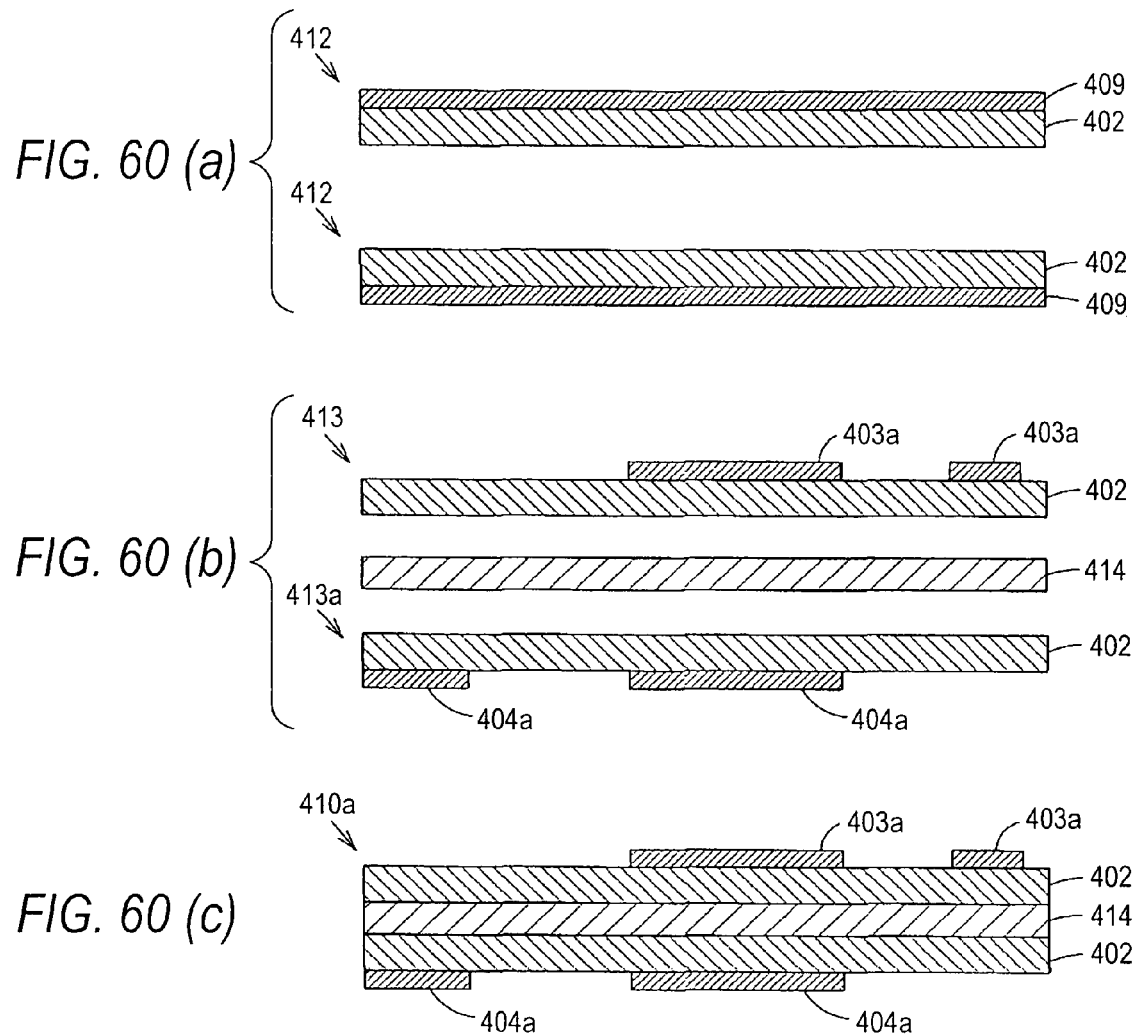
FIG. 60(*a*) is a side sectional view of an essential part of a one-sided copper-clad laminated board to be used in the production of the flexible print circuit board according to Embodiment 2.

In FIG. 60, the reference numeral 412 indicates a one-sided copper-clad laminated board. The reference numeral 413 and 413a each indicate a one-sided circuit board having an upper electrically-conductive layer 403a and a lower electrically-conductive layer 404a formed thereon by etching the copper foil 409 on the one-sided copper-clad laminated board 412 so that a predetermined conductor pattern is formed. The reference numeral 414 indicates an adhesive layer with which the one-sided circuit boards 413 and 413a are bonded to each other with the insulating layers 402 opposed to each other.

Firstly, as shown in FIG. 60A, two sheets of one-sided copper-clad laminated boards 412 having a copper foil 409 formed on one side of an insulating layer 402 are prepared.

Subsequently, as shown in FIG. 60B, one-sided circuit boards 413 and 413a having an upper electrically-conductive layer 403a and a lower electrically-conductive layer 404a formed thereon by etching in the same manner as in Embodiment 10, respectively, are laminated on each other with an adhesive layer 414 with the insulating layers 402 opposed to each other (both-sided circuit board forming step). In this manner, a both-sided circuit board 410a as shown in FIG. 60C can be obtained. In general, a one-sided circuit board allows finer conductor pattern than a both-sided circuit board. This is because the formation of a conductor pattern on a one-sided circuit board is accomplished merely by spraying the etching solution onto the one-sided circuit board only on the lower side thereof, causing no stagnation of the etching solution and allowing optimization of the etching conditions.

Subsequently, the both-sided circuit board 410a is subjected to conductor press-fit hole forming step and conductor press-fitting step described in Embodiment 10 to obtain a flexible print circuit board 401a.

The flexible print circuit board 401a according to Embodiment 11 and its producing method have the aforementioned constitution and thus have the following advantage in addition to the advantages of Embodiment 10.

(1) Since the one-sided circuit boards 413 and 413a allowing fine conductor pattern are laminated on each other with the insulating layers 402 opposed to each other to form the both-sided circuit board 410a, the flexible print circuit board 4001a can be obtained by a simple method involving a few steps.

Embodiment 12

Figure 61:
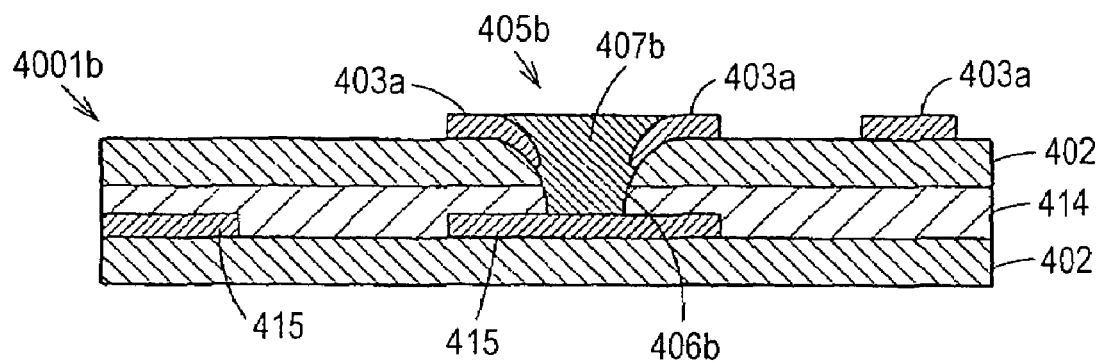
FIG. 61 is a sectional view of an essential part of a flexible print circuit board according to Embodiment 3.

FIG. 61 is a sectional view of an essential part of a flexible print circuit board according to Embodiment 12.

In FIG. 61, the flexible print circuit board 4001b according to Embodiment 12 differs from the flexible print circuit board 4001a according to Embodiment 11 in that the insulating layer 402 having an upper electrically-conductive layer 403a formed thereon and the insulating layer 402 having an inner electrically-conductive layer 415 are laminated on each other with an adhesive layer 414 in such an arrangement that the former insulating layer 402 is opposed to the inner electrically-conductive layer 415, the cone-shaped conductor press-fit hole 406b is formed in the interlayer connection portion 405b extending between the upper electrically-conductive layer 403a and the inner electrically-conductive layer 415 and the conductor 407b press-fitted in the conductor press-fit hole 406b of the interlayer connection portion 405b electrically connects between the upper side of the upper electrically-conductive layer 403 a and the side surface of the upper electrically-conductive layer 403a on the conductor press-fit hole 406b side thereof and the surface of the inner electrically-conductive layer 415.

A method of producing the flexible print circuit board 4001b according to Embodiment 12 having the aforementioned constitution will be described hereinafter in connection with the attached drawings.

FIG. 62A is a side sectional view of an essential part illustrating an adhesive layer forming step. FIG. 62B is a side sectional view of an essential part illustrating a conductor press-fit hole forming step. FIG. 62C is a side sectional view of an essential part illustrating a one-sided circuit board sticking step. FIG. 62D is a side sectional view of an essential part illustrating a conductor press-fitting step. FIG. 62E is a side sectional view of an essential part illustrating how the conductor is press-fitted into the conductor press-fit hole.

Figure 62:
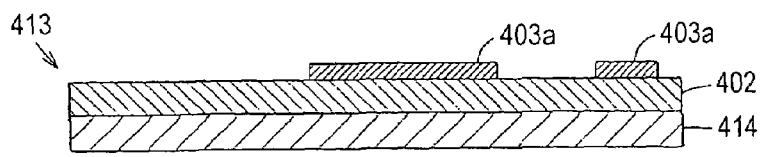
FIG. 62(*a*) is a side sectional view of an essential part illustrating an adhesive layer forming step.
Figure 62:
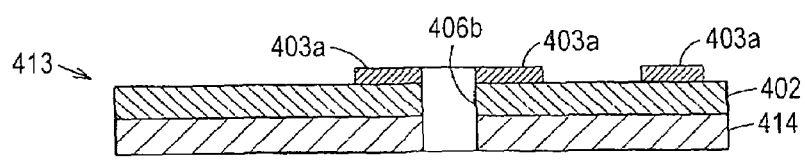
Figure 62:
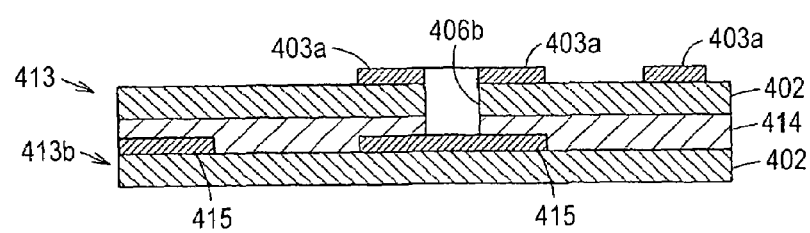
Figure 62:
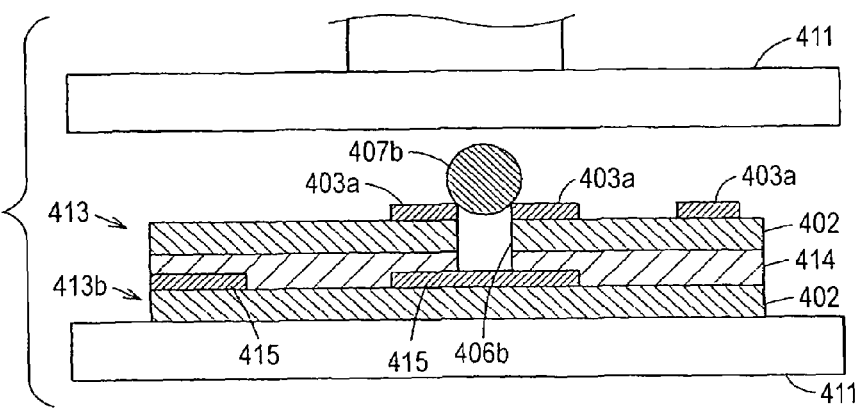
Figure 62:
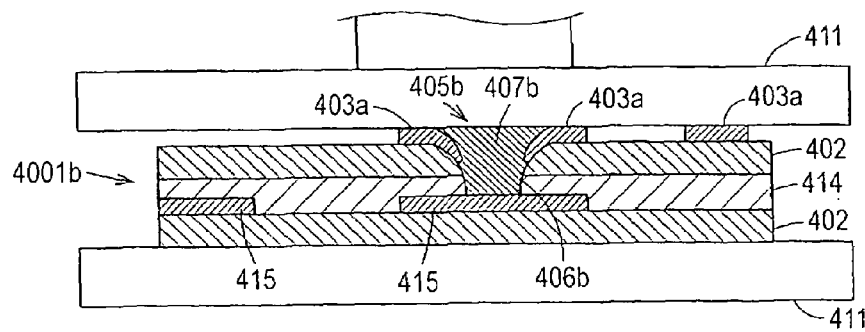

In FIG. 62, the reference numeral 406b indicates a conductor press-fit hole extending through the one-sided circuit board 413 and the adhesive layer 414.

Firstly, as shown in FIG. 62A, the adhesive layer 414 is formed on the surface of the one-sided circuit board 413 on the insulating layer side thereof (adhesive layer forming step).

Subsequently, as shown in FIG. 62B, using a punching die, NC drill machine, laser machining tool (not shown) or the like, a conductor press-fit hole 406 is formed extending through the upper electrically-conductive layer 403a and the adhesive layer 414 (conductor press-fit hole forming step).

Subsequently, as shown in FIG. 62C, on the one-sided circuit board 413 is laminated the other one-sided circuit board 413b on the inner electrically-conductive layer 415 side thereof with the adhesive layer 414 (one-sided circuit board laminating step).

Subsequently, as shown in FIG. 62D, a conductor 407b in the form of substantial sphere is press-fitted into the conductor press-fit hole 406b by the pressing portion 411 (conductor press-fitting step). By the conductor 407b being press-fitted into the conductor press-fit hole 40b by the pressing portion 411, a cone-shaped interlayer connection portion 405b is formed as shown in FIG. 62E.

The flexible print circuit board 4001b according to Embodiment 12 and its producing method have aforementioned constitution and thus have the following advantage in addition to the advantages of Embodiment 1 or 11.

(1) Since the one-sided circuit boards 413 and 413b are laminated on each other with the adhesive layer 414 and the conductor 407b is press-fitted into the conductor press-fit hole 406b to form the interlayer connection portion 405b, the upper side of the upper electrically-conductive layer 403a and the side surface of the upper electrically-conductive layer 403a on the conductor press-fit hole 406b side thereof and the surface of the inner electrically-conductive layer 415 can be electrically connected to each other, making it possible to raise the contact area thereof and enhance the reliability in electrical connection. Further, the flexible print circuit board 4001b having circuits formed at a high density can be obtained by a simple method involving a few steps, making it possible to attain the enhancement of circuit density and productivity at the same time.

Embodiment 13

FIG. 63A is a side sectional view of an essential part of a multi-layered flexible print circuit board according to Embodiment 4. FIG. 63B is a side sectional view of an essential part illustrating a modification of the multi-layered flexible print circuit board.

Figure 63:
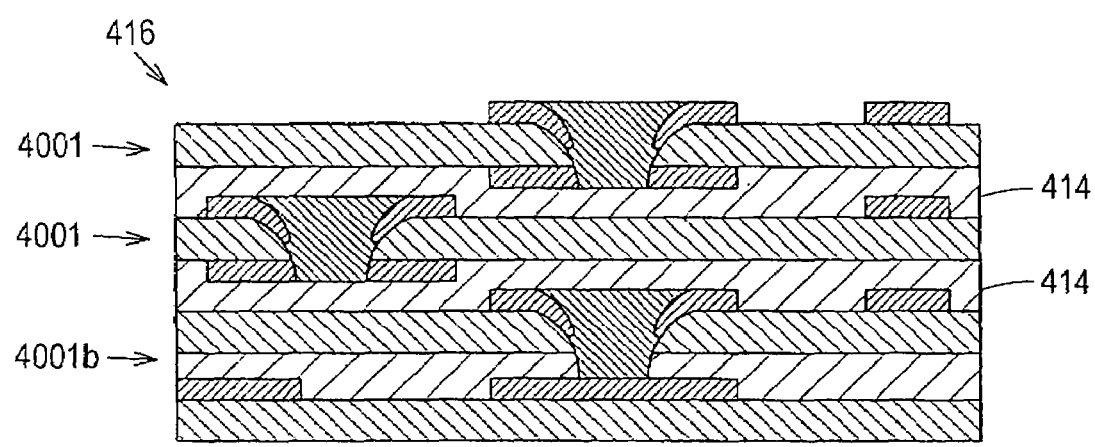
FIG. 63(*a*) is a side sectional view of an essential part of a multi-layered flexible print circuit board according to Embodiment 4.
Figure 63:
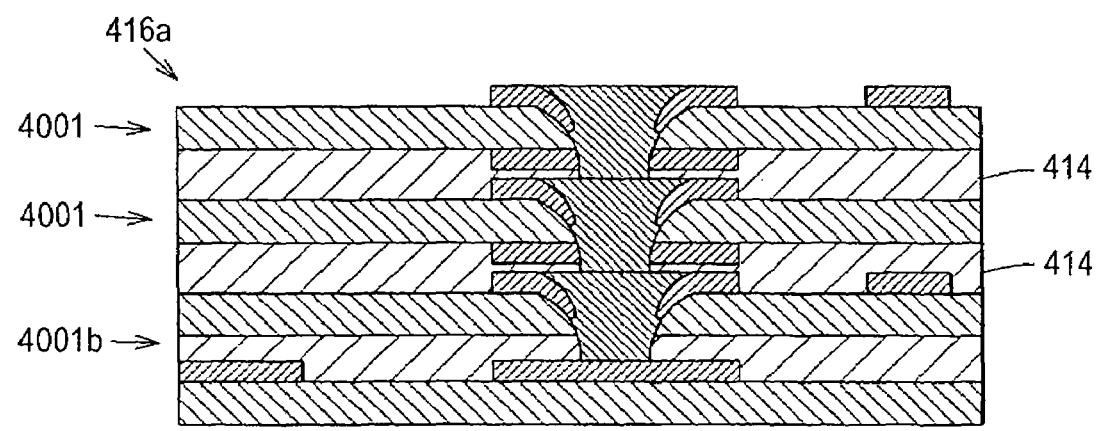

In FIG. 63, the reference numeral 416 indicates a multi-layered flexible print circuit board according to Embodiment 13. The reference numeral 416a indicates a modification of the multi-layered flexible print circuit board 416 as a modification of Embodiment 13.

A method of producing the multi-layered flexible print circuit board 416 according to Embodiment 13 will be described hereinafter.

Two sheets of the flexible print circuit boards 4001 according to Embodiment 10 and the flexible print circuit board 4001b according to Embodiment 12 are laminated on each other with an adhesive layer 414, respectively (bonding/laminating step). In this manner, the multi-layered flexible print circuit board 416 can be obtained. By changing the position of lamination of these boards, the multi-layered flexible print circuit board 416a can be obtained.

The multi-layered flexible print circuit board 416 according to Embodiment 13 and its producing method have the aforementioned constitution and thus have the following advantage in addition to one of the advantages of Embodiments 10 to 12.

(1) The lamination of the flexible print circuit boards 4001 and 4001b having a high reliability in electrical connection and a fine conductor pattern makes it possible to obtain multi-layered flexible print circuit boards 416 and 416a having a high reliability in electrical connection and a high density circuit by a simple method involving a few steps.

While the invention has been described in detail and with reference to specific embodiments thereof, it will be apparent to one skilled in the art that various changes and modifications can be made therein without departing from the spirit and scope thereof The present application is based on Japanese Patent Application 2004-305493, filed on Oct. 20, 2004, Japanese Patent Application 2004-305594, filed on Oct. 20, 2004, Japanese Patent Application 2004-313593, filed on Oct. 28, 2004, and Japanese Patent Application 2004-342221, filed on Nov. 26, 2004, and is hereby incorporated by reference.

As mentioned above, in accordance with the invention, a multi-layered FPC having a high connection reliability and a high producibility which is most suitable for fineness of circuit layers and its producing method can be provided.

What is claimed is:

1. A method of producing a multi-layered flexible print circuit board comprising:

a one-sided circuit board forming step of forming a first circuit layer on one side of a first insulating layer and insulating layer on the other side thereof to form a first one-sided circuit board and forming a second circuit layer on one side of a second insulating layer to form a second one-sided circuit board;

a through-hole forming step of forming a through-hole for connecting between the first circuit layer and the second circuit layer in the one-sided circuit board in the thickness direction;

a metal portion forming step of press-fitting a substantially spherical conductor made of a metallic material at least on the surface thereof into the through-hole to make conduction to the first circuit layer so that a metal portion extending from the surface of the first insulating layer is formed; and a conducting step of laminating the first one-sided circuit board and the second one-sided circuit board on each other and press-deforming the metal portion such that the metal portion and the second circuit layer are electrically-conducted to each other to electrically-conduct the first circuit layer and the second circuit layer to each other via the metal portion; and the insulating layer is an adhesive layer for laminating the first one-sided circuit board and the second one-sided circuit board on each other.

2. The method of producing a multi-layered flexible print circuit board as defined in claim 1, wherein the through-hole forming step comprises another through-hole forming step of forming a through-hole in the second one-sided circuit board in the thickness direction, the metal portion forming step comprises another metal portion forming step of press-fitting a substantially spherical conductor made of a metallic material at least on the surface thereof into the through-hole to form another metal portion electrically-conducted to the second circuit layer and extending from the surface of the second insulating layer and the conducting step is a step of laminating the first one-sided circuit board and the second one-sided circuit board on each other and press-deforming the metal portion and the other metal portion such that the metal portion and the other metal portion are electrically-conducted to each other to electrically-conduct the first circuit layer and the second circuit layer to each other via the metal portion.

3. The method of producing a multi-layered flexible print circuit board as defined in claim 1, wherein the metallic material is made of a soft metal.

4. The method of producing a multi-layered flexible print circuit board as defined in claim 3, wherein the metallic material comprises at least one of solder alloy, copper and copper alloy.

5. The method of producing a multi-layered flexible print circuit board as defined in claim 1, wherein the substantially spherical conductor is made of a resin ball having a smaller diameter than the diameter of the hole and a metal layer covering the resin ball.

6. The method of producing a multi-layered flexible print circuit board as defined in claim 1, wherein the substantially spherical conductor comprises a solder material coat layer provided on the surface thereof.

7. A method of producing a multi-layered flexible print circuit board comprising:

a one-sided circuit board forming step of forming a first circuit layer on one side of a first insulating layer to form a first one-sided circuit board and forming a second circuit layer on one side of a second insulating layer to form a second one-sided circuit board;

a through-hole forming step of forming a through-hole for connecting between the first circuit layer and the second circuit layer in the first one-sided circuit board in the thickness direction;

a laminating step of laminating the first one-sided circuit board and the second one-sided circuit board on each other with an adhesive layer interposed therebetween in such an arrangement that the first insulating layer and the second circuit layer are disposed opposed to each other to form a blind via hole by the through-hole and the second circuit layer; and a conducting step of filling the blind via hole with a substantially spherical solder member made of solder material or a particulate solder and then press-fitting a substantially spherical conductor made of a metallic material having a smaller thermal expansion coefficient than the solder material into the blind via hole to form a metal member bonded to the substantially spherical solder member or particulate solder so that the circuit layer provided on the front and back sides of the insulating layer are electrically-conducted to the substantially spherical solder member or particulate solder with the junction to the metal member.

* * * * *